US012696569B2

(12) United States Patent
Sasaki et al.

(10) Patent No.: US 12,696,569 B2
(45) Date of Patent: Jul. 28, 2026

(54) SEMICONDUCTOR APPARATUS AND METHOD FOR MANUFACTURING SEMICONDUCTOR APPARATUS

(71) Applicant: SONY SEMICONDUCTOR SOLUTIONS CORPORATION, Kanagawa (JP)

(72) Inventors: Naoto Sasaki, Nagasaki (JP); Kenichi Saitou, Nagasaki (JP); Yusuke Hayashi, Nagasaki (JP); Atsuhiko Yamada, Nagasaki (JP); Takushi Shigetoshi, Kanagawa (JP); Takuya Ooi, Nagasaki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 821 days.

(21) Appl. No.: 17/797,809

(22) PCT Filed: Feb. 15, 2021

(86) PCT No.: PCT/JP2021/005496
§ 371 (c)(1),
(2) Date: Aug. 5, 2022

(87) PCT Pub. No.: WO2021/162127
PCT Pub. Date: Aug. 19, 2021

(65) Prior Publication Data
US 2023/0056708 A1     Feb. 23, 2023

(30) Foreign Application Priority Data
Feb. 13, 2020     (JP) ................................. 2020-022407

(51) Int. Cl.
*H10F 39/00*     (2025.01)
*H10W 20/00*     (2026.01)
*H10W 20/20*     (2026.01)

(52) U.S. Cl.
CPC ........ *H10F 39/811* (2025.01); *H10W 20/023* (2026.01); *H10W 20/20* (2026.01)

(58) Field of Classification Search
CPC ........................ H01L 23/481; H01L 21/76898
See application file for complete search history.

(56) References Cited

U.S. PATENT DOCUMENTS

2009/0256260 A1   10/2009  Nakamura
2010/0007030 A1*   1/2010  Koike ................. H10W 20/023
                                                        257/E21.597

(Continued)

FOREIGN PATENT DOCUMENTS

JP      2009-016406      1/2009
JP      2009-206253      9/2009

(Continued)

OTHER PUBLICATIONS

International Search Report and Written Opinion prepared by the Japan Patent Office on Apr. 27, 2021, for International Application No. PCT/JP2021/005496, 3 pgs.

*Primary Examiner* — Suberr L Chi
(74) *Attorney, Agent, or Firm* — SHERIDAN ROSS P.C.

(57) ABSTRACT

A parasitic capacitance of a wiring arranged on a back surface side of a semiconductor substrate is reduced. A semiconductor apparatus includes a semiconductor substrate, a back surface side wiring, a through wiring, and a separation region. In the semiconductor substrate, a semiconductor element and a front surface side wiring connected to the semiconductor element are arranged on a front surface side. The back surface side wiring is arranged on a back surface side of the semiconductor substrate. The through wiring is arranged in a through hole formed in the semiconductor substrate to connect the front surface side wiring and the back surface side wiring. The separation region is (Continued)

arranged between the semiconductor substrate and the back surface side wiring.

20 Claims, 38 Drawing Sheets

(56)                    References Cited

U.S. PATENT DOCUMENTS

| | | | |
|---|---|---|---|
| 2011/0233785 A1 | 9/2011 | Koester et al. | |
| 2012/0098106 A1 | 4/2012 | Aoki et al. | |
| 2012/0298993 A1* | 11/2012 | Nagata ............. | H01L 21/76898 |
| | | | 438/18 |
| 2016/0172406 A1* | 6/2016 | Kawano ............... | H10F 39/811 |
| | | | 257/773 |

FOREIGN PATENT DOCUMENTS

| | | |
|---|---|---|
| JP | 2010-251558 | 11/2010 |
| JP | 2013-522929 | 6/2013 |
| JP | 2019-087768 | 6/2019 |
| WO | WO 2011/001520 | 1/2011 |

* cited by examiner

FIG. 19A
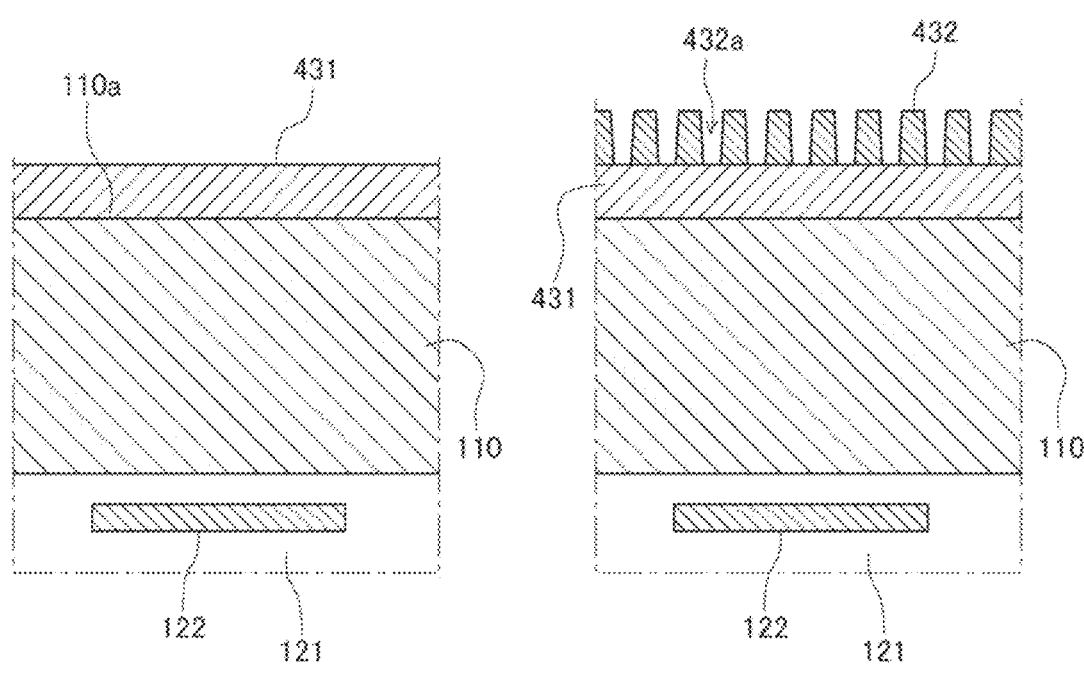
FIG. 19B
FIG. 19C
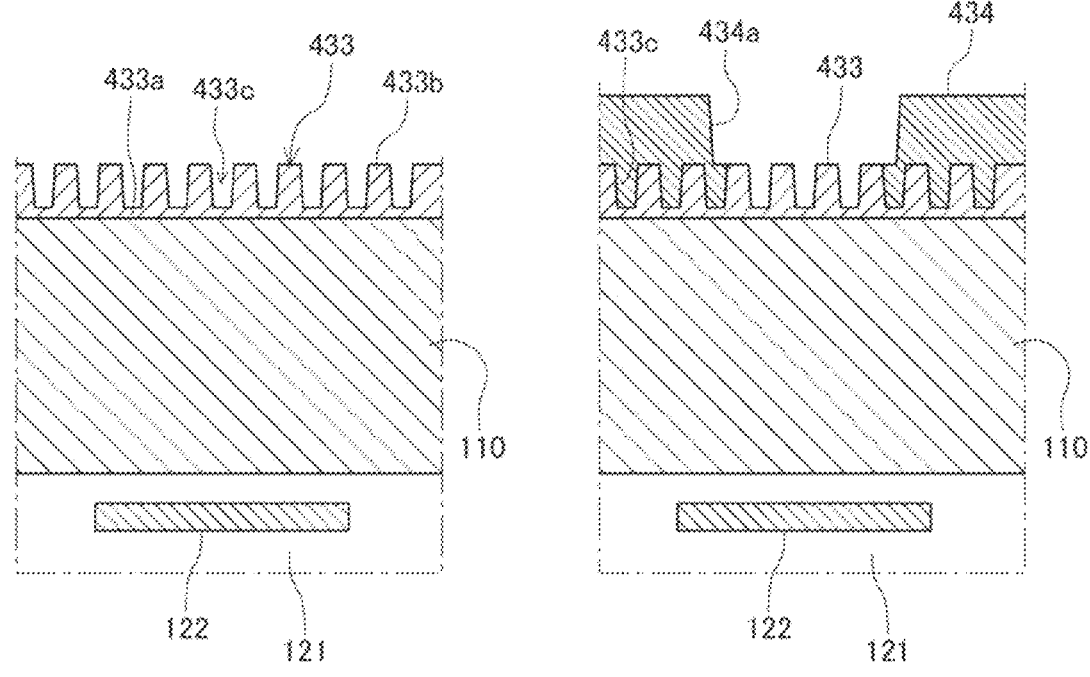
FIG. 19D

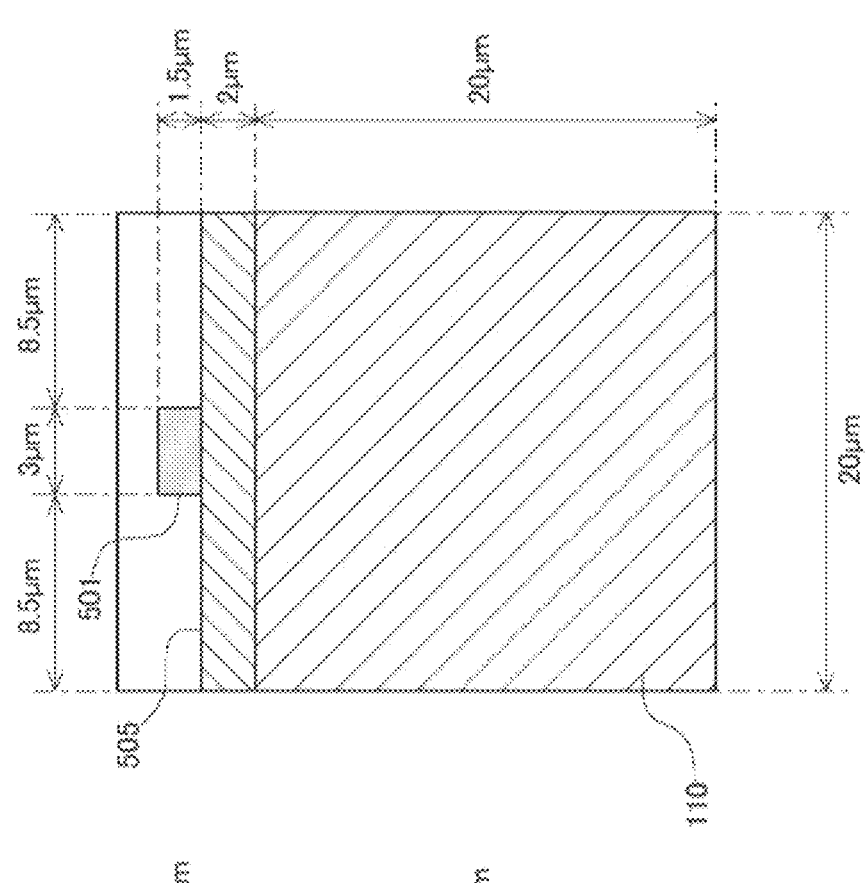
FIG. 24B
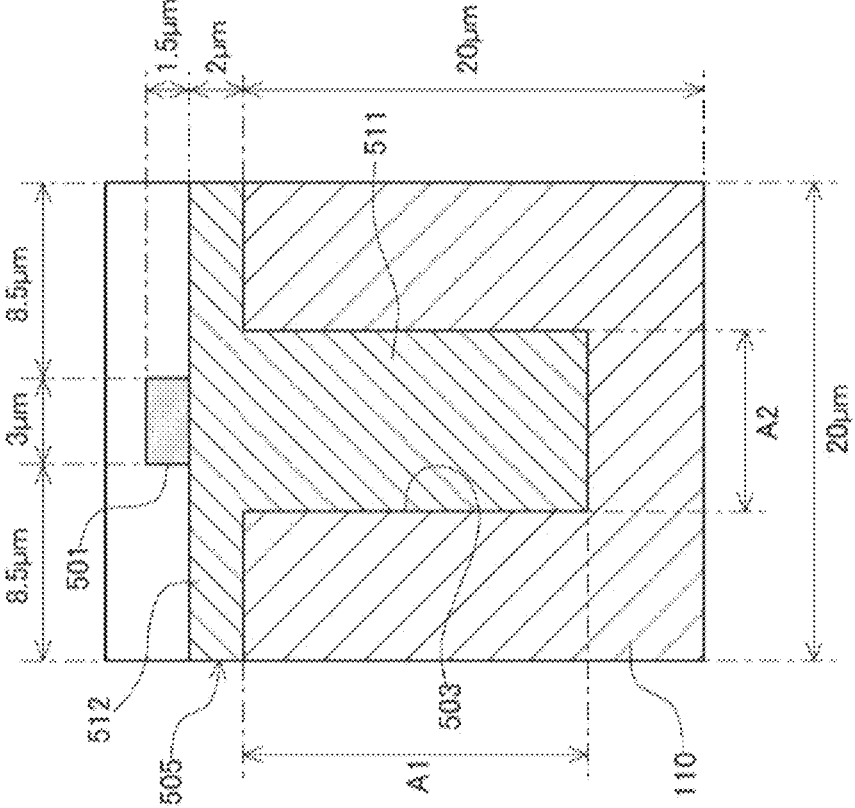
FIG. 24A

FIG. 25

|  | CASE A | CASE B | CASE C | CASE D | CASE E |
|---|---|---|---|---|---|
| RECESS PORTION DEPTH (A1) | 0μm | 5μm | 5μm | 10μm | 15μm |
| RECESS PORTION WIDTH (A2) | 0μm | 5μm | 10μm | 5μm | 5μm |
| DIFFERENCE IN CAPACITANCE BETWEEN WIRING SUBSTRATES FROM CASE A (%) | -- | -17.2 | -37.1 | -14.2 | -16.0 |

FIG. 27

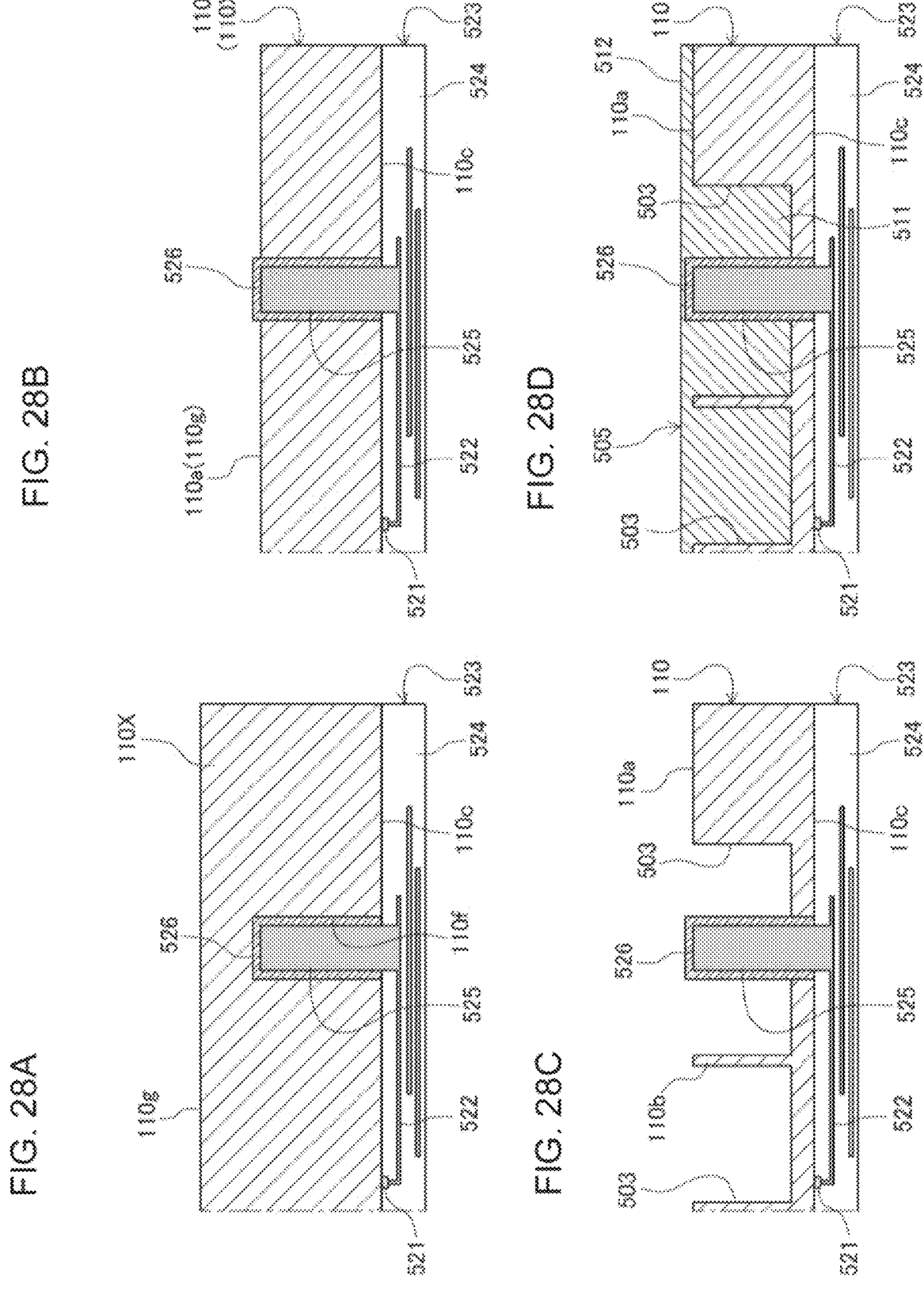

*FIG. 30*

SEMICONDUCTOR APPARATUS AND METHOD FOR MANUFACTURING SEMICONDUCTOR APPARATUS

CROSS REFERENCE TO RELATED APPLICATIONS

This application is a national stage application under 35 U.S.C. 371 and claims the benefit of PCT Application No. PCT/JP2021/005496, having an international filing date of 15 Feb. 2021, which designated the United States, which PCT application claimed the benefit of Japanese Patent Application No. 2020-022407, filed 13 Feb. 2020, the entire disclosures of each of which are incorporated herein by reference.

TECHNICAL FIELD

The present disclosure relates to a semiconductor apparatus and a method for manufacturing the semiconductor apparatus. Specifically, the present disclosure relates to a semiconductor apparatus including a wiring penetrating a semiconductor substrate, and a method for manufacturing the semiconductor apparatus.

BACKGROUND ART

A conventional semiconductor apparatus configured in a semiconductor package reduced to the size of a semiconductor chip such as a chip size package (CSP) has been used. For example, a solid-state imaging apparatus has been used in which an imaging element is formed on a first main surface (front surface) of a silicon semiconductor substrate, and a solder ball constituting an external terminal is arranged on a second main surface (back surface) (see, for example, Patent Document 1). In this solid-state imaging apparatus, a through hole formed to penetrate from the first main surface to the second main surface of the silicon semiconductor substrate is arranged. A through electrode is arranged in the through hole, and an internal electrode connected to the imaging element on the first main surface and the solder ball are electrically connected via the through electrode.

CITATION LIST

Patent Document

Patent Document 1: Japanese Patent Application Laid-Open No. 2010-251558

SUMMARY OF THE INVENTION

Problems to be Solved by the Invention

In the above-described conventional technology, there is a problem that the parasitic capacitance of the through electrode is large. The above-described conventional through electrode is arranged on the through hole and the second main surface via an insulating film. A parasitic capacitance with the silicon semiconductor substrate adjacent via the insulating film causes a signal propagation delay. In particular, a through electrode arranged on the second main surface, that is, a wiring portion called rewiring extending from an end of the through hole to the solder ball has a relatively large area, and thus parasitic capacitance increases. For this reason, there is a problem that the propagation delay of the signal increases and the transmission speed of the signal decreases. Such a problem may occur due to parasitic capacitance between the semiconductor substrate and the rewiring even in a configuration in which the through electrode is not formed on the semiconductor substrate.

The present disclosure has been made in view of the above-described problems, and an object of the present disclosure is to provide a semiconductor apparatus and a method for manufacturing the semiconductor apparatus capable of reducing parasitic capacitance of a wiring arranged on a back surface side of a semiconductor substrate and improving signal transmission characteristics.

Solutions to Problems

The present disclosure has been made to solve the above-described problems, and a first aspect thereof is a semiconductor apparatus including: a semiconductor substrate in which a semiconductor element and a front surface side wiring connected to the semiconductor element are arranged on a front surface side; a back surface side wiring arranged on a back surface side of the semiconductor substrate; and a separation region arranged between the semiconductor substrate and the back surface side wiring.

Furthermore, in the first aspect, the semiconductor apparatus may include a through wiring arranged in a through hole formed in the semiconductor substrate and connecting the front surface side wiring and the back surface side wiring.

Furthermore, in the first aspect, the separation region may include a resin.

Furthermore, in the first aspect, the separation region may include a photosensitive resin.

Furthermore, in the first aspect, the separation region may include an inorganic material.

Furthermore, in the first aspect, the separation region may be formed to have a thickness of equal to or greater than 5 µm.

Furthermore, in the first aspect, the separation region may be arranged in a recess portion formed on the back surface side of the semiconductor substrate.

Furthermore, in the first aspect, the separation region may have a gap.

Furthermore, in the first aspect, the back surface side wiring may be provided so as to at least partially overlap the recess portion in plan view.

Furthermore, in the first aspect, a plurality of types of recess portions having different depths may be formed as the recess portion.

Furthermore, in the first aspect, the recess portion may be formed so as to overlap a plurality of the back surface side wiring in plan view.

Furthermore, in the first aspect, the recess portion may be formed to form a polygonal or circular periodic structure in plan view.

Furthermore, in the first aspect, the semiconductor apparatus may include: a through wiring arranged in a through hole formed in the semiconductor substrate and connecting the front surface side wiring and the back surface side wiring; and a liner film including an insulating material, covering at least a part of the through wiring, and interposed between the through wiring and the separation region.

Furthermore, in the first aspect, the semiconductor apparatus may further include a through wiring arranged in a through hole formed in the semiconductor substrate and connecting the front surface side wiring and the back surface side wiring, the separation region may include an in-hole separation region portion covering an inner circumferential surface of the through hole and a back surface side separation region portion formed on a back surface side of the semiconductor substrate, and the gap may be formed in the back surface side separation region portion.

Furthermore, in the first aspect, the separation region may be further arranged between the semiconductor substrate and the through wiring.

Furthermore, in the first aspect, the separation region may be used as a mask in etching for forming the through hole in the semiconductor substrate.

Furthermore, in the first aspect, the semiconductor substrate may further include an insulating film that insulates the back surface side wiring.

Furthermore, in the first aspect, the semiconductor element may be a photoelectric conversion element that performs photoelectric conversion of incident light.

Furthermore, a second aspect of the present disclosure is a method for manufacturing a semiconductor apparatus, the method including: a separation region arrangement step of arranging a separation region on a back surface side of a semiconductor substrate on which a semiconductor element and a front surface side wiring connected to the semiconductor element are arranged on a front surface side; a through hole forming step of forming a through hole in the semiconductor substrate; a back surface side wiring arrangement step of arranging a back surface side wiring on the back surface side of the semiconductor substrate; and a through wiring arrangement step of arranging a through wiring connecting the front surface side wiring and the back surface side wiring in the through hole that has been formed.

According to an aspect of the present disclosure, there is an effect that the separation region is arranged between the semiconductor substrate and the back surface side wiring. It is assumed that the back surface side wiring is spaced from the semiconductor substrate.

BRIEF DESCRIPTION OF DRAWINGS

FIGS. 19A-19D are diagrams illustrating an example of a method for manufacturing an imaging apparatus according to the sixth embodiment of the present disclosure.

FIGS. 24A and 24B are explanatory diagrams of a simulation regarding effects by the semiconductor apparatus according to the seventh embodiment of the present disclosure.

FIG. 25 is a table showing results of simulation regarding effects by the semiconductor apparatus according to the seventh embodiment of the present disclosure.

FIG. 27 is a diagram illustrating a configuration example of a semiconductor apparatus according to an eighth embodiment of the present disclosure.

FIGS. 28A-28D are diagrams illustrating an example of the method for manufacturing a semiconductor apparatus according to the eighth embodiment of the present disclosure.

FIG. 30 is a diagram illustrating a configuration example of a semiconductor apparatus according to a ninth embodiment of the present disclosure.

MODE FOR CARRYING OUT THE INVENTION

Figure 1:
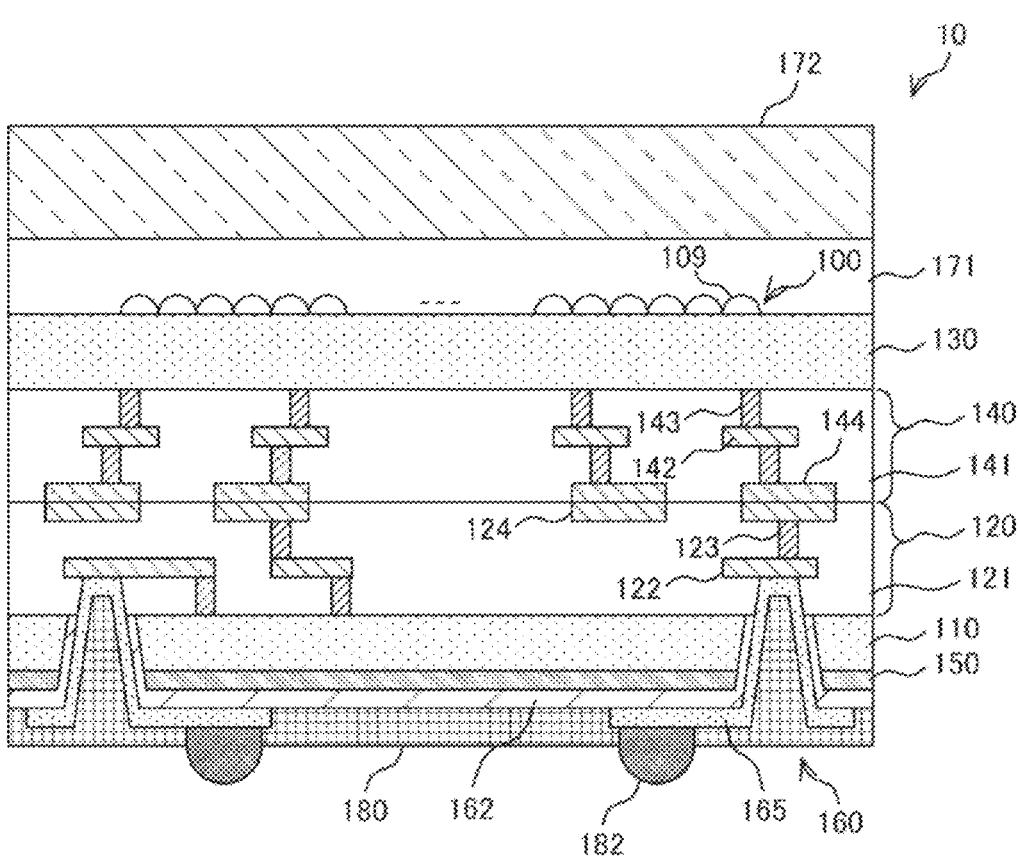
FIG. 1 is a diagram illustrating a configuration example of an imaging apparatus according to an embodiment of the present disclosure.

Next, an embodiment for implementing the present disclosure (hereinafter, referred to as an embodiment) will be described with reference to the drawings. In the drawings, the same or similar parts are denoted by the same or similar reference numerals. Furthermore, the embodiments will be described in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Application example to camera

1. First Embodiment

[Configuration of Imaging Element]

FIG. 1 is a diagram illustrating a configuration example of an imaging apparatus according to an embodiment of the present disclosure. The drawing is a diagram illustrating a configuration example of an imaging apparatus 10 which is an example of a semiconductor apparatus according to the embodiment of the present disclosure. A semiconductor apparatus according to the embodiment of the present disclosure will be described with reference to the imaging apparatus 10 in the drawing as an example.

The imaging apparatus 10 includes a semiconductor substrate 130, a wiring region 140, a transparent substrate 172, an adhesive 171, a semiconductor substrate 110, and a wiring region 120.

The imaging apparatus 10 is configured by bonding two semiconductor substrates, that is, semiconductor substrates 130 and 110. The semiconductor substrate 130 constitutes an imaging element that generates an image signal on the basis of incident light. A plurality of pixels 100 is arranged in the imaging element. The pixel 100 includes a photoelectric conversion unit that performs photoelectric conversion of incident light. The photoelectric conversion unit can include a photodiode. Furthermore, in the pixel 100, a pixel circuit that generates an image signal according to a charge generated by photoelectric conversion is arranged. Such pixels 100 are arrayed in a two-dimensional lattice pattern to form an imaging element. Furthermore, an on-chip lens 109 is arranged in each pixel 100. The on-chip lens 109 is a lens arranged for each pixel 100 to focus incident light. In the drawing, an example of the on-chip lens 109 formed to have a hemispherical shape is described.

The semiconductor substrate 130 is a semiconductor substrate on which an imaging element is arranged. As the semiconductor substrate 130, a semiconductor substrate including silicon (Si) can be used. In the semiconductor substrate 130, diffusion regions of the photoelectric conversion unit of the pixel 100 and the element of the pixel circuit described above are formed. These diffusion regions are formed on the front surface side of the semiconductor substrate 130. On the other hand, light incident on the photoelectric conversion unit of the pixel 100 is applied to the back surface side of the semiconductor substrate 130. The above-described on-chip lens 109 is arranged on the back surface side of the semiconductor substrate 130. Such an imaging element is referred to as a back-illuminated imaging element.

The wiring region 140 is a region arranged on the front surface side of the semiconductor substrate 130 and in which a wiring layer that transmits a signal to an element of the semiconductor substrate 130 is arranged. The wiring region 140 includes a wiring layer 142 and an insulating layer 141. The wiring layer 142 is a wiring that transmits a signal to an element of the semiconductor substrate 130. This wiring layer 142 can include a metal such as copper (Cu), for example. The insulating layer 141 insulates the wiring layer 142. This insulating layer 141 can include an insulator, for example, silicon oxide ($SiO_2$).

Furthermore, a pad 144 is arranged on the surface of the wiring region 140. The pad 144 is an electrode-like terminal that transmits a signal. The pad 144 includes Cu or the like. The pad 144 transmits a signal between the semiconductor substrates 130 and 110 when the semiconductor substrates 130 and 110 are bonded together. When the semiconductor substrates 130 and 110 are bonded together, the pad 144 is joined to a pad 124 arranged in the wiring region 120 of the semiconductor substrate 110 as described later. The semiconductor region of the semiconductor substrate 130 and the wiring layer 142 are connected by a via plug 143. The via plug 143 can include a columnar metal. Furthermore, the wiring layer 142 and the pad 144 can also be connected by the via plug 143.

The transparent substrate 172 is a transparent substrate that protects the back surface side of the semiconductor substrate 130. The transparent substrate 172 can include, for example, a glass substrate.

The adhesive 171 adheres the semiconductor substrate 130 and the transparent substrate 172. Furthermore, the adhesive 171 is arranged adjacent to the back surface side of the semiconductor substrate 130, which is a surface irradiated with incident light, and further performs sealing on the back surface side of the semiconductor substrate 130.

As similar to the semiconductor substrate 130, the semiconductor substrate 110 is a semiconductor substrate including Si or the like. For example, a processing circuit that processes an image signal generated by the pixel 100 of the semiconductor substrate 130 is arranged on the semiconductor substrate 110. The signal processed in the processing circuit of the semiconductor substrate 110 is output to the outside of the imaging apparatus 10. Furthermore, a control circuit that generates a control signal of the pixel 100 can be arranged on the semiconductor substrate 110.

The wiring region 120 is a wiring region arranged on the front surface side of the semiconductor substrate 110, and the wiring layer 122, the insulating layer 121, and the via plug 123 are arranged in the wiring region 120. The wiring layer 122 is a wiring that transmits a signal of an element included in the above-described processing circuit or the like. Furthermore, the pad 124 is further arranged in the wiring region 120. The pad 124 is an electrode-like terminal that is joined to the above-described pad 144 and transmits a signal.

When the semiconductor substrates 130 and 110 are bonded together, the wiring region 140 of the semiconductor substrate 130 and the wiring region 120 of the semiconductor substrate 110 are bonded together. At this time, the pad 144 of the wiring region 140 and the pad 124 of the wiring region 120 are aligned and joined. As a result, signals can be transmitted between the elements of the semiconductor substrates 130 and 110.

The output of the signal generated by the imaging apparatus 10 to the outside, the input of the signal to the imaging apparatus 10, and the like can be performed via a connection terminal 182 arranged on the back surface side of the semiconductor substrate 110. The connection terminal 182 can include, for example, solder. Mounting of the imaging apparatus 10 on an external substrate can be performed by soldering the connection terminal 182 to an external substrate. Note that, as the connection terminal 182, for example, a pillar including a metal material such as copper (Cu), titanium (Ti), tantalum (Ta), aluminum (Al), tungsten (W), nickel (Ni), ruthenium (Ru), or cobalt (Co) is used in addition to a solder ball formed by solder.

The back surface side wiring 165 is arranged on the back surface side of the semiconductor substrate 110. The connection terminal 182 is arranged adjacent to and connected to the back surface side wiring 165. The back surface side wiring 165 and the wiring layer 122 in the wiring region 120 of the semiconductor substrate 110 are connected by a through via (through silicon via (TSV)) 160.

Furthermore, a protective film 180 is arranged on the back surface side of the semiconductor substrate 110. The protective film 180 is a film that protects the back surface side of the semiconductor substrate 110 excluding the connection terminal 182. As the protective film 180, for example, a solder resist can be used. Furthermore, as a material of the protective film 180, for example, a polyimide resin, an acrylic resin, silicone, an epoxy resin, or the like, or a material in which a filler is contained in these resins is appropriately selected.

Note that the configuration of the imaging apparatus 10 is not limited to this example. For example, it is also possible to adopt a configuration in which a signal is transmitted by a through via penetrating the semiconductor substrate 130 instead of the pads 124 and 144.

[Configuration of Back Surface Side of Semiconductor Substrate]

Figure 2:
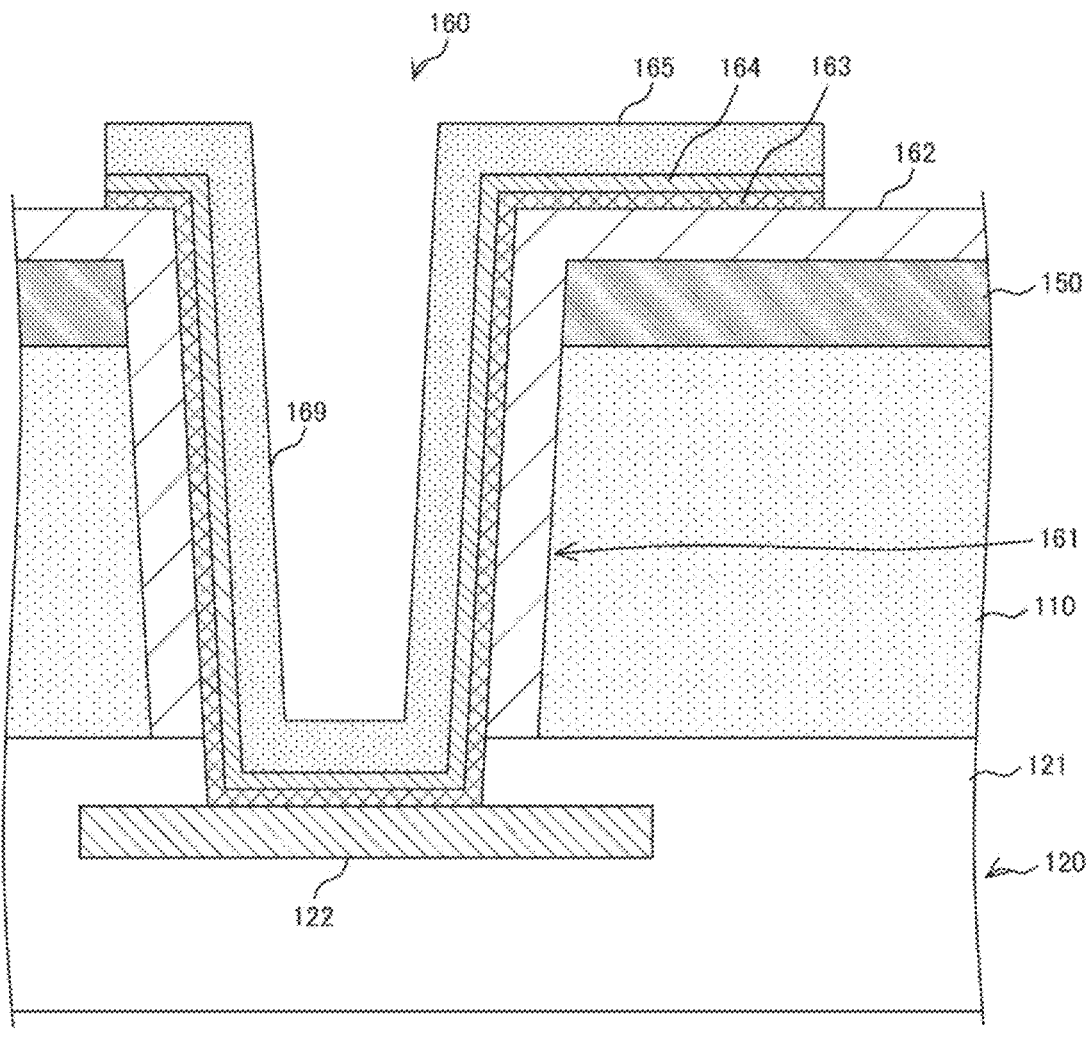
FIG. 2 is a diagram illustrating a configuration example of a back surface side of a semiconductor substrate according to a first embodiment of the present disclosure.

FIG. 2 is a diagram illustrating a configuration example of a back surface side of a semiconductor substrate according to a first embodiment of the present disclosure. The drawing is a diagram representing a configuration example of the vicinity of the through via 160 on the back surface side of the semiconductor substrate 110, and is a diagram representing a configuration example on the back side of the imaging apparatus 10. In FIG. 2, the semiconductor substrate 110 obtained by making upside down the semiconductor substrate 110 of FIG. 1 is described for convenience.

As illustrated in FIG. 2, the imaging apparatus 10 further includes a through hole 161, a through wiring 169, a back surface side wiring 165, a seed layer 164, a barrier layer 163, an insulating film 162, and a separation region 150 in addition to the semiconductor substrate 110, the wiring layer 122, and the insulating layer 121. The through via 160 is constituted by the through wiring 169 arranged in the through hole 161. Note that the semiconductor substrate 110 is an example of a semiconductor substrate described in the claims. The wiring layer 122 is an example of a front surface side wiring described in the claims.

The back surface side wiring 165 is a wiring arranged on the back surface side of the semiconductor substrate 110. As similar to the wiring layer 122, the back surface side wiring 165 transmits a signal and the like of the pixel 100. The back surface side wiring 165 can include Cu and can be formed by plating.

The through hole 161 is a hole penetrating the semiconductor substrate 110. The through hole 161 can be formed by etching the semiconductor substrate 110. Note that the through hole 161 illustrated in FIG. 2 further perforates the separation region 150 and the insulating layer 121 as described later. Furthermore, the hole shape of the through hole 161 is not limited to a circular shape, and may be another shape such as a rectangular shape.

The through wiring 169 is a wiring that connects the wiring layer 122 and the back surface side wiring 165. The through wiring 169 is arranged in the through hole 161. The through wiring 169 is arranged adjacent to the wiring layer 122 on the bottom surface of the through hole 161 and is connected to the wiring layer 122. Furthermore, the through wiring 169 illustrated in FIG. 2 is configured integrally with the back surface side wiring 165 and connected to the back surface side wiring 165.

The insulating film 162 is a film that is arranged on the back surface side of the semiconductor substrate 110 and insulates the back surface side wiring 165 and the through wiring 169. This insulating film 162 can include, for example, $SiO_2$.

The barrier layer 163 is arranged below the back surface side wiring 165 and the seed layer 164 to prevent diffusion of metal constituting the back surface side wiring 165 and the like into the semiconductor substrate 110 and the like. The barrier layer 163 can include, for example, titanium (Ti).

The seed layer 164 conducts a current when the back surface side wiring 165 is formed by electrolytic plating. The seed layer 164 can include Cu. Note that the barrier layer 163 and the seed layer 164 can also be regarded as conductors that are integrated with the back surface side wiring 165 and the through wiring 169 and constitute a part of the back surface side wiring 165 and the through wiring 169.

The separation region 150 is arranged on the back surface side of the semiconductor substrate 110 to separate the semiconductor substrate 110 and the back surface side wiring 165. The separation region 150 includes an insulator or a dielectric, and causes the back surface side wiring 165 to be separated and spaced from the back surface side of the semiconductor substrate 110. By arranging the separation region 150, the electrostatic capacitance between the back surface side wiring 165 and the semiconductor substrate 110 can be reduced. This is because the distance between the back surface side wiring 165 and the semiconductor substrate 110 becomes long. The separation region 150 can be formed to have a film thickness of, for example, equal to or greater than 5 μm. In this case, by setting the film thickness of the insulating film 162 to 2 μm, the distance between the back surface side wiring 165 and the semiconductor substrate 110 can be set to 7 μm. This makes it possible to obtain a transmission speed of a signal exceeding 9 Gbps. As the separation region 150, for example, a resin having a relative permittivity smaller than that of SiO₂, for example, is suitably used. Specifically, as the resin for forming the separation region 150, a resin having a relative permittivity of equal to or less than 4.0 is preferably used, and a resin having a relative permittivity of equal to or less than 3 is more preferably applied. This is because the electrostatic capacitance between the back surface side wiring 165 and the semiconductor substrate 110 can be further reduced. Furthermore, the separation region 150 can include a resin, for example. Specifically, the separation region 150 can include an acrylic resin.

Furthermore, the separation region 150 can be used as a mask when the through hole 161 is formed by etching. Specifically, the separation region 150 is arranged as a resist for etching the semiconductor substrate 110, and an opening is formed in a region where the through hole 161 is formed. The semiconductor substrate 110 adjacent to the opening is etched to form the through hole 161. In this case, the separation region 150 preferably includes a photosensitive resin. This is because the opening of the separation region 150 can be easily formed.

As described above, the wiring layer 122 is connected to the photoelectric conversion unit of the pixel 100 of the semiconductor substrate 130 via the via plug 123, the pads 124 and 144, the via plug 143, and the wiring layer 142. The imaging apparatus 10 is configured such that a semiconductor substrate 130 constituting an imaging element is arranged on the front surface side of the semiconductor substrate 110.

Note that the configuration of the imaging apparatus 10 is not limited to this example. An imaging element formed on the semiconductor substrate 110 can also be used instead of the semiconductor substrate 130. In this case, the imaging element formed on the semiconductor substrate 110 has a configuration in which the front surface side of the imaging element (semiconductor substrate 110) is irradiated with incident light.

[Method for Manufacturing Imaging Apparatus]

FIGS. 3 to 5 are diagrams illustrating an example of a method for manufacturing an imaging apparatus according to the first embodiment of the present disclosure. FIGS. 3 to 5 are diagrams illustrating a manufacturing process of the through via 160 in the semiconductor substrate 110 of the imaging apparatus 10.

First, the semiconductor substrate 130 and the semiconductor substrate 110 are bonded to each other, and the on-chip lens 109 is formed on the semiconductor substrate 130. Next, the transparent substrate 172 is bonded to the back surface side of the semiconductor substrate 130 using the adhesive 171.

Figure 3A:
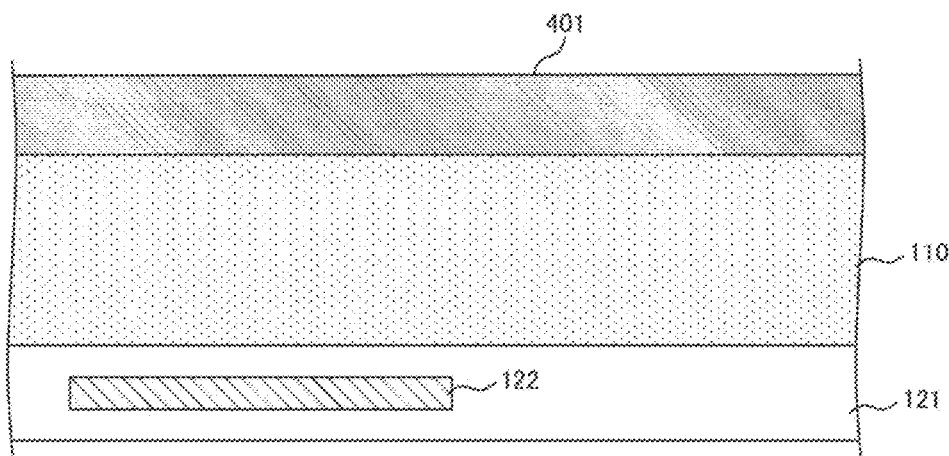
FIGS. 3A-3C are diagrams illustrating an example of a method for manufacturing an imaging apparatus according to the first embodiment of the present disclosure.
Figure 3B:
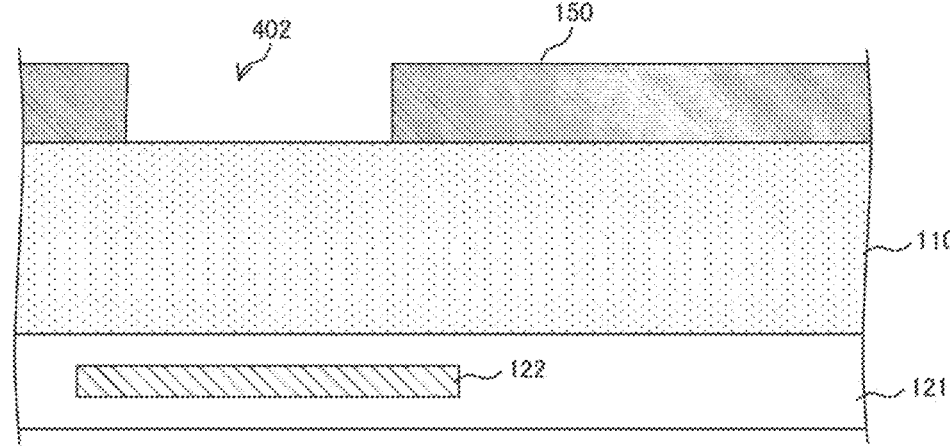

Next, a photosensitive resin film 401 is arranged on the back surface side of the semiconductor substrate 110. The resin film 401 can be configured to have a film thickness of 10 μm, for example. This can be performed by applying a liquid resin (FIG. 3A). Next, an opening 402 is formed in a region of the resin film 401 where the through hole 161 is to be formed, and the separation region 150 is formed. This can be formed by exposing and developing the resin film 401 using a mask in which the pattern of the opening 402 is formed (FIG. 3B). This step corresponds to the separation region arrangement step.

Figure 3C:
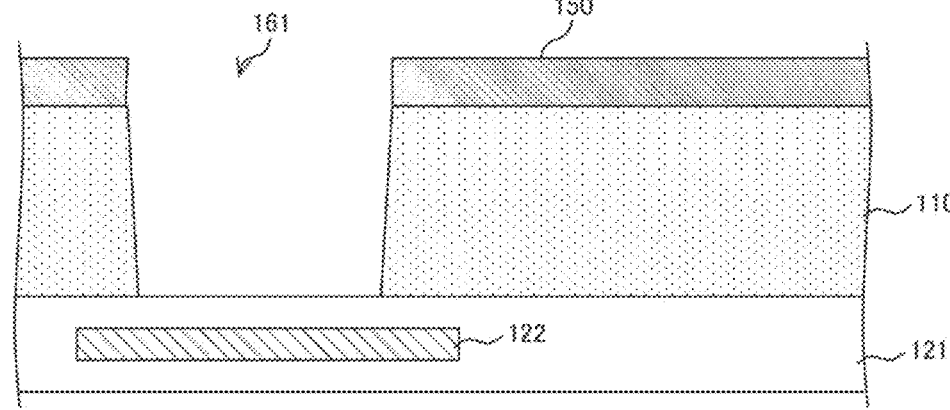

Next, the through hole 161 is formed in the semiconductor substrate 110. This can be performed by etching the semiconductor substrate 110 using the separation region 150 as a mask. For this etching, for example, anisotropic dry etching can be applied (FIG. 3C). At this time, the separation region 150 is also etched to reduce the film thickness, and the film thickness becomes approximately 5 μm. After the etching, a chemical solution is used for cleaning to remove the etching product. This step corresponds to a through hole forming step.

Figure 4D:
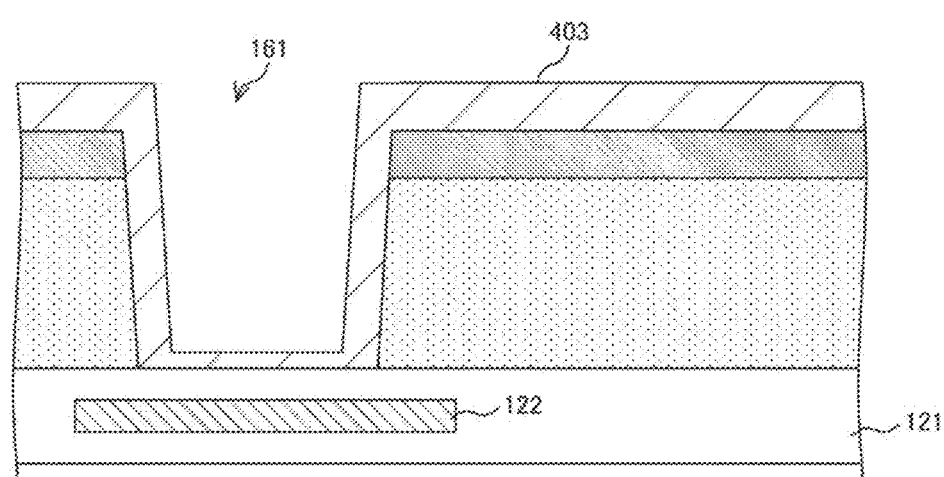
FIGS. 4D-4F are diagrams illustrating an example of the method for manufacturing an imaging apparatus according to the first embodiment of the present disclosure.

Next, an insulator film 403 is arranged adjacent to the separation region 150. At this time, the insulator film 403 is also arranged on the bottom surface and the wall surface of the through hole 161. This can be performed, for example, by forming a SiO₂ film using chemical vapor deposition (CVD). The insulator film 403 can be formed to have a film thickness of 4 μm, for example (FIG. 4D). At the time of film formation, the insulator film 403 adjacent to the bottom surface and the side wall of the through hole 161 is configured to be thinner than the insulator film 403 adjacent to the separation region 150. This is because of step coverage of CVD.

Figure 4E:
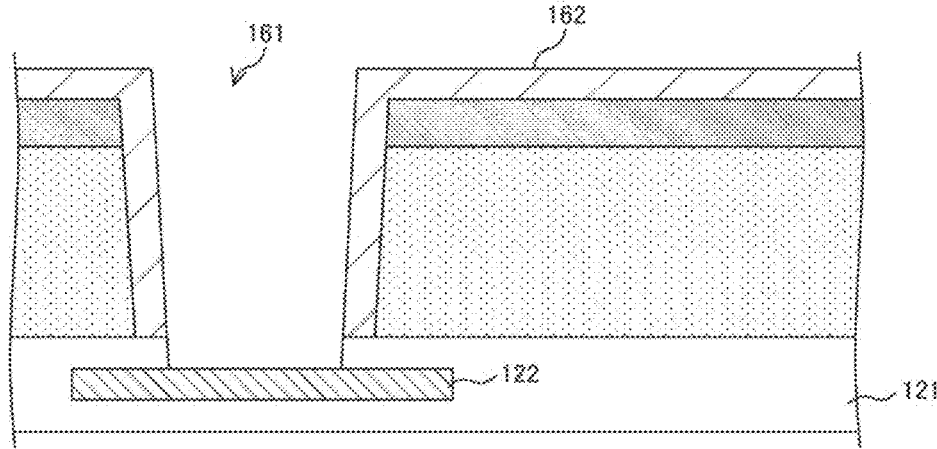

Next, the insulator film 403 is etched (so-called etchback) to remove the insulator film 403 at the bottom of the through hole 161. Therefore, the insulating film 162 adjacent to the separation region 150 and the side walls of the through hole 161 can be formed. Thereafter, etching is further performed to remove the insulating layer 121 adjacent to the wiring layer 122. As a result, the through hole 161 extending from the back surface side of the semiconductor substrate 110 to the wiring layer 122 can be formed. This etching can be performed by, for example, anisotropic dry etching (FIG. 4E). At the time of this etching, the insulating film 162 is also etched, and the film thickness of the region adjacent to the separation region 150 becomes approximately 2 μm.

Figure 4F:
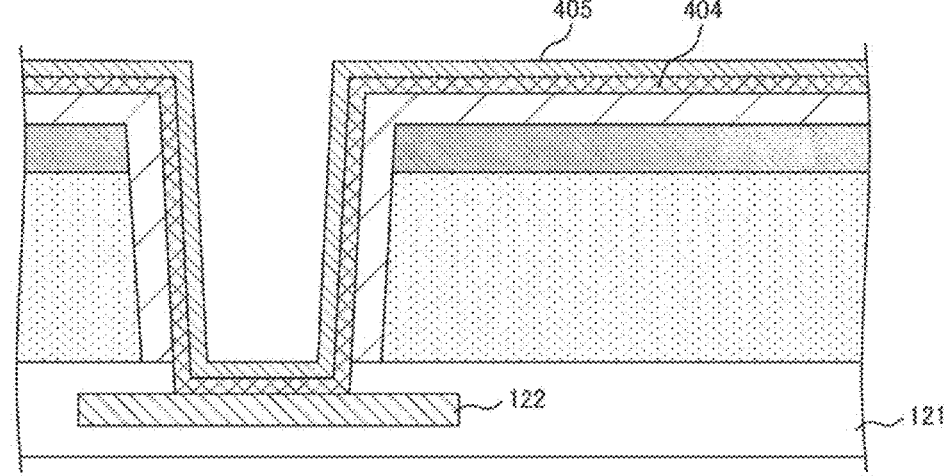

Next, the metal films 404 and 405 are arranged adjacent to the insulating film 162. In a subsequent step, these films are configured as the barrier layer 163 and the seed layer 164. The metal film 404 can be arranged by forming a Ti film. Furthermore, the metal film 405 can be arranged by forming a Cu film. These films can be formed, for example, by sputtering (FIG. 4F).

Figure 5G:
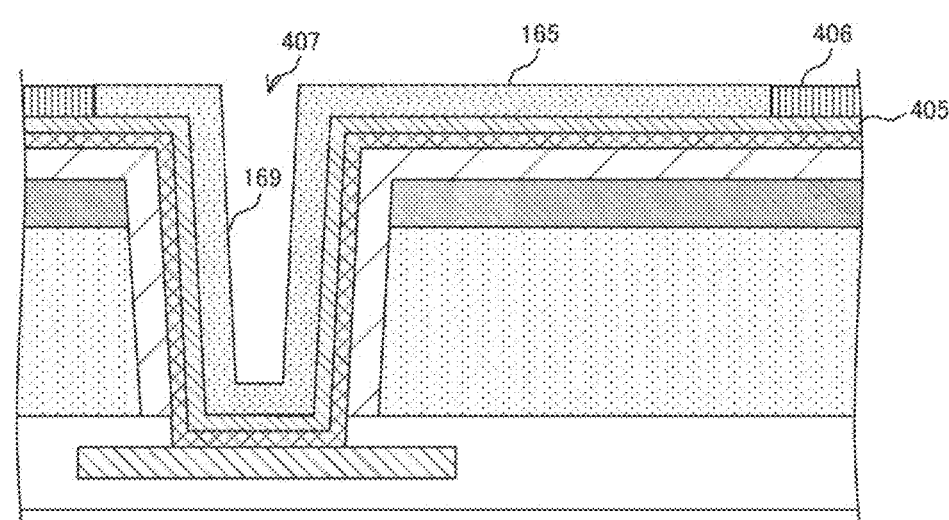
FIGS. 5G and 5H are diagrams illustrating an example of the method for manufacturing an imaging apparatus according to the first embodiment of the present disclosure.

Next, a resist 406 is arranged adjacent to the metal film 405. In the resist 406, an opening 407 is arranged in a region where the back surface side wiring 165 is formed. Next, electrolytic plating is performed to form the back surface side wiring 165 and the through wiring 169 (FIG. 5G). This step corresponds to the back surface side wiring arrangement step and the through wiring arrangement step.

Figure 5H:
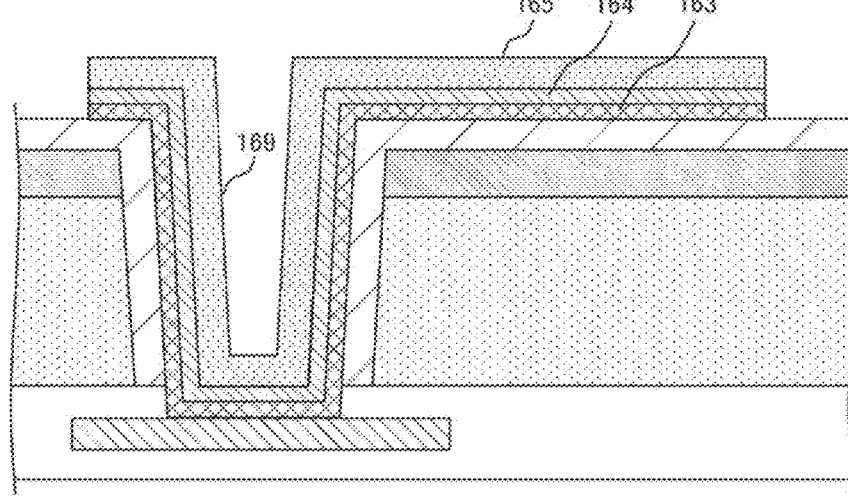

Next, the resist 406 is removed, and the metal films 404 and 405 in a region other than the lower layer of the back surface side wiring 165 are removed. As a result, the barrier layer 163 and the seed layer 164 are formed (FIG. 5H).

Thereafter, the imaging apparatus 10 can be manufactured by arranging the protective film 180 and the connection terminal 182.

Through the above steps, the separation region 150, the back surface side wiring 165, and the through via 160 can be formed. In the step illustrated in FIG. 4E described above, the insulating film 162 is arranged on the semiconductor substrate 110 on the wall surface of the through hole 161, and then the insulating layer 121 is etched, so that Cu constituting the wiring layer 122 can be prevented from diffusing into the semiconductor substrate 110.

Note that the method for manufacturing the imaging apparatus 10 is not limited to this example. For example, in the step illustrated in FIG. 3C, the insulating layer 121 can be etched in addition to the semiconductor substrate 110 to form the through hole 161.

As described above, in the imaging apparatus 10 of the first embodiment of the present disclosure, the separation region 150 is arranged between the semiconductor substrate 110 and the back surface side wiring 165, so that the semiconductor substrate 110 and the back surface side wiring 165 can be spaced from each other. As a result, the electrostatic capacitance between the back surface side wiring 165 and the semiconductor substrate 110 can be reduced, and the parasitic capacitance of the back surface side wiring 165 can be reduced. This enables high-speed signal transmission in the back surface side wiring 165.

2. Second Embodiment

The imaging apparatus 10 of the above-described first embodiment uses the separation region 150 including a resin. On the other hand, the imaging apparatus 10 of a second embodiment of the present disclosure is different from that of the above-described first embodiment in that a separation region including an inorganic material is used.
[Configuration of Back Surface Side of Semiconductor Substrate]

Figure 6:
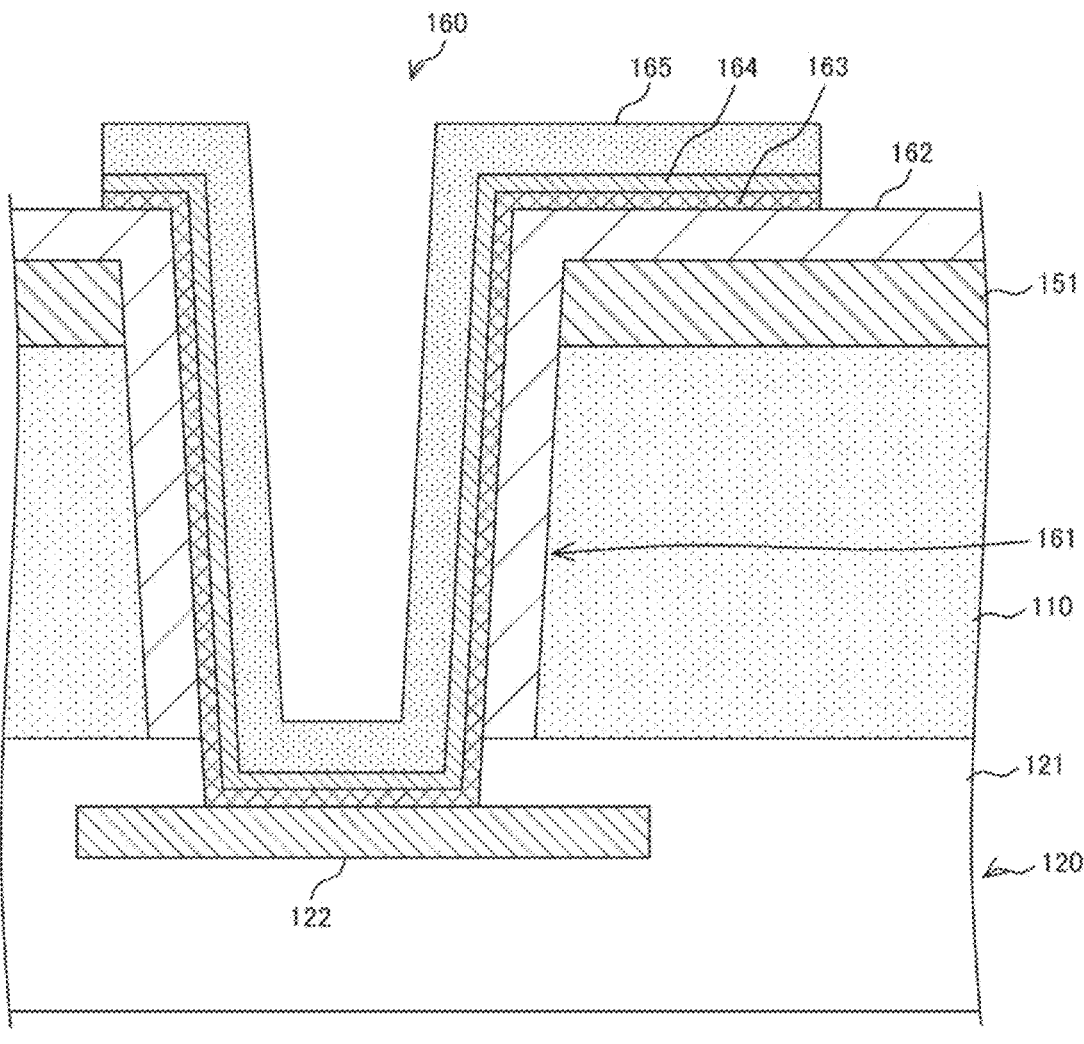
FIG. 6 is a diagram illustrating a configuration example of a back surface side of a semiconductor substrate according to a second embodiment of the present disclosure.

FIG. 6 is a diagram illustrating a configuration example of a back surface side of a semiconductor substrate according to the second embodiment of the present disclosure. As similar to FIG. 2, the drawing is a diagram illustrating a configuration example of the vicinity of the through via 160 on the back surface side of the semiconductor substrate 110, and is a diagram illustrating a configuration example on the back side of the imaging apparatus 10. The imaging apparatus 10 is different from the imaging apparatus 10 described in the first embodiment as illustrated in FIG. 2 in that a separation region 151 is arranged instead of the separation region 150.

The separation region 151 is a separation region including inorganic material. The separation region 151 can include, for example, SiO₂, SiOF, SiOC, and SiC. Furthermore, the separation region 151 can be used also as a mask when the through hole 161 is formed.
[Method for Manufacturing Imaging Apparatus]

FIG. 7 is a diagram illustrating an example of a method for manufacturing an imaging apparatus according to the second embodiment of the present disclosure. As similar to FIGS. 3 to 5, the drawing is a diagram illustrating a manufacturing process of the through via 160 in the semiconductor substrate 110 of the imaging apparatus 10.

Figure 7A:
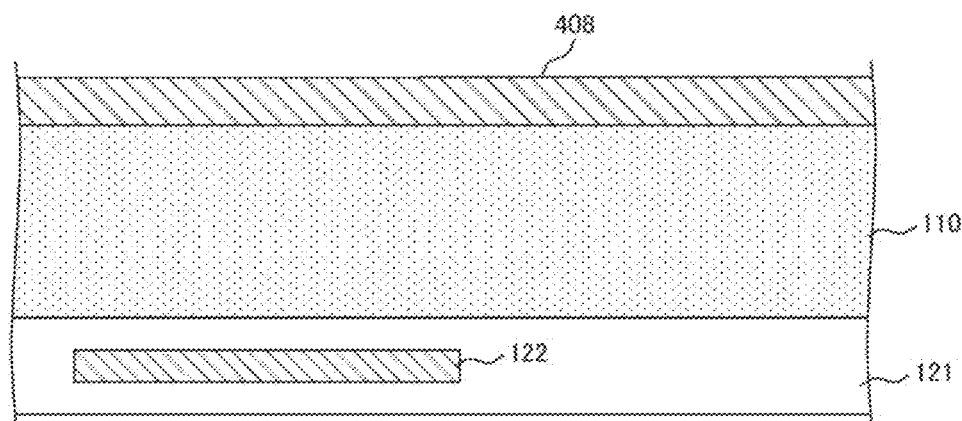
FIGS. 7A-7C are diagrams illustrating an example of a method for manufacturing an imaging apparatus according to the second embodiment of the present disclosure.

First, a material film 408 of the separation region 151 is arranged on the back surface side of the semiconductor substrate 110 (FIG. 7A).

Next, a resist 409 is arranged adjacent to the material film 408. In the resist 409, an opening 410 is arranged in a region where the through hole 161 is formed (FIG. 7B).

Next, the material film 408 is etched using the resist 409 as a mask to form the separation region 151. For this etching, dry etching can be applied. Next, etching of the semiconductor substrate 110 is continuously performed using the separation region 151 as a mask. As a result, the through hole 161 can be formed (FIG. 7C).

Thereafter, the imaging apparatus 10 can be manufactured by applying the step from FIG. 4D.

Figure 7B:
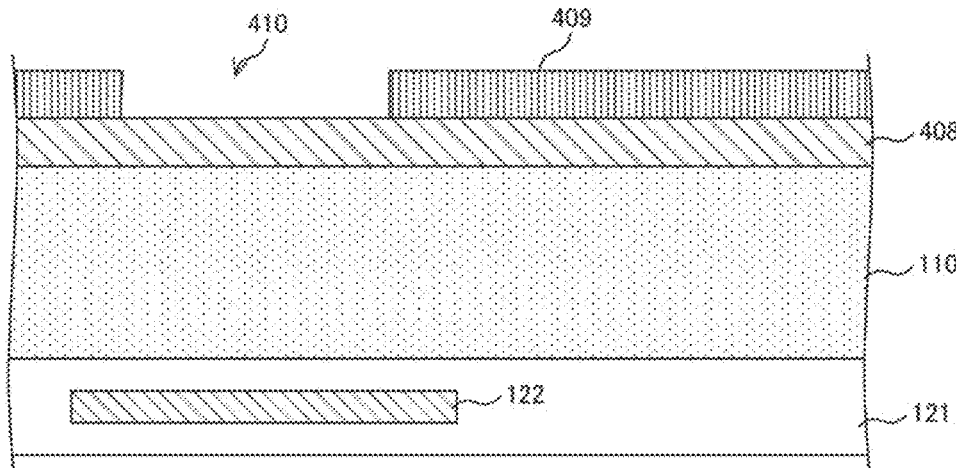
Figure 7C:
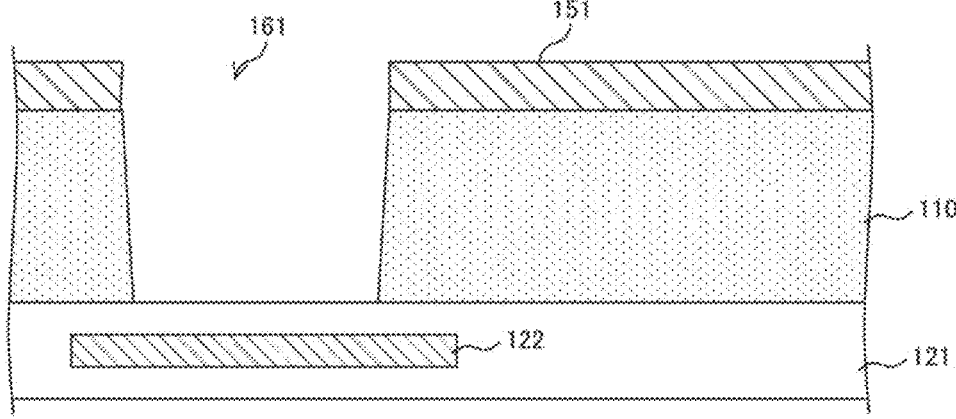

In the above-described step illustrated in FIG. 7B, after etching is performed using the resist 409 as a mask to form the separation region 151, the separation region 151 becomes a new mask. Since it is not necessary to use the resist 409 as a mask for etching the semiconductor substrate 110, the resist 409 having a relatively thin film thickness can be used.

The other configuration of the imaging apparatus 10 is similar to the configuration of the imaging apparatus 10 described in the first embodiment of the present disclosure, and thus a description thereof will not be repeated.

As described above, the imaging apparatus 10 of the second embodiment of the present disclosure can use the separation region 151 including inorganic material, and can reduce the parasitic capacitance of the back surface side wiring 165 by separating the semiconductor substrate 110 and the back surface side wiring 165 from each other.

3. Third Embodiment

In the imaging apparatus 10 of the above-described first embodiment, the back surface side wiring 165 and the through wiring 169 are insulated by the insulating film 162. On the other hand, the imaging apparatus 10 of a third embodiment of the present disclosure is different from the above-described first embodiment in that the back surface side wiring 165 and the through wiring 169 are insulated by a separation region.
[Configuration of Back Surface Side of Semiconductor Substrate]

Figure 8:
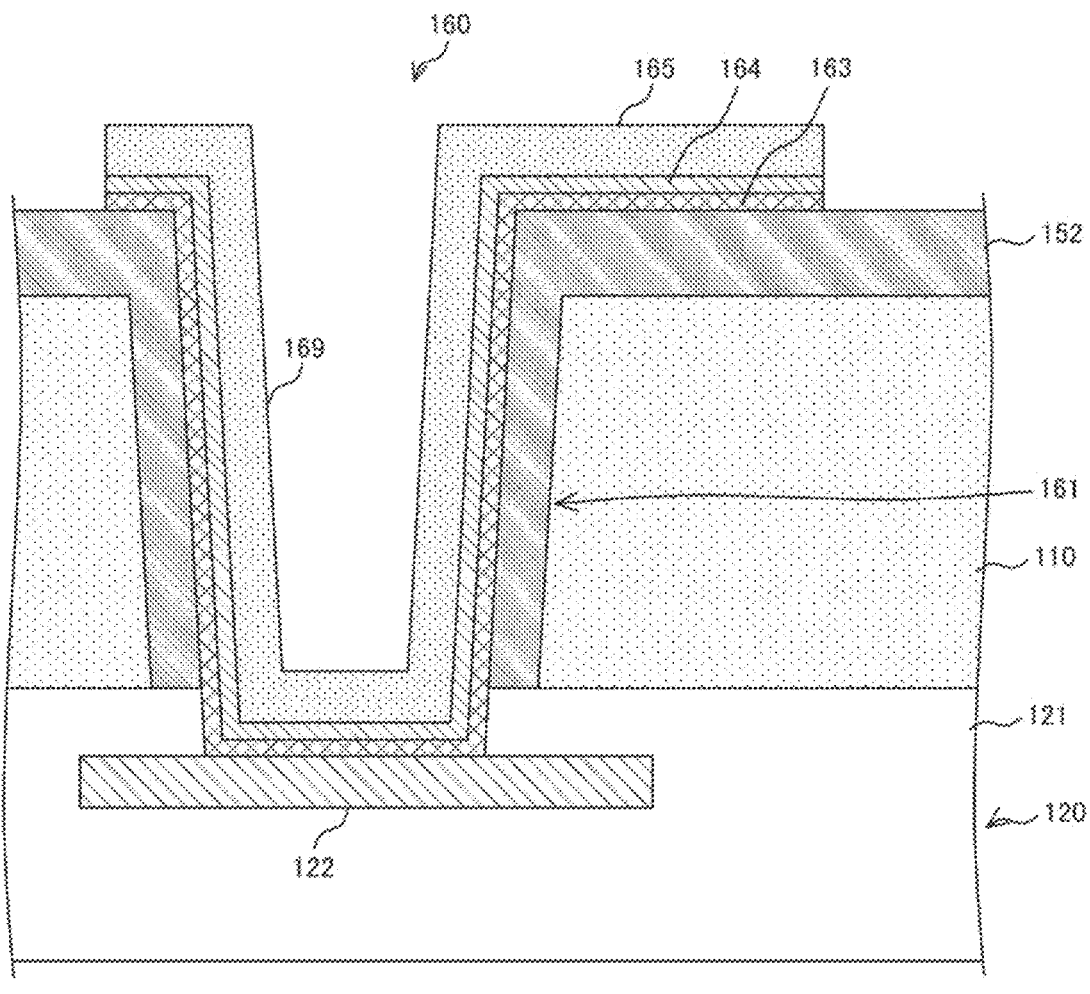
FIG. 8 is a diagram illustrating a configuration example of a back surface side of a semiconductor substrate according to a third embodiment of the present disclosure.

FIG. 8 is a diagram illustrating a configuration example of a back surface side of a semiconductor substrate according to the third embodiment of the present disclosure. As similar to FIG. 2, the drawing is a diagram illustrating a configuration example of the vicinity of the through via 160 on the back surface side of the semiconductor substrate 110, and is a diagram illustrating a configuration example on the back side of the imaging apparatus 10. The imaging apparatus 10 is different from the imaging apparatus 10 described in the first embodiment as illustrated in FIG. 2 in that the insulating film 162 is not included, and a separation region 152 is arranged instead of the separation region 150.

The separation region 152 is a separation region arranged on the back surface side of the semiconductor substrate 110 and the wall surface of the through hole 161. The separation region 152 insulates the through wiring 169 from the semiconductor substrate 110. The separation region 152 can include a photosensitive resin, for example.
[Method for Manufacturing Imaging Apparatus]

FIGS. 9 and 10 are diagrams illustrating an example of a method for manufacturing an imaging apparatus according to the third embodiment of the present disclosure. As similar to FIGS. 3 to 5, FIGS. 9 and 10 are diagrams illustrating a manufacturing process of the through via 160 in the semiconductor substrate 110 of the imaging apparatus 10.

Figure 9A:
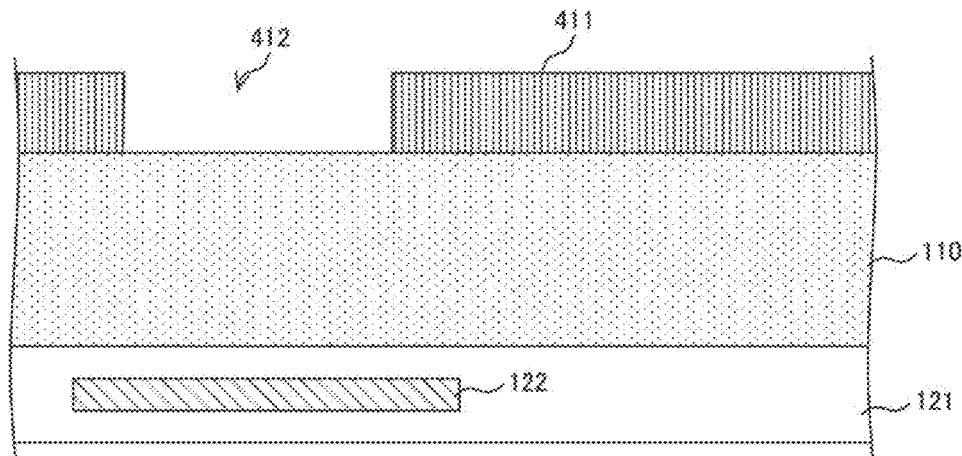
FIGS. 9A-9C are diagrams illustrating an example of a method for manufacturing an imaging apparatus according to the third embodiment of the present disclosure.

First, a resist 411 is arranged on the back surface side of the semiconductor substrate 110. This resist 411 is a resist in which an opening 412 is arranged in a region where the through hole 161 is formed (FIG. 9A).

Figure 9B:
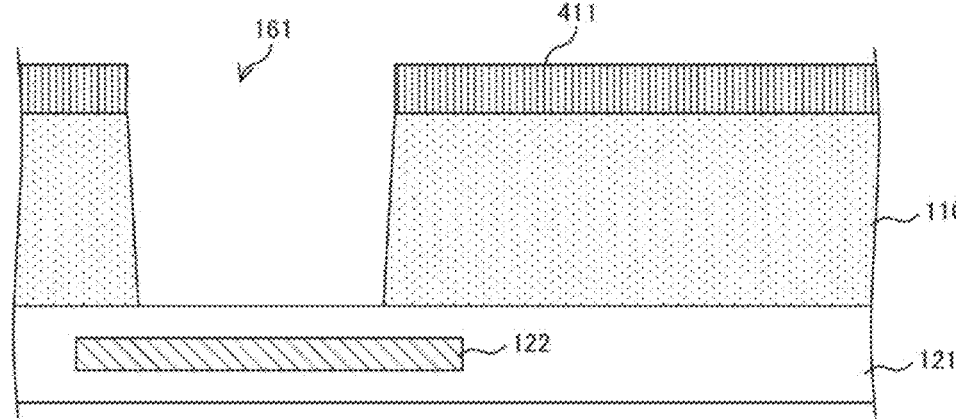

Next, the semiconductor substrate 110 is etched using the resist 411 as a mask to form the through hole 161 (FIG. 9B).

Figure 9C:
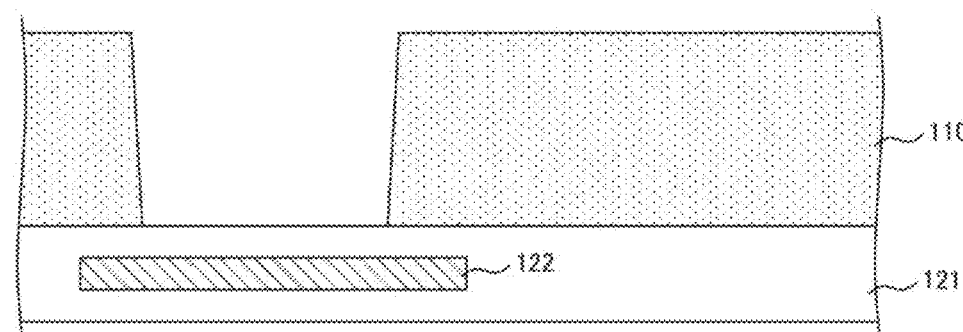
Figure 10D:
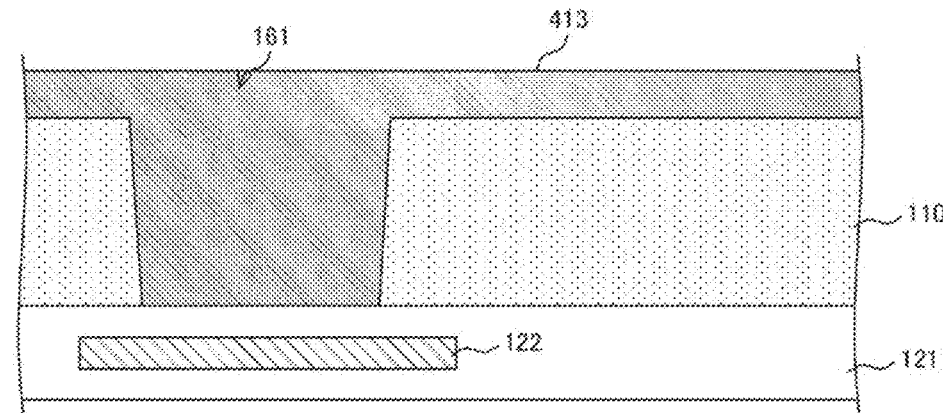
FIGS. 10D-10F are diagrams illustrating an example of a method for manufacturing an imaging apparatus according to the third embodiment of the present disclosure.

Next, the resist 411 is removed (FIG. 9C). Next, a resin film 413 is arranged on the back surface side of the semiconductor substrate 110. The resin film 413 is a film including a photosensitive resin. At this time, the resin film 413 is arranged and embedded in the through hole 161 (FIG. 10D).

Figure 10E:
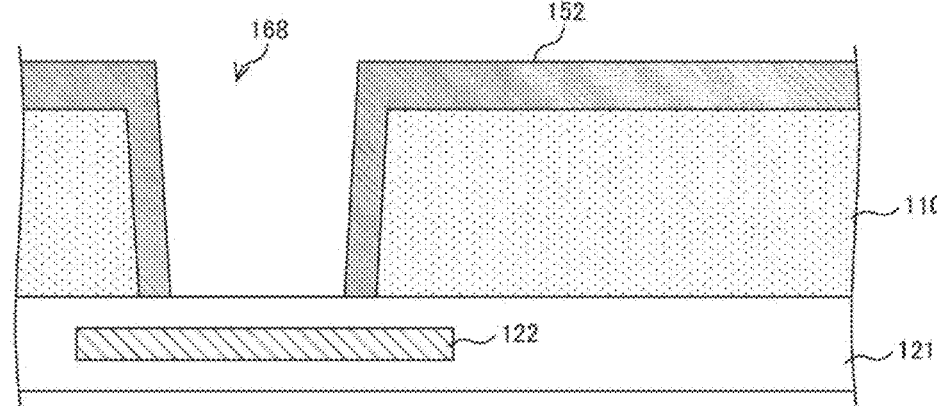

Next, the resin film 413 is exposed and developed to form a through hole 168 in a region where the through via 160 is to be formed. The through hole 168 is a through hole having a smaller diameter than that of the through hole 161. As a result, a resin film is formed on the wall surface of the semiconductor substrate 110, and the separation region 152 can be formed (FIG. 10E).

Figure 10F:
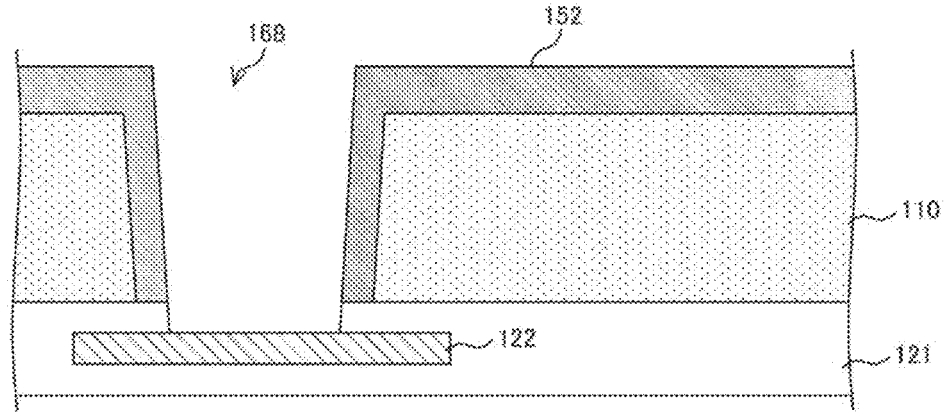

Next, the insulating layer 121 is etched using the separation region 152 as a mask (FIG. 10F).

Thereafter, the imaging apparatus 10 can be manufactured by applying the step from FIG. 4F.

The other configuration of the imaging apparatus 10 is similar to the configuration of the imaging apparatus 10 described in the first embodiment of the present disclosure, and thus a description thereof will not be repeated.

As described above, in the imaging apparatus 10 of the third embodiment of the present disclosure, the insulating film 162 can be eliminated by arranging the separation region 152 adjacent to the back surface side of the semiconductor substrate 110 and the wall surface of the through hole 161. The manufacturing process of the imaging apparatus 10 can be simplified.

4. Fourth Embodiment

In the imaging apparatus 10 of the above-described first embodiment, the separation region 150 is arranged between the back surface side wiring 165 and the semiconductor substrate 110. On the other hand, the imaging apparatus 10 of a fourth embodiment of the present disclosure is different from the above-described first embodiment in that a separation region is further arranged in a recess portion formed on the back surface side of the semiconductor substrate 110.

[Configuration of Back Surface Side of Semiconductor Substrate]

Figure 11:
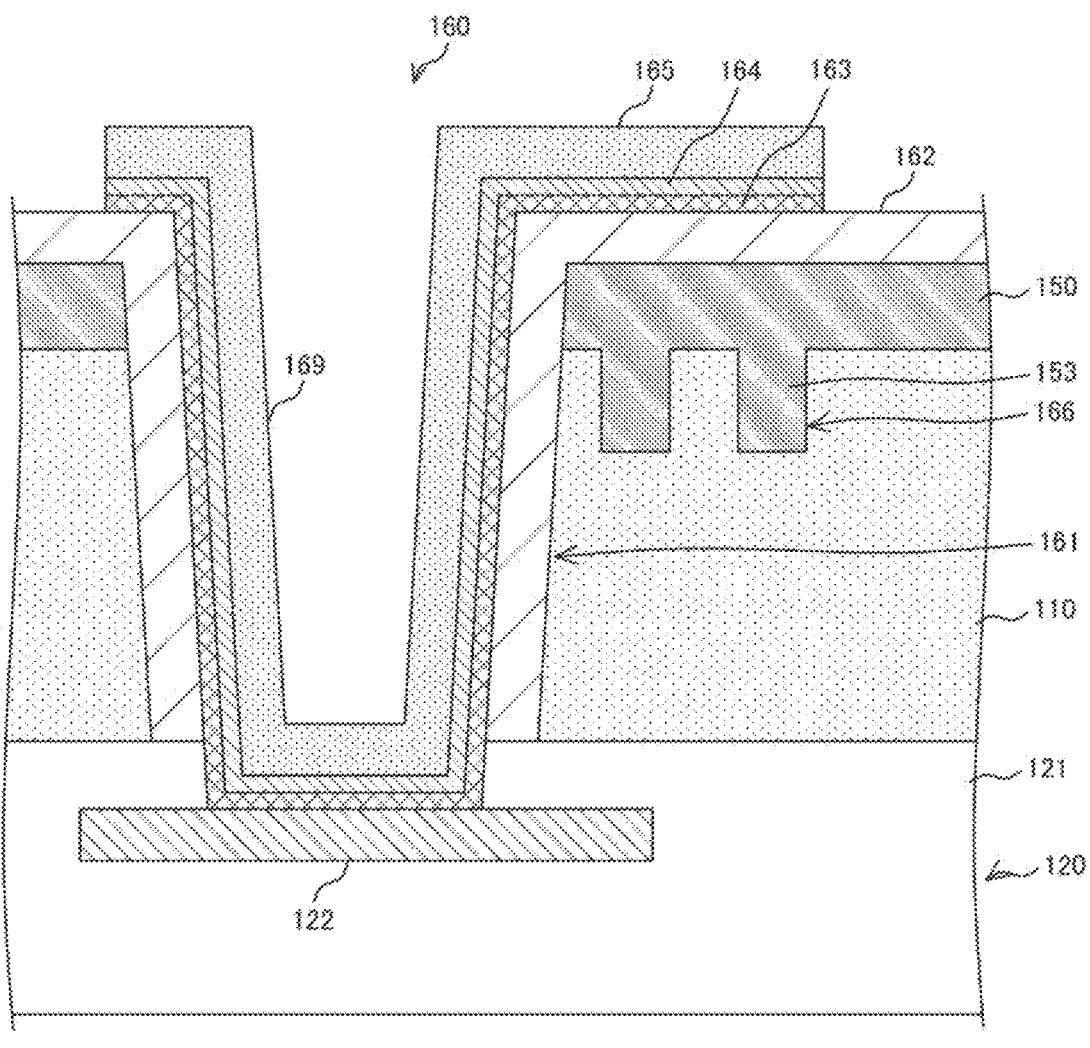
FIG. 11 is a diagram illustrating a configuration example of a back surface side of a semiconductor substrate according to a fourth embodiment of the present disclosure.

FIG. 11 is a diagram illustrating a configuration example of a back surface side of a semiconductor substrate according to the fourth embodiment of the present disclosure. As similar to FIG. 2, the drawing is a diagram illustrating a configuration example of the vicinity of the through via 160 on the back surface side of the semiconductor substrate 110, and is a diagram illustrating a configuration example on the back side of the imaging apparatus 10. The imaging apparatus 10 is different from the imaging apparatus 10 described in FIG. 2 in that the separation region 153 is further arranged.

The separation region 153 is a separation region arranged in a recess portion 166 formed on the back surface side of the semiconductor substrate 110. That is, the configuration according to the present embodiment includes, as the separation regions, the separation region 150 which is a planar separation region formed between the back surface side wiring 165 and the semiconductor substrate 110, and the separation region 153 which is an in-recess portion separation region formed in the recess portion 166. The separation region 153 can be arranged on the back surface side of the semiconductor substrate 110 below the back surface side wiring 165. In the region where the separation region 153 is arranged, the distance between the back surface side wiring 165 and the semiconductor substrate 110 increases, so that the electrostatic capacitance decreases. Therefore, by arranging the separation region 153, the electrostatic capacitance between the back surface side wiring 165 and the semiconductor substrate 110 in the drawing can be reduced.

As illustrated in FIG. 11, a plurality of the separation region 153 can be arranged. Furthermore, the separation region 153 can include the same material as the material of the separation region 150, and can be formed simultaneously. The separation region 153 can include a photosensitive resin, for example. Furthermore, the recess portion 166 can be configured to have a depth of 3 μm, for example.

[Configuration of Back Surface Side of Semiconductor Substrate]

FIG. 12 is a plan view illustrating a configuration example of the back surface side of the semiconductor substrate according to the fourth embodiment of the present disclosure. The drawing is a plan view illustrating a configuration example of the separation region 153 and the recess portion 166. In the drawing, a solid rectangle represents the back surface side wiring 165. A dashed rectangle represents the recess portion 166 of the semiconductor substrate 110.

Figure 12A:
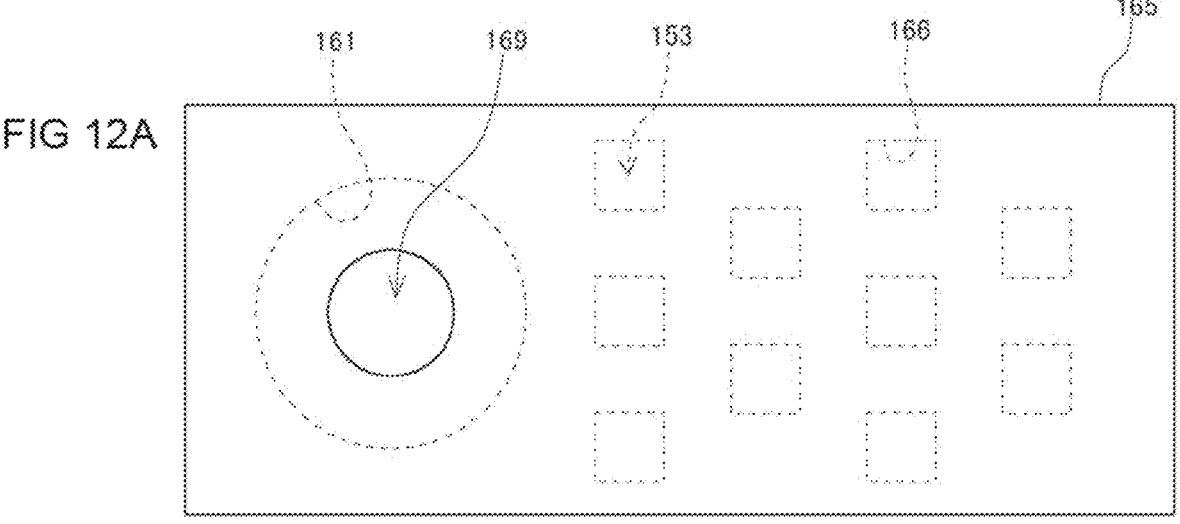
FIGS. 12A and 12B are plan views illustrating a configuration example of the back surface side of the semiconductor substrate according to the fourth embodiment of the present disclosure.

FIG. 12A is a diagram illustrating an example of the recess portion 166 having a rectangular shape on the back surface side of the semiconductor substrate 110. The separation region 153 is arranged in the recess portion 166 of FIG. 12A. The separation region 153 in FIG. 12A has a rectangular shape on the back surface side of the semiconductor substrate 110. Note that, the recess portion 166 can be configured to have a width of equal to or less than 3 μm, for example.

Figure 12B:
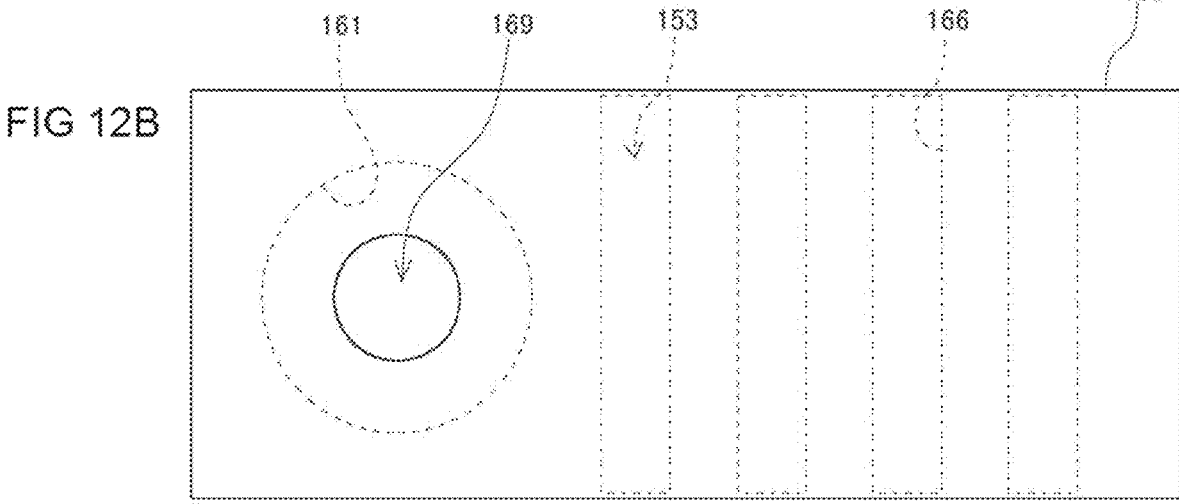

FIG. 12B is a diagram illustrating an example of the recess portion 166 formed in a groove shape. The separation region 153 in FIG. 12B is also formed in a groove shape. The recess portion 166 in FIG. 12B can be formed in a groove shape having a width of equal to or less than 3 μm, for example.

Note that the configuration of the separation region 153 is not limited to this example. For example, the separation region 153 may be formed in another shape such as a mesh shape.

[Method for Manufacturing Imaging Apparatus]

FIGS. 13 and 14 are diagrams illustrating an example of a method for manufacturing an imaging apparatus according to the fourth embodiment of the present disclosure. As similar to FIGS. 3 to 5, FIGS. 13 and 14 are diagrams illustrating a manufacturing process of the through via 160 in the semiconductor substrate 110 of the imaging apparatus 10.

Figure 13A:
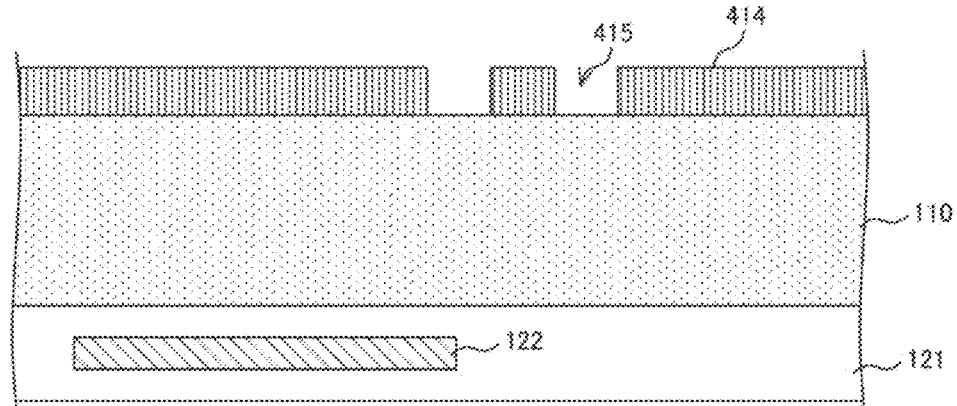
FIGS. 13A-13C are diagrams illustrating an example of a method for manufacturing an imaging apparatus according to the fourth embodiment of the present disclosure.

First, a resist 414 is arranged on the back surface side of the semiconductor substrate 110. This resist 414 is a resist in which an opening 415 is arranged in a region where the recess portion 166 is formed (FIG. 13A).

Figure 13B:
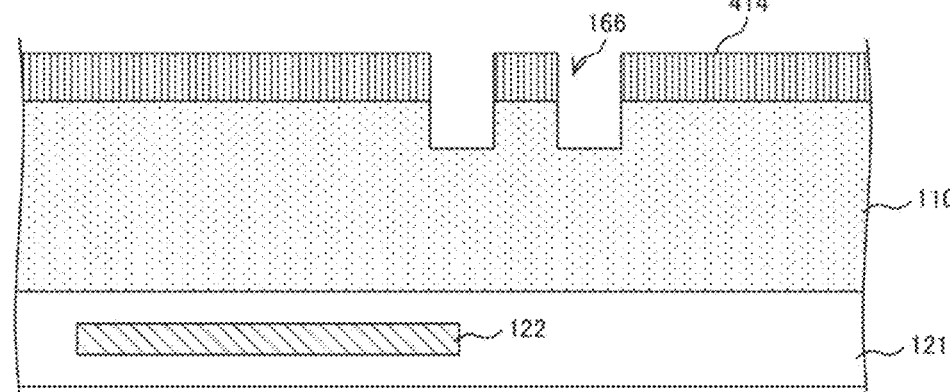

Next, the semiconductor substrate 110 is etched using the resist 414 as a mask to form the recess portion 166 (FIG. 13B).

Figure 13C:
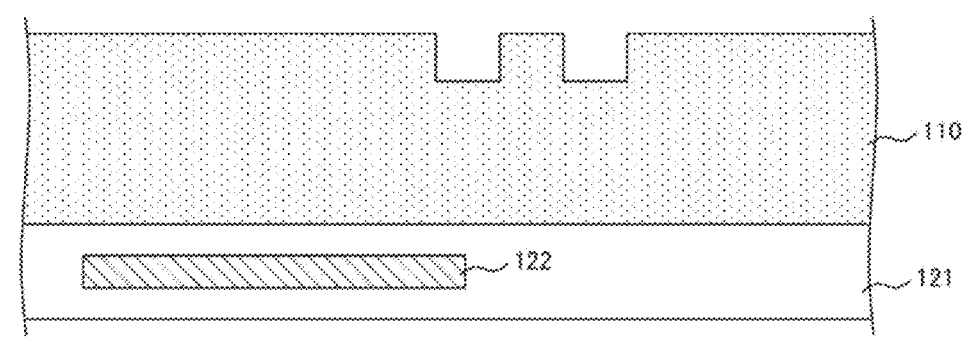
Figure 14D:
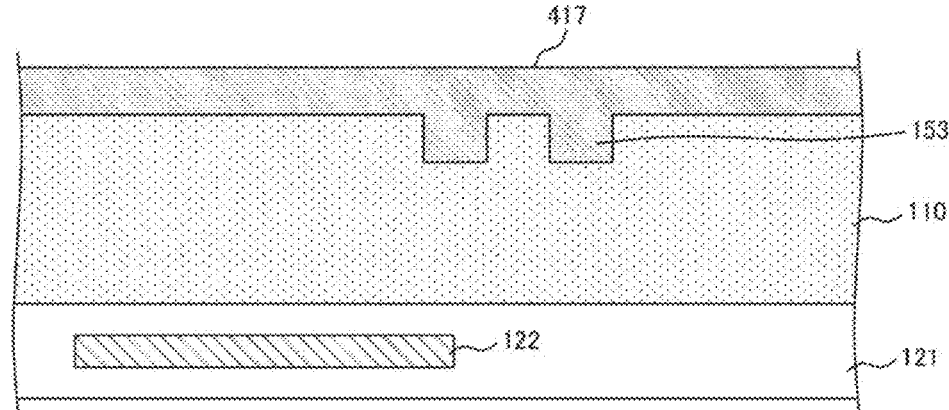
FIGS. 14D-14F are diagrams illustrating an example of the method for manufacturing an imaging apparatus according to the fourth embodiment of the present disclosure.

Next, the resist 414 is removed (FIG. 13C). Next, a resin film 417 is arranged on the back surface side of the semiconductor substrate 110. The resin film 417 is a film including a photosensitive resin. At this time, the resin film 417 is arranged and embedded in the recess portion 166. As a result, the separation region 153 can be formed (FIG. 14D).

Figure 14E:
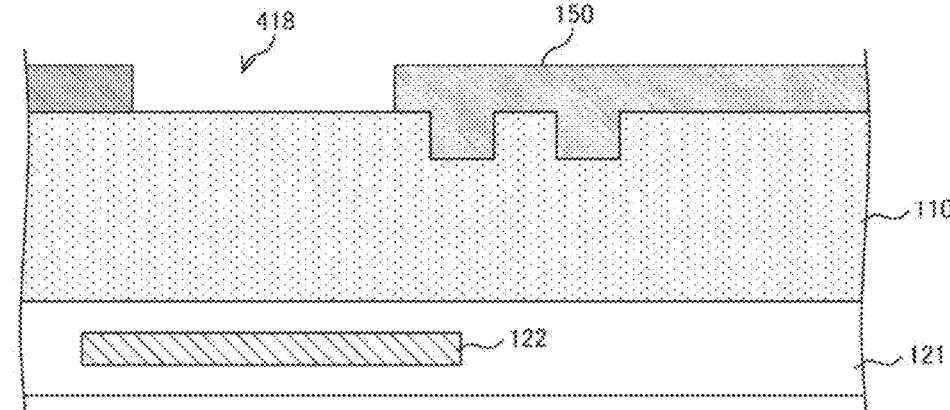

Next, the resin film 417 is exposed and developed to form an opening 418 in a region where the through hole 161 is to be formed. As a result, the separation region 150 can be formed (FIG. 14E).

Figure 14F:
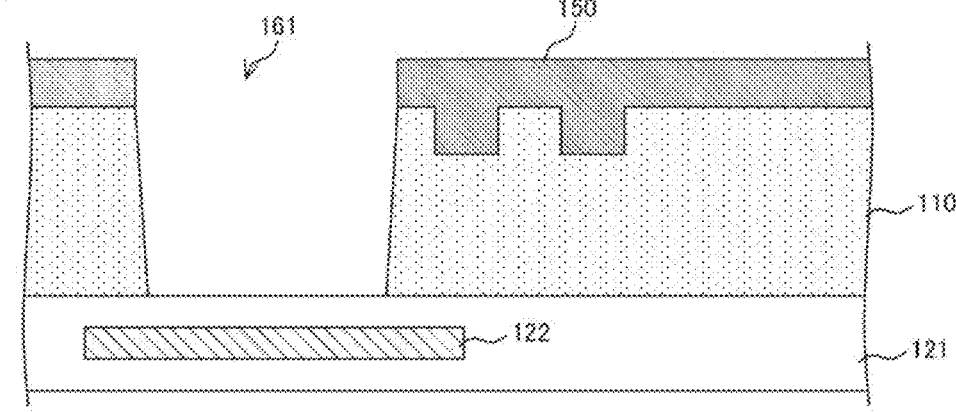

Next, the semiconductor substrate 110 is etched using the separation region 150 as a mask to form the through hole 161 (FIG. 14F).

Thereafter, the imaging apparatus 10 can be manufactured by applying the step from FIG. 4D.

The other configuration of the imaging apparatus 10 is similar to the configuration of the imaging apparatus 10 described in the first embodiment of the present disclosure, and thus a description thereof will not be repeated.

As described above, the imaging apparatus 10 of the fourth embodiment of the present disclosure can further reduce the parasitic capacitance of the back surface side wiring 165 by forming the recess portion 166 on the back surface side of the semiconductor substrate 110 and further arranging the separation region 153.

5. Fifth Embodiment

The imaging apparatus 10 of the above-described fourth embodiment uses the separation region 153 including a resin. On the other hand, the imaging apparatus 10 of a fifth embodiment of the present disclosure is different from that of the above-described fourth embodiment in that a separation region including a gap is used.

[Configuration of Back Surface Side of Semiconductor Substrate]

Figure 15:
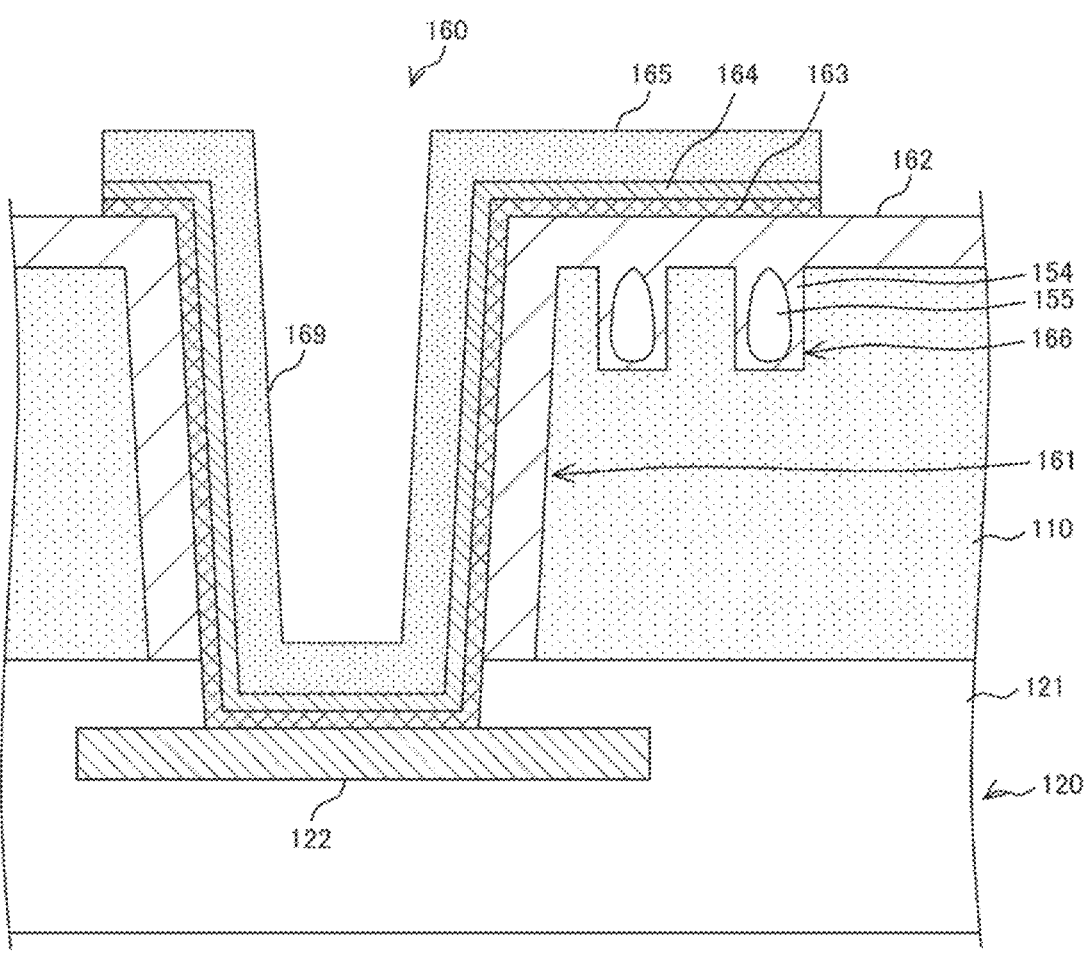
FIG. 15 is a diagram illustrating a configuration example of a back surface side of a semiconductor substrate according to a fifth embodiment of the present disclosure.

FIG. 15 is a diagram illustrating a configuration example of a back surface side of a semiconductor substrate according to the fifth embodiment of the present disclosure. As similar to FIG. 11, the drawing is a diagram illustrating a configuration example of the vicinity of the through via 160 on the back surface side of the semiconductor substrate 110, and is a diagram illustrating a configuration example on the back side of the imaging apparatus 10. The imaging apparatus 10 is different from the imaging apparatus 10 described in the fourth embodiment as illustrated in FIG. 11 in that the separation region 150 is not included, and a separation region 154 is arranged instead of the separation region 153.

As similar to the separation region 153, the separation region 154 is a separation region arranged in the recess portion 166 of the semiconductor substrate 110. The separation region 154 can include an insulator having a gap 155 therein. The separation region 154 in the drawing is an example in which $SiO_2$ that is an insulator constituting the insulating film 162 is embedded in the recess portion 166. When this $SiO_2$ is embedded in the recess portion 166, the gap 155 is formed. This can be performed by using a film forming method with low step coverage such as CVD when forming the $SiO_2$ film.

In a case where the insulating film 162 is a separation region, the configuration according to the present embodiment includes, as separation regions, an in-hole separation region that covers a wall surface (inner circumferential surface) of the through hole 161, a planar separation region formed on a back surface side of the semiconductor substrate 110, and a separation region 154 that is an in-recess portion separation region formed in the recess portion 166. Then, a gap 155 is formed in the separation region 154. Note that the gap 155 is only required to be formed such that at least a part thereof is located in the recess portion 166. That is, the entire gap 155 may be located in the recess portion 166, and a part of the gap 155 may be located over a portion from the recess portion 166 to the insulating film 162.

Air or the like can be enclosed in the gap 155. Since the relative permittivity of air is approximately 1.0, the electrostatic capacitance between the back surface side wiring 165 and the semiconductor substrate 110 can be further reduced. The recess portion 166 in FIG. 15 is preferably configured to have a width of equal to or less than 2 μm. This is to facilitate closing of the opening of the recess portion 166 in the step of forming the gap 155 as described later. Note that, since the separation region 150 is not included in the imaging apparatus 10 in the drawing, the insulating film 162 in the drawing is preferably configured to have a thick film. The insulating film 162 in the drawing can be configured to have a film thickness of 7 μm, for example.

[Method for Manufacturing Imaging Apparatus]

FIG. 16 is a diagram illustrating an example of a method for manufacturing an imaging apparatus according to a fifth embodiment of the present disclosure. As similar to FIGS. 13 to 14, the drawing is a diagram illustrating a manufacturing process of the through via 160 in the semiconductor substrate 110 of the imaging apparatus 10.

First, the steps of FIGS. 13A to 14F are performed, and etching is performed on the semiconductor substrate 110 on which the recess portion 166 is formed to form the through hole 161. At the time of this etching, a resist 419 is used instead of the separation region 150 (FIG. 16A).

Figures 16A, 16B, 16C:
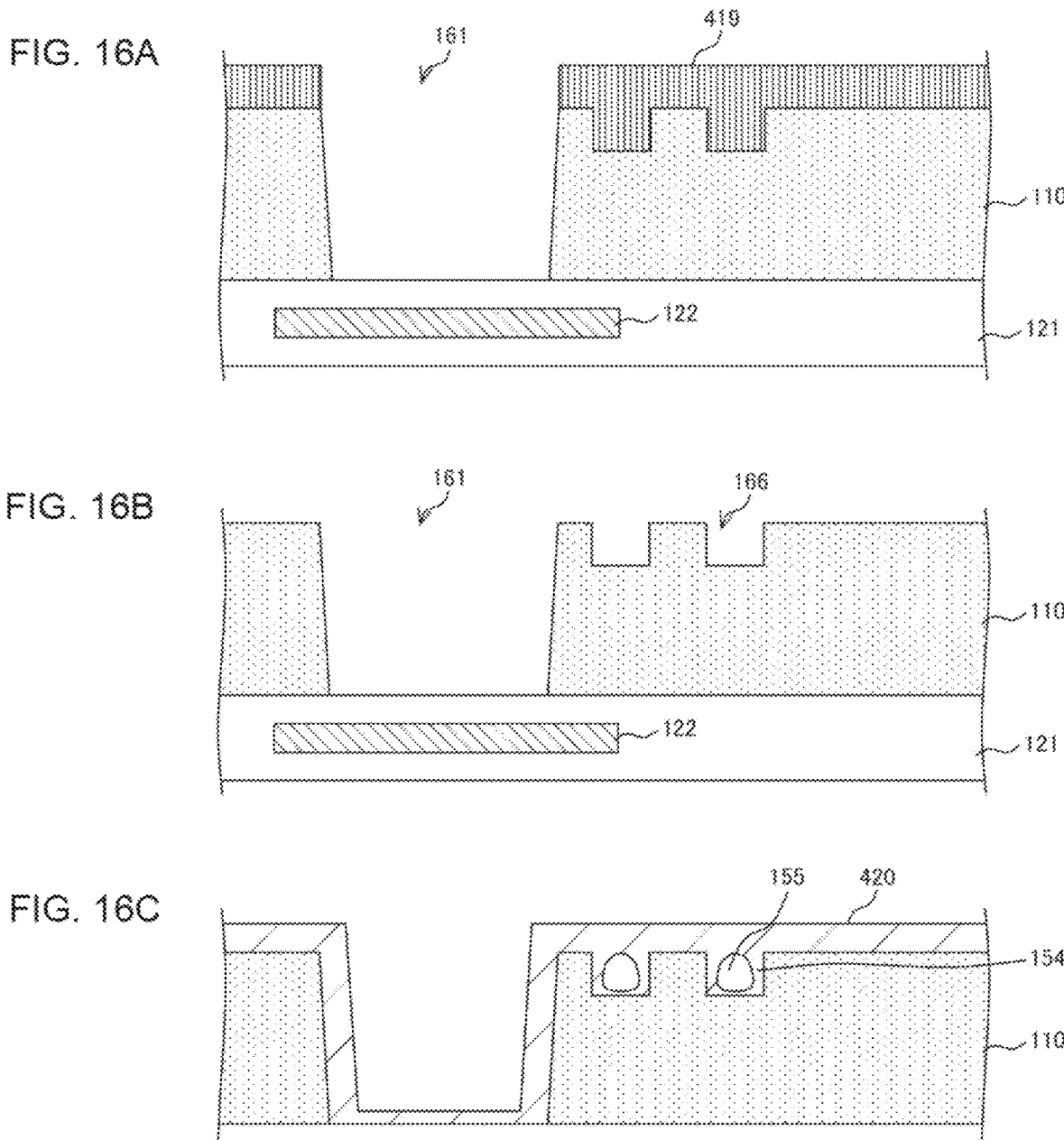
FIGS. 16A-16C are diagrams illustrating an example of a method for manufacturing an imaging apparatus according to the fifth embodiment of the present disclosure.

Next, the resist 419 is removed (FIG. 16B). Next, an insulator film 420 is arranged on the back surface side of the semiconductor substrate 110. This can be performed by forming a film of $SiO_2$ using CVD. At this time, the gap 155 can be formed by forming the insulator film 420 on the bottom surface and the side surface of the recess portion 166 and closing the opening of the recess portion 166 (FIG. 16C).

Thereafter, the imaging apparatus 10 can be manufactured by applying the step from FIG. 4E.

The other configuration of the imaging apparatus 10 is similar to the configuration of the imaging apparatus 10 described in the fourth embodiment of the present disclosure, and thus a description thereof will not be repeated.

As described above, the imaging apparatus 10 of the fifth embodiment of the present disclosure can further reduce the parasitic capacitance of the back surface side wiring 165 by arranging the separation region 154 having the gap 155.

6. Sixth Embodiment

The imaging apparatus 10 of the above-described fifth embodiment has the gap 155 in the separation region 154 in the recess portion 166 formed on the back surface side of the semiconductor substrate 110. On the other hand, the imaging apparatus 10 of a sixth embodiment of the present disclosure is different from the fifth embodiment in that a portion formed on the back surface side of the semiconductor substrate 110 in the separation region includes a gap.

[Configuration of Back Surface Side of Semiconductor Substrate]

Figure 17:
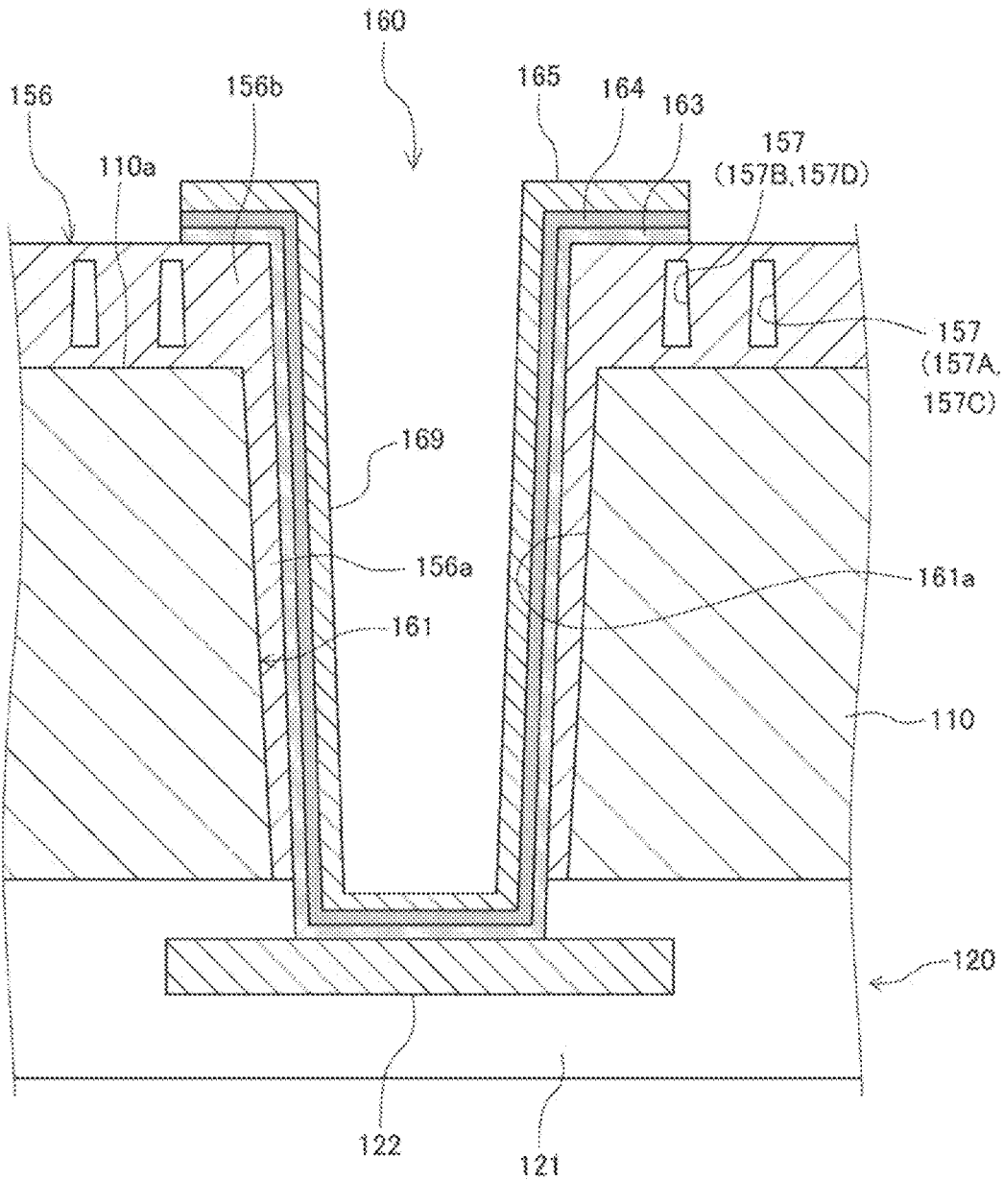
FIG. 17 is a diagram illustrating a configuration example of a back surface side of a semiconductor substrate according to a sixth embodiment of the present disclosure.

FIG. 17 is a diagram illustrating a configuration example of a back surface side of a semiconductor substrate according to the sixth embodiment of the present disclosure. As similar to FIG. 15, FIG. 17 is a cross-sectional view illustrating a configuration example of the vicinity of the through via 160 on the back surface side of the semiconductor substrate 110, and is a cross-sectional view illustrating a configuration example on the back side of the imaging apparatus 10. The configuration according to the present embodiment is different from the imaging apparatus 10 described in the fifth embodiment as illustrated in FIG. 15 in that the recess portion 166 is not formed on the back surface side of the semiconductor substrate 110 and the gap 157 is provided in the separation region 156.

As illustrated in FIG. 17, the imaging apparatus 10 according to the present embodiment includes a through wiring 169 that is arranged in the through hole 161 formed in the semiconductor substrate 110 and connects the wiring layer 122 and the back surface side wiring 165. Then, the separation region 156 is formed in a portion extending from the inside of the through hole 161 of the semiconductor substrate 110 to the back surface side of the semiconductor substrate 110. That is, the separation region 156 includes an in-hole separation region portion 156*a* covering the inner circumferential surface 161*a* of the through hole 161 and a back surface side separation region portion 156*b* formed on the back surface 110*a* side of the semiconductor substrate 110.

The in-hole separation region portion 156*a* is formed as a film-like portion covering the inner circumferential surface 161*a* of the through hole 161, and has a cylindrical shape corresponding to the hole shape of the through hole 161. The barrier layer 163, the seed layer 164, and the back surface side wiring 165 are sequentially stacked on the inner circumferential side of the in-hole separation region portion 156*a*.

The back surface side separation region portion 156*b* is a layer portion covering the back surface 110*a* of the semiconductor substrate 110. The barrier layer 163, the seed layer 164, and the back surface side wiring 165 are sequentially stacked on the upper side of the portion around the formation portion of the through hole 161 in the back surface side separation region portion 156*b*. The in-hole separation region portion 156*a* and the back surface side separation region portion 156*b* are formed as portions continuous with each other.

In such a configuration including the separation region 156, the gap 157 is formed in the back surface side separation region portion 156*b*. The gap 157 is a hollow portion in the separation region 156, and air or the like is enclosed therein. The gap 157 is formed at a plurality of positions with a common formation range in the thickness direction (vertical direction in FIG. 17) of the back surface side separation region portion 156*b*.

Figure 18A:
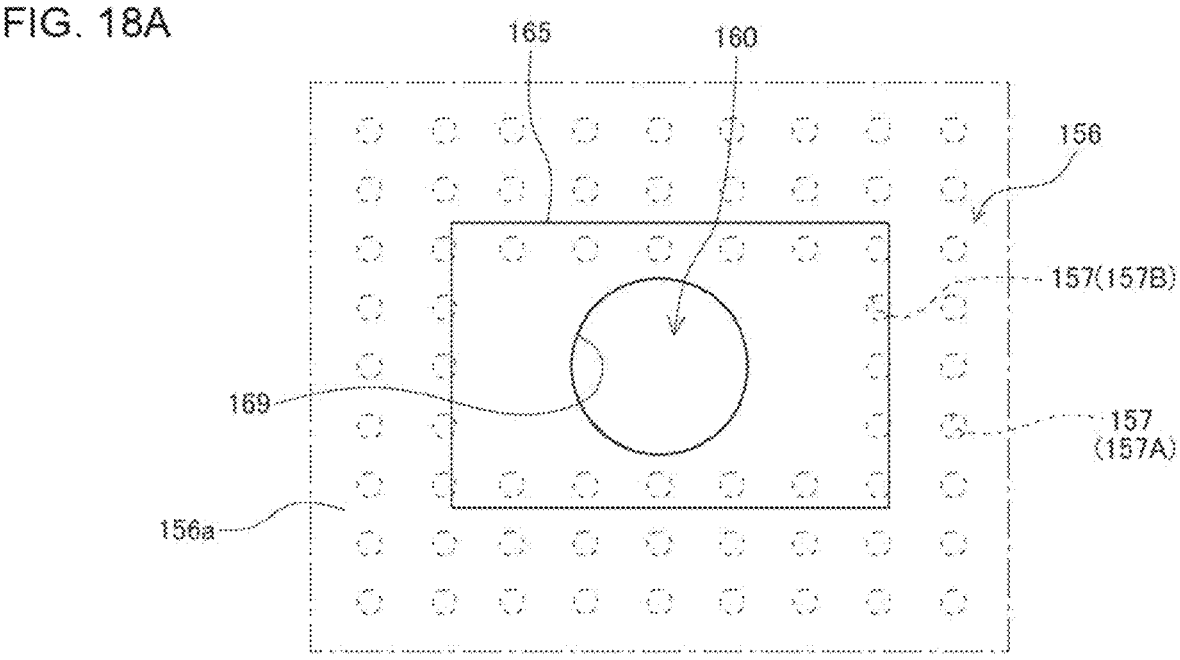
FIGS. 18A and 18B are plan views illustrating a configuration example of the back surface side of the semiconductor substrate according to the sixth embodiment of the present disclosure.
Figure 18B:
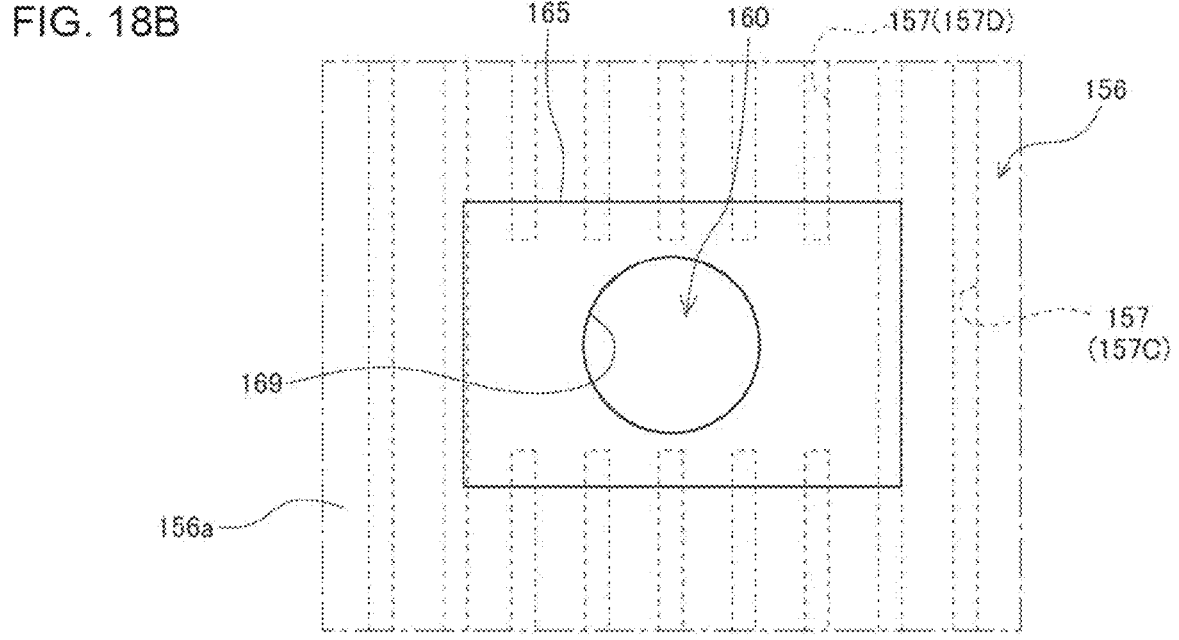

FIG. 18 is a plan view illustrating a configuration example of the back surface side of the semiconductor substrate according to the sixth embodiment of the present disclosure. FIGS. 18A and 18B are plan views illustrating planar arrangement examples of the gaps 157.

As illustrated in FIG. 18A, the gaps 157 are formed, for example, in a two-dimensional lattice point-like arrangement. In such an arrangement of the gaps 157, the gaps 157 located around the through via 160 are formed so as to partially or entirely overlap the back surface side wiring 165 in plan view. That is, as the gap 157, there are an outer gap 157A formed outside the back surface side wiring 165 in plan view and an inner gap 157B formed so as to at least partially overlap with the back surface side wiring 165 in plan view. The inner gap 157B is a gap 157 formed such that at least a part thereof is located in a portion of the separation region 156 sandwiched between the back surface 110*a* of the semiconductor substrate 110 and the barrier layer 163.

As illustrated in FIG. 18B, the gaps 157 are formed in a plurality of linear arrays arranged in parallel, for example. In such an arrangement of the gaps 157, the gaps 157 located around the through via 160 are formed so as to partially overlap the back surface side wiring 165 in plan view. That is, as the gap 157, there are a gap 157C formed so as not to overlap the back surface side wiring 165 in plan view and a gap 157D formed so as to partially overlap with the back surface side wiring 165 in plan view.

Note that the arrangement of the gaps 157 is not limited to these examples. As the plan view shape of the gap 157, a circular shape, a polygonal shape, an elliptical shape, or the like is appropriately adopted. Furthermore, the gaps 157 may be formed in another pattern such as a lattice pattern (mesh pattern).

[Method for Manufacturing Imaging Apparatus]

FIGS. 19 and 20 are diagrams illustrating an example of a method for manufacturing an imaging apparatus according to the sixth embodiment of the present disclosure. As similar to FIGS. 3 to 5, FIGS. 19 and 20 are diagrams illustrating a manufacturing process of the through via 160 in the semiconductor substrate 110 of the imaging apparatus 10.

First, as illustrated in FIG. 19A, a material film 431 including the material of the separation region 156 is formed on the back surface side of the semiconductor substrate 110. The material film 431 is formed with a thickness of 2.5 μm on the entire back surface 110*a* of the semiconductor substrate 110 using $SiO_2$ as a material, for example.

Next, as illustrated in FIG. 19B, a resist 432 for forming a recess portion (trench) is formed on the material film 431. The resist 432 is partially formed in a range of the entire surface of the material film 431 according to the formation positions of the gaps 157 by patterning using a photolithography technology, for example. The arrangement of the opening 432*a* which is a portion where the resist 432 is not formed corresponds to the final arrangement of the gap 157.

Next, as illustrated in FIG. 19C, the material film 431 is etched using the resist 432 as a mask, and a pattern is formed on the material film 431. For this etching, for example, dry etching is used. Through this step, the material film 431 is partially removed, and the material film 433 having the uneven portion corresponding to the shape of the resist 432 is formed. Note that, after the formation of the material film 433, the resist 432 is peeled off and removed.

In the etching step of forming the material film 433, the material film 431 is partially removed such that a bottom portion 433*a* covering the entire back surface 110*a* of the semiconductor substrate 110 remains. Accordingly, the etched material film 433 has the bottom portion 433*a*, a convex portion 433*b* corresponding to the shape of the resist 432, and a recess portion 433*c* formed between the adjacent convex portions 433*b*. The recess portion 433*c* finally becomes a portion forming the gap 157 in the separation region 156.

Next, as illustrated in FIG. 19D, a resist 434 for forming the through via 160 is formed on the material film 433 by patterning or the like using a photolithography technology. The resist 434 is formed so as to fill the recess portion 433*c* of the material film 433 and to be stacked on the material film 433. In the resist 434, an opening 434*a* is formed in a region corresponding to a formation portion of the through hole 161.

Figure 20A:
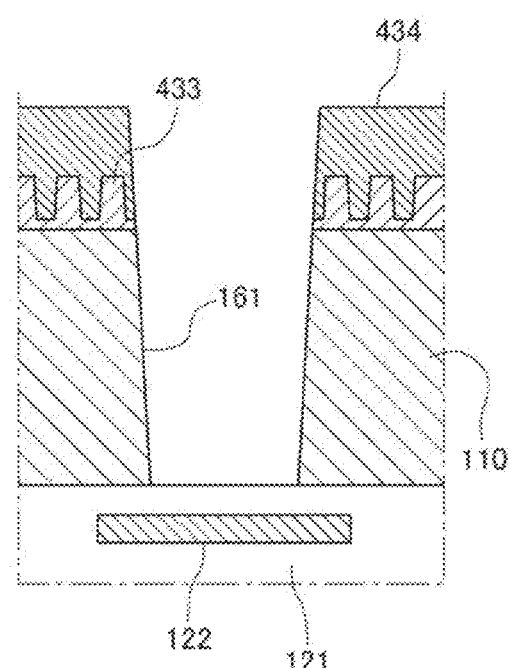
FIGS. 20A-20D are diagrams illustrating an example of a method for manufacturing an imaging apparatus according to the sixth embodiment of the present disclosure.

Next, as illustrated in FIG. 20A, the semiconductor substrate 110 is etched using the resist 434 as a mask to form the through hole 161. For this etching, for example, dry etching is used. In this step, only the semiconductor substrate 110 forming the through hole 161 is etched, and the insulating layer 121 on the front surface side of the semiconductor substrate 110 is not etched.

Figure 20B:
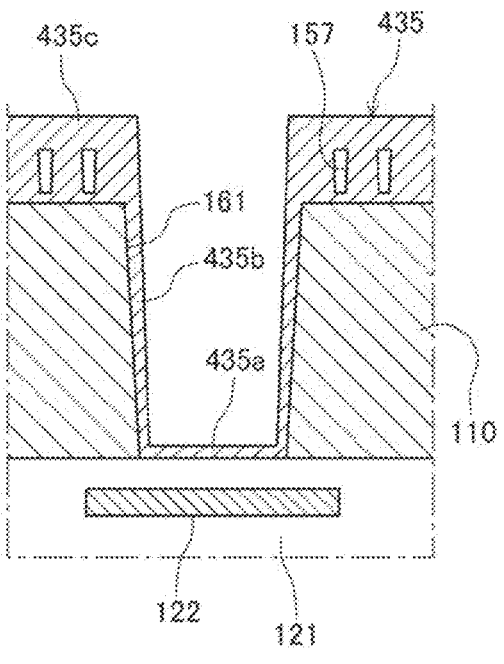

Next, as illustrated in FIG. 20B, after the resist 434 is peeled off and removed, a film is formed by the material of the separation region 156. Here, for example, a film is formed with a thickness of 9 μm using $SiO_2$ that is the same material as the material film 433 as a material by a CVD method. By this film forming step, the insulator film 435 is formed. The insulator film 435 includes a bottom film portion 435*a* that covers the surface of the insulating layer 121 exposed by etching for forming the through hole 161, an in-hole film portion 435*b* that covers the inner circumferential surface 161*a* of the through hole 161, and a surface layer film portion 435*c* formed on the material film 433.

Through this film forming step, the recess portion 433*c* of the material film 433 is closed by the layer film portion 435*c* of the insulator film 435 from above, and thereby, the gap 157 is formed. In this film forming step, a film forming method and film forming conditions with low step coverage, that is, low coverage, such as CVD, are used in order to form the gap 157.

Figure 20C:
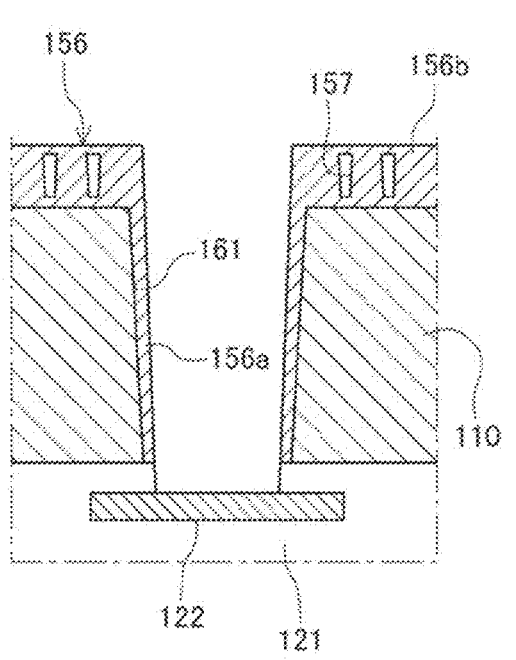

Subsequently, as illustrated in FIG. 20C, the insulator film 435 is etched (so-called etch-back) to remove the bottom film portion 435*a* of the bottom portion of the through hole 161. As a result, the separation region 156 having the gap 157 is formed. Thereafter, by further performing etching, the portion of the insulating layer 121 on the wiring layer 122 is completely removed, and the upper surface of the wiring layer 122 is exposed to the through hole 161 side. As a result, the through hole 161 extending from the back surface side of the semiconductor substrate 110 to the wiring layer 122 is formed.

For this etching, for example, anisotropic dry etching is used. In this etching step, as the bottom film portion 435*a* is removed, the film thickness of the surface layer film portion 435*c* is also reduced. This etching step is performed such that the film thickness of a back surface side separation region portion 156*b*, which is a field portion of the separation region 156, remains by, for example, 9 μm.

Figure 20D:
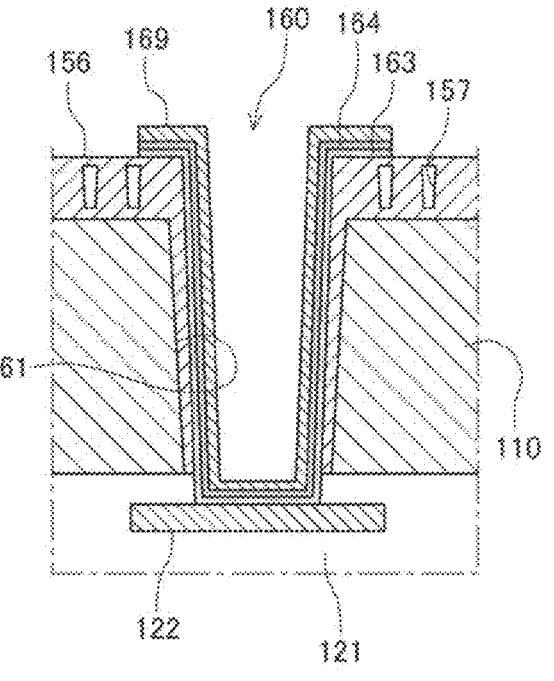

Then, as illustrated in FIG. 20D, after the barrier layer 163 and the seed layer 164 are formed, the through wiring 169 is formed. Steps subsequent to the step of forming these layers are similar to those in the first embodiment, and thus are omitted.

According to the configuration of the sixth embodiment of the present disclosure, the separation region 156 having the gap 157 in the field portion is provided between the semiconductor substrate 110 and the back surface side wiring 165, so that the parasitic capacitance of the back surface side wiring 165 can be effectively reduced. That is, for example, air is sealed in the gap 157, so that the dielectric constant of the separation region 156 can be reduced, and the parasitic capacitance can be reduced. As a result, a signal propagation delay can be suppressed, and a high-speed operation can be achieved. In particular, by forming the gap 157 so as to overlap the back surface side wiring 165 in plan view, the parasitic capacitance between the semiconductor substrate 110 and the back surface side wiring 165 can be effectively reduced.

Furthermore, in the method for manufacturing the imaging apparatus 10 according to the present embodiment, the trench of the insulator film 435 is not completely embedded by the material for forming the separation region 156 using the film forming method and film forming conditions with low coverage, and thereby, the gap 157 can be formed. As a result, the separation region 156 having the gap 157 can be formed at low cost, and the parasitic capacitance can be reduced.

Furthermore, according to the configuration according to the present embodiment, the following effects can be obtained in the relationship with the configuration according to the fifth embodiment (see FIG. 15) in which the recess portion 166 is formed in the semiconductor substrate 110 and the gap 155 is formed in the separation region 154 in the recess portion 166. That is, since the step of forming the recess portion 166 in the semiconductor substrate 110 is unnecessary, the manufacturing method can be simplified. Furthermore, since the gap 157 is formed in the field portion on the back surface 110*a* of the semiconductor substrate 110 in the separation region 156, the gap 157 can be formed closer to the through via 160 side in the direction along the back surface 110*a* (right and left direction in FIG. 17). That is, the range in which the gap 157 can be formed can be widened on the through via 160 side. As a result, the parasitic capacitance can be effectively reduced.

7. Seventh Embodiment

In the configuration including the through via 160, the imaging apparatus 10 of the above-described fourth embodiment includes the separation region 153 in the recess portion 166 formed on the back surface side of the semiconductor substrate 110. On the other hand, a semiconductor apparatus 10A of a seventh embodiment of the present disclosure is different from that of the fourth embodiment mainly in that the through via 160 is not provided.

[Configuration of Semiconductor Apparatus]

Figure 21:
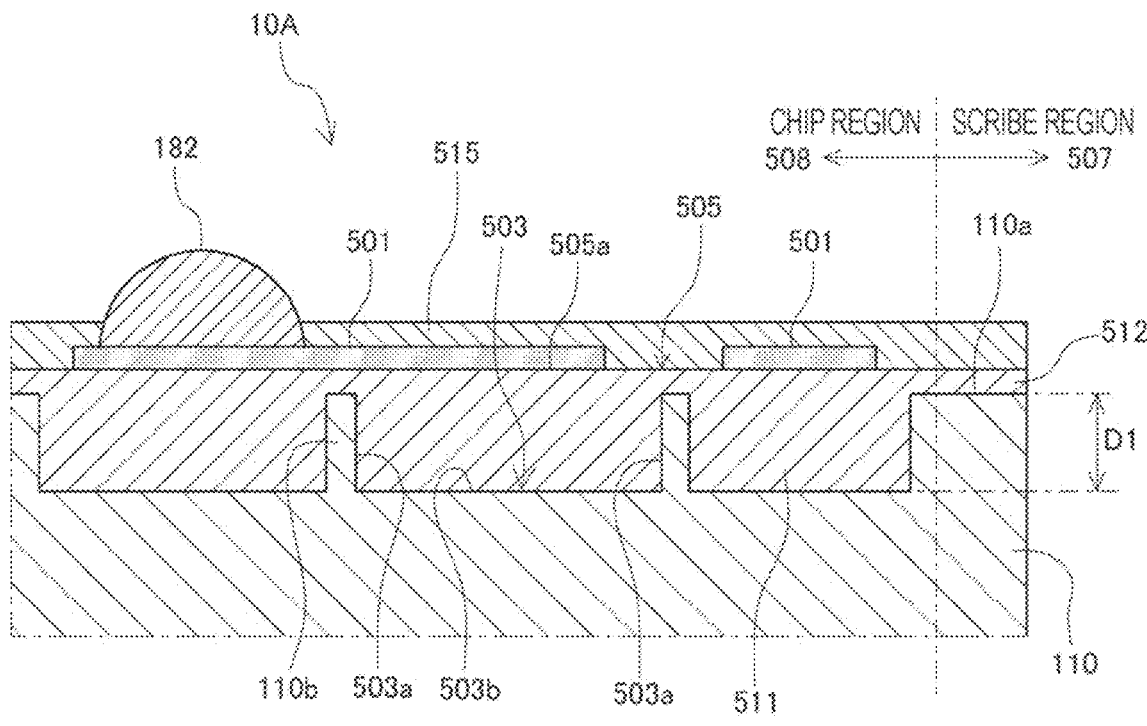
FIG. 21 is a diagram illustrating a configuration example of a semiconductor apparatus according to a seventh embodiment of the present disclosure.

FIG. 21 is a diagram illustrating a configuration example of the semiconductor apparatus according to the seventh embodiment of the present disclosure. As illustrated in FIG. 21, in the semiconductor apparatus 10A according to the present embodiment, a rewiring 501 as a back surface side wiring is provided on the back surface 110*a* side of the semiconductor substrate 110, and a plurality of recess portions 503 is formed on the back surface 110*a* side of the semiconductor substrate 110. Furthermore, the separation region 505 is arranged using an insulating resin so as to fill the recess portion 503 and cover the back surface 110*a* of the semiconductor substrate 110. The rewiring 501 is formed on the separation region 505.

As described above, the semiconductor apparatus 10A includes the rewiring 501 arranged on the back surface side of the semiconductor substrate 110 and the separation region 505 arranged between the semiconductor substrate 110 and the rewiring 501.

As illustrated in FIG. 21, in the semiconductor apparatus 10A, a frame-shaped peripheral edge portion along an outer shape of the semiconductor substrate 110 that is, for example, a rectangular chip is a scribe region 507. The scribe region 507 is a region where a scribe line defining the regularly arrayed and formed chip region 508 is located before the dicing step of dividing the semiconductor substrate 110 is performed. A region inside the scribe region 507 is the chip region 508 (see FIG. 31).

As illustrated in FIG. 21, in the semiconductor substrate 110, a plurality of recess portions 503 is formed in a regular array. The plurality of recess portions 503 is formed at a predetermined depth Dl with respect to the back surface 110*a* of the semiconductor substrate 110. In the example illustrated in FIG. 21, the adjacent recess portions 503 are formed at intervals narrower than the dimension of the recess portion 503 in the width direction (the right and left direction in FIG. 21). Accordingly, a wall portion 110*b* having a width (thickness) smaller than the dimension in the width direction of the recess portion 503 is formed between the adjacent recess portions 503. That is, the adjacent recess portions 503 are defined by the wall portion 110*b*.

In the example illustrated in FIG. 21, the recess portion 503 is formed along a rectangular shape in a cross-sectional view by an inner side surface 503*a* perpendicular to the horizontal back surface 110*a* and a horizontal bottom surface 503*b*, but the shape of the recess portion 503 is not limited. The shape of the recess portion 503 may be, for example, a shape in which the inner side surface 503*a* is inclined with respect to the vertical direction, a shape in which a corner portion formed by the inner side surface 503*a* and the back surface 110*a* is a chamfered curved surface, or the like. Furthermore, the depth of the recess portion 503 is also not limited. The recess portion 503 may be, for example, a hole penetrating the semiconductor substrate 110. Furthermore, the recess portion 503 is formed, for example, in the semiconductor substrate 110 so that the aperture ratio with respect to the back surface 110*a* is 50 to 95%.

Furthermore, regarding the formation portion of the recess portion 503 in the semiconductor substrate 110, a configuration in which the recess portion 503 is formed only in the chip region 508 and the recess portion 503 is not formed in the scribe region 507 is preferably adopted. In the separation region 505, a portion formed by filling the recess portion 503 with the resin material is a portion thicker than other portions. For this reason, in a case where there is a layer thickness portion of the separation region 505 by the recess portion 503 in the scribe region 507, it is difficult to perform cutting processing at the time of dividing the chip depending on the resin material of the separation region 505. Accordingly, a configuration in which the recess portion 503 is not formed in the scribe region 507 is advantageous from the viewpoint of facilitating the cutting processing.

As illustrated in FIG. 21, the separation region 505 includes a recess portion inner region portion 511 which is a portion including resin filled in the recess portion 503, and a surface layer region portion 512 which covers the back surface 110*a* of the semiconductor substrate 110 and is a portion connecting the plurality of recess portion inner region portions 511. The surface layer region portion 512 forms a flat front surface 505*a* in the separation region 505. In the example illustrated in FIG. 21, the recess portion inner region portion 511 is formed by completely filling the recess portion 503 with the material of the separation region 505, but a gap may be formed in the recess portion inner region portion 511. Furthermore, a configuration in which the entire recess portion 503 is hollow, that is, the separation region 505 has only the layer region portion 512 may be adopted.

Examples of the resin material forming the separation region 505 include polyimide resin, acrylic resin, silicone, epoxy resin, and the like. Note that a similar material can be applied to the separation region in other embodiments.

The rewiring 501 is formed on the front surface 505*a* of the separation region 505. The rewiring 501 includes a single conductive film or a plurality of stacked conductive films. The rewiring 501 includes, for example, a metal material such as Cu, Ti, Ta, Al, W, Ni, Ru, or Co. Note that a film including an insulating material may be stacked on the front surface 505*a* of the separation region 505, and the rewiring 501 may be formed on the film.

The rewiring 501 is provided with the connection terminal 182 as an external terminal. On the front surface 505*a* side of the separation region 505, except for the connection portion of the connection terminal 182 to the rewiring 501, a protective film 515 which is a wiring protective film covering the rewiring 501 and the back surface 110*a* is formed.

[Method for Manufacturing Semiconductor Apparatus]

FIGS. 22 and 23 are diagrams illustrating an example of a method for manufacturing the semiconductor apparatus 10A according to the seventh embodiment of the present disclosure.

Figure 22A:
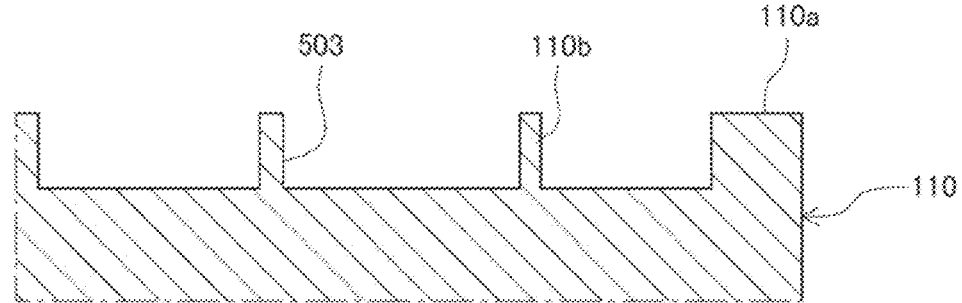
FIGS. 22A-22C are diagrams illustrating an example of a method for manufacturing a semiconductor apparatus according to the seventh embodiment of the present disclosure.

First, as illustrated in FIG. 22A, a step of forming the recess portion 503 on the back surface 110*a* side of the semiconductor substrate 110 is performed. In this step, a resist (not illustrated) corresponding to the formation mode of the recess portion 503 is formed on the back surface 110*a* of the semiconductor substrate 110 by photolithography, and the back surface 110*a* side of the semiconductor substrate 110 is partially removed by etching such as dry etching to form the recess portion 503.

Figure 22B:
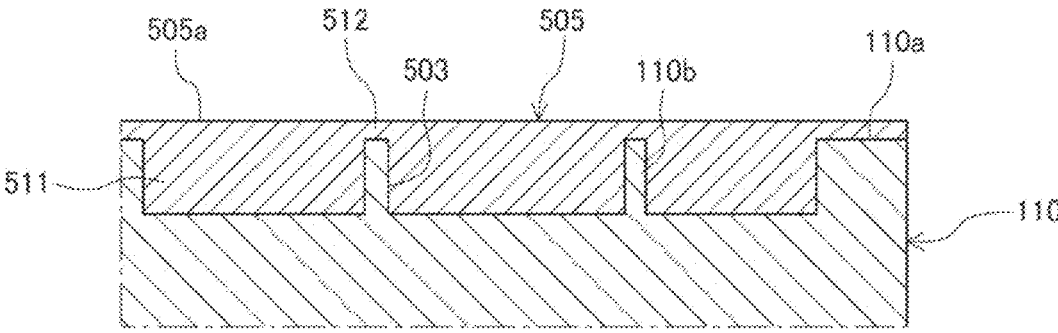

Next, as illustrated in FIG. 22B, a step of forming the separation region 505 is performed. This step corresponds to a separation region arrangement step of arranging the separation region 505 on the back surface side of the semiconductor substrate 110. In this step, a coating method, a lamination method, or the like is used, and a film is formed using an insulating resin which is a material of the separation region 505. In a case where the resin of the material of the separation region 505 is a thermosetting resin, a heat treatment for curing the resin is performed. Here, for example, the annealing treatment may be performed at a temperature higher than the curing temperature of the resin. By this step, the separation region 505 including the recess portion inner region portion 511 and the surface layer region portion 512 is formed.

Note that, since the surface of the resin is more easily planarized than at least the surface of the semiconductor substrate 110, the rewiring 501 is easily formed. Furthermore, in the step of forming the separation region 505, the resin that is the material of the separation region 505 may be completely filled in the recess portion 503 as illustrated in FIG. 22B, or a cavity may be formed in the resin in the recess portion 503.

Figure 22C:
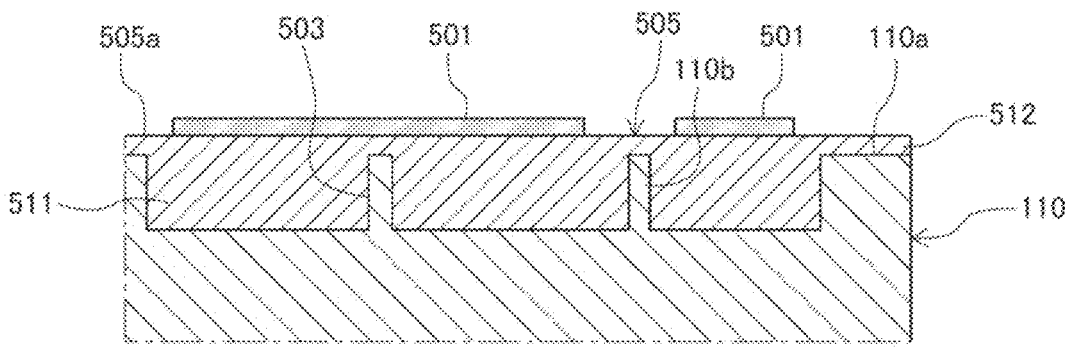

Next, as illustrated in FIG. 22C, a step of forming the rewiring 501 on the front surface 505*a* of the separation region 505 is performed. This step corresponds to a back surface side wiring arrangement step of arranging the rewiring 501 on the back surface side of the semiconductor substrate 110. The rewiring 501 is formed as a stacked film of a barrier layer including Ti and a wiring layer including Cu, for example. For the formation of the rewiring 501, for example, a known method such as a semi-additive method, a subtractive method, or a damascene method is used. Preferably, the rewiring 501 is arranged so as to entirely overlap the recess portion 503 in plan view, but a part of the rewiring 501 may be arranged so as not to overlap the recess portion 503 in plan view.

Figure 23A:
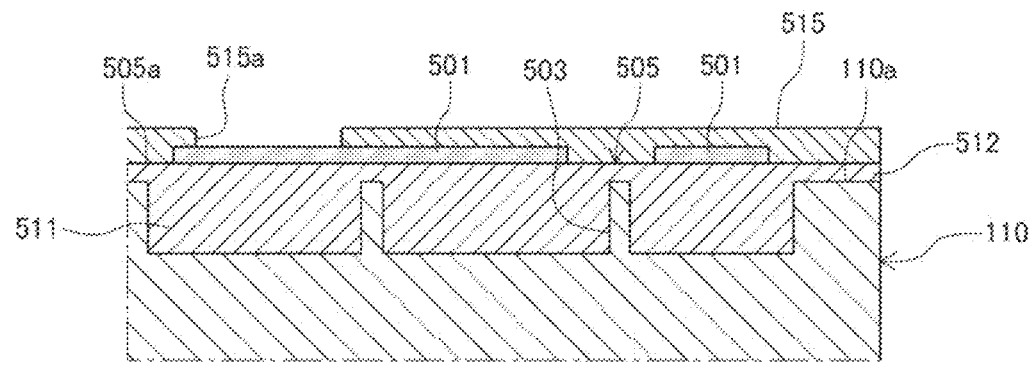
FIGS. 23A and 23B are diagrams illustrating an example of the method for manufacturing a semiconductor apparatus according to the seventh embodiment of the present disclosure.

Next, as illustrated in FIG. 23A, a step of forming the protective film 515 is performed. In this step, for example, first, a coating method or a lamination method is used, and film formation with a photosensitive insulating resin is performed. Then, a region of a formation portion of the connection terminal 182 is opened with respect to the formed film by a lithography method, and the opening 515*a* is formed.

Figure 23B:
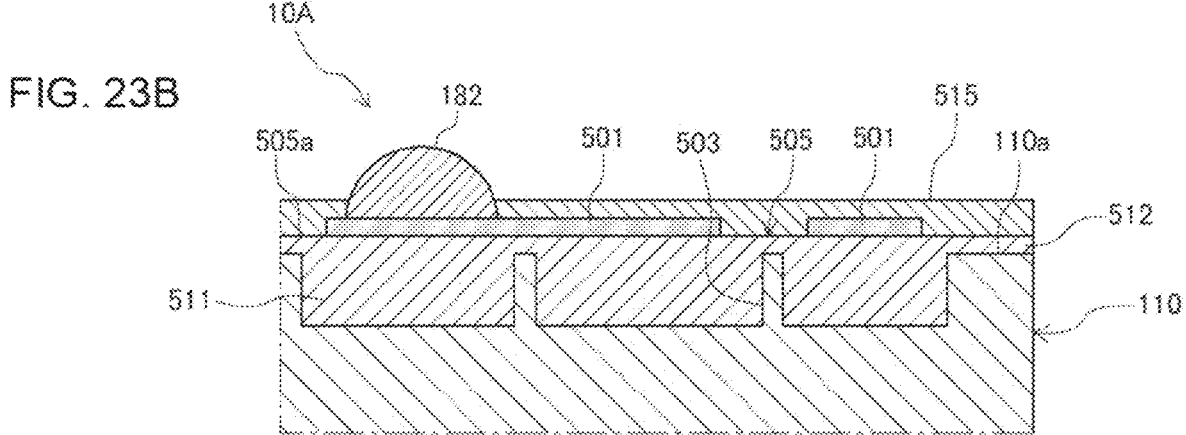

Then, as illustrated in FIG. 23B, the connection terminal 182 is arranged in the opening 515*a* of the protective film 515. The semiconductor apparatus 10A is manufactured by the above method.

The effect of the semiconductor apparatus 10A according to the present embodiment as described above will be described. For example, a semiconductor substrate including Si is excellent in flatness, mechanical strength, and microfabrication performance, but on the other hand, since the semiconductor substrate is not an insulator, there is a problem that a parasitic element is generated between the semiconductor substrate and a rewiring or a through electrode, and signal transmission characteristics are deteriorated. In order to solve such a problem, there have been proposed a conventional method in which a low dielectric constant material is used for a liner film, which is an insulating film arranged between a semiconductor substrate and a rewiring, or the thickness of the liner film is increased (for example, Japanese Patent Application Laid-Open No. 2010-205990), and a conventional method in which the parasitic capacitance is reduced by delving a substrate around a through electrode (for example, Japanese Patent Application Laid-Open No. 2015-153930).

However, according to the former method related to the liner film, since the liner film becomes thick, the chip becomes thicker and the weight also increases accordingly. This is disadvantageous for high integration of the semiconductor apparatus. Furthermore, in a case where the chip becomes thicker, in a case of a configuration having a through electrode, the difficulty of manufacturing the through electrode increases, leading to an increase in cost and a decrease in yield. Furthermore, according to the latter method of delving down the substrate, it is possible to reduce the capacitance around the through electrode, but the capacitance reduction for the rewiring is not considered.

Therefore, the semiconductor apparatus 10A according to the present embodiment has a configuration in which the recess portion 503 is formed in the semiconductor substrate 110, the separation region 505 including an insulating resin is arranged in the recess portion 503 and on the back surface 110a of the semiconductor substrate 110, and the rewiring 501 is provided on the separation region 505. According to such a configuration, parasitic capacitance (capacitance between wiring substrates) between the rewiring 501 and the semiconductor substrate 110 can be reduced without causing an increase in the thickness of the chip or a significant decrease in the mechanical strength of the chip.

Furthermore, by using a material having a specific gravity smaller than that of the semiconductor substrate 110 as the resin material of the separation region 505, it is possible to reduce the weight of the chip. As described above, since it is possible to reduce the thickness and weight of the chip, it is possible to obtain a configuration suitable for high integration.

Furthermore, in the separation region 505, by forming a gap in the recess portion inner region portion 511 which is a portion formed in the recess portion 503, the capacitance between wiring substrates can be effectively reduced.

Furthermore, in the semiconductor apparatus 10A, the rewiring 501 is provided so as to at least partially overlap the recess portion 503 in plan view. According to such a configuration, the capacitance between wiring substrates can be reduced. In particular, in the present embodiment, since the rewiring 501 is provided so as to mostly overlap the recess portion 503 in plan view, the capacitance between wiring substrates can be effectively reduced. The fact that such an effect can be obtained will be described using a result of simulation regarding the capacitance between wiring substrates.

FIG. 24A is a diagram illustrating a configuration used in this simulation and dimensions of each part in the configuration. As illustrated in FIG. 24A, in the present simulation, a configuration is used in which the separation region 505 is formed in a portion including the recess portion 503 of the semiconductor substrate 110, and the rewiring 501 is arranged at a position above the recess portion 503. Furthermore, the rewiring 501 has a thickness of 1.5 μm and a width of 3 μm. Furthermore, each of the vertical dimension and the horizontal dimension of the semiconductor substrate 110 are 20 μm, and the thickness of the surface layer region portion 512 of the separation region 505 is 2 μm.

In this simulation, in the configuration (hereinafter referred to as "present configuration") illustrated in FIG. 24A, the configuration illustrated in FIG. 24B was a comparison target, and a simple calculation was performed on the change in the capacitance between wiring substrates in a case where the dimension of each of a recess portion depth A1, which is the depth of the recess portion 503 with respect to the back surface 110a of the semiconductor substrate 110, and a recess portion width A2, which is the width of the recess portion 503, was changed. In the present configuration, the semiconductor substrate 110 is a silicon substrate, and the separation region 505 includes $SiO_2$.

As illustrated in FIG. 24B, the configuration of the comparison target is a configuration in which the recess portion 503 is not formed in the present configuration. That is, the configuration of the comparison target is a configuration in which the separation region 505 is formed as a single film having a film thickness of 2 μm on the back surface 110a of the semiconductor substrate 110.

FIG. 25 illustrates a result of this simulation. In the table illustrated in FIG. 25, the case A in which both the recess portion depth A1 and the recess portion width A2 are 0 μm is the configuration of the comparison target. In the cases B to E, the amount of decrease in the capacitance between wiring substrates with respect to the case A in a case where the values of the recess portion depth A1 and the recess portion width A2 in the present configuration are changed is indicated by a difference (%).

From the results of this simulation, it can be seen that the capacitance between wiring substrates is reduced by positioning the recess portion 503 below the rewiring 501. Furthermore, it can be seen that the capacitance between wiring substrates decreases as the values of the recess portion depth A1 and the recess portion width A2 increase. In particular, it can be seen that the capacitance between wiring substrates can be effectively reduced by increasing the value of the recess portion width A2. Accordingly, it can be said that it is preferable to make the width of the recess portion 503 (recess portion width A2) larger than the width of the rewiring 501 in order to obtain the effect of reducing the capacitance between wiring substrates.

Therefore, regarding the relationship between the rewiring 501 and the recess portion 503, it is preferable that 50% or more of the formation region of the rewiring 501 overlaps the recess portion 503 in plan view. Furthermore, a configuration in which 100% of the formation region of the rewiring 501 overlaps the recess portion 503 in plan view is more preferable. Furthermore, it is more preferable that 100% of the formation region of the rewiring 501 overlaps the recess portion 503 in plan view, the formation region of the recess portion 503 is wider than the formation region of the rewiring 501, and the formation region of the recess portion 503 protrudes from the formation region of the rewiring 501.

[Modification]

Figure 26A:
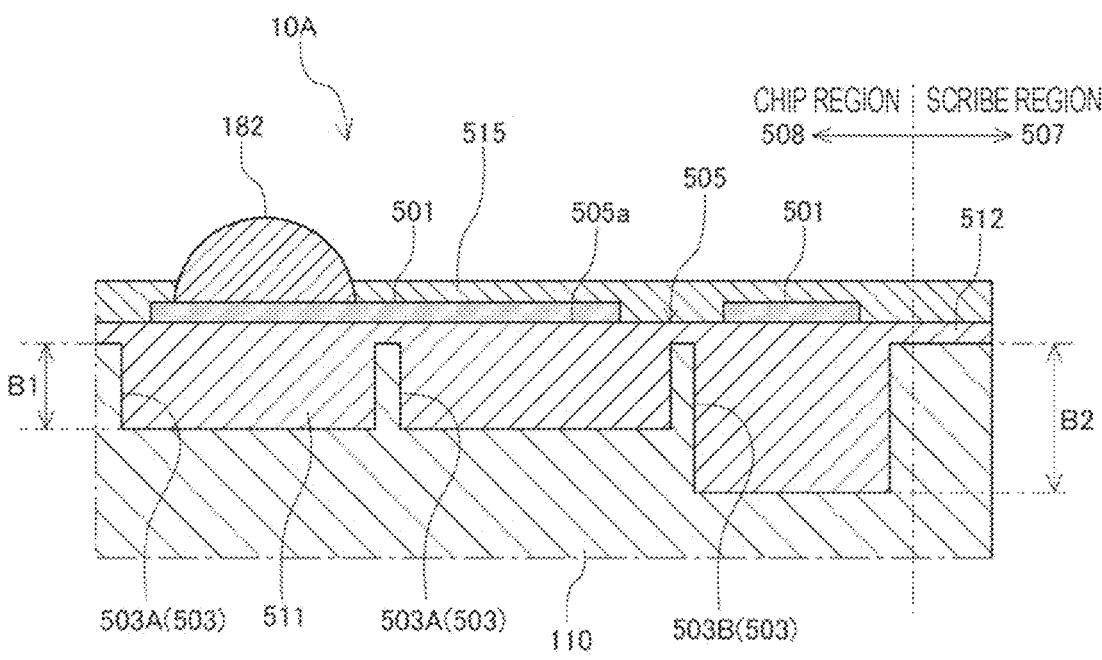
FIGS. 26A and 26B are diagrams illustrating a modification of a configuration of a semiconductor apparatus according to the seventh embodiment of the present disclosure.

A modification of the semiconductor apparatus 10A according to the seventh embodiment of the present disclosure will be described. As illustrated in FIG. 26A, in the configuration of Modification 1, the depth (recess portion depth) of the recess portion 503 of the semiconductor substrate 110 differs depending on the location. That is, a plurality of types of recess portions 503 having different depths is formed as the recess portion 503.

In the example illustrated in FIG. 26A, two types of recess portions 503, that is, a first recess portion 503A having a relatively shallow depth and a second recess portion 503B having a relatively deep depth are formed. The first recess portion 503A has a recess portion depth of a first depth B1, and the second recess portion 503B has a recess portion depth of a second depth B2 that is deeper than the first depth B1.

According to such a configuration, the depth of the recess portion 503 can be changed according to the use, function, and the like of the rewiring 501 located above the recess portion 503. For example, the recess portion depth can be made relatively deep for the recess portion 503 formed below the rewiring 501 for signal transmission for which relatively high signal transmission performance is required, and the recess portion depth can be made relatively shallow for the recess portion 503 formed below the rewiring 501 used for power supply wiring that does not particularly require high signal transmission performance. As a result, it is possible to effectively reduce the capacitance between wiring substrates with respect to the rewiring 501 for improving the signal transmission performance while maintaining the mechanical strength of the semiconductor substrate 110. Note that, from the viewpoint of securing the strength of the semiconductor substrate 110, the recess portion depth of the recess portion 503 is preferably set such that a thickness of at least 2 μm is secured for a portion forming the bottom portion of the recess portion 503 on the front surface side of the semiconductor substrate 110.

Figure 26B:
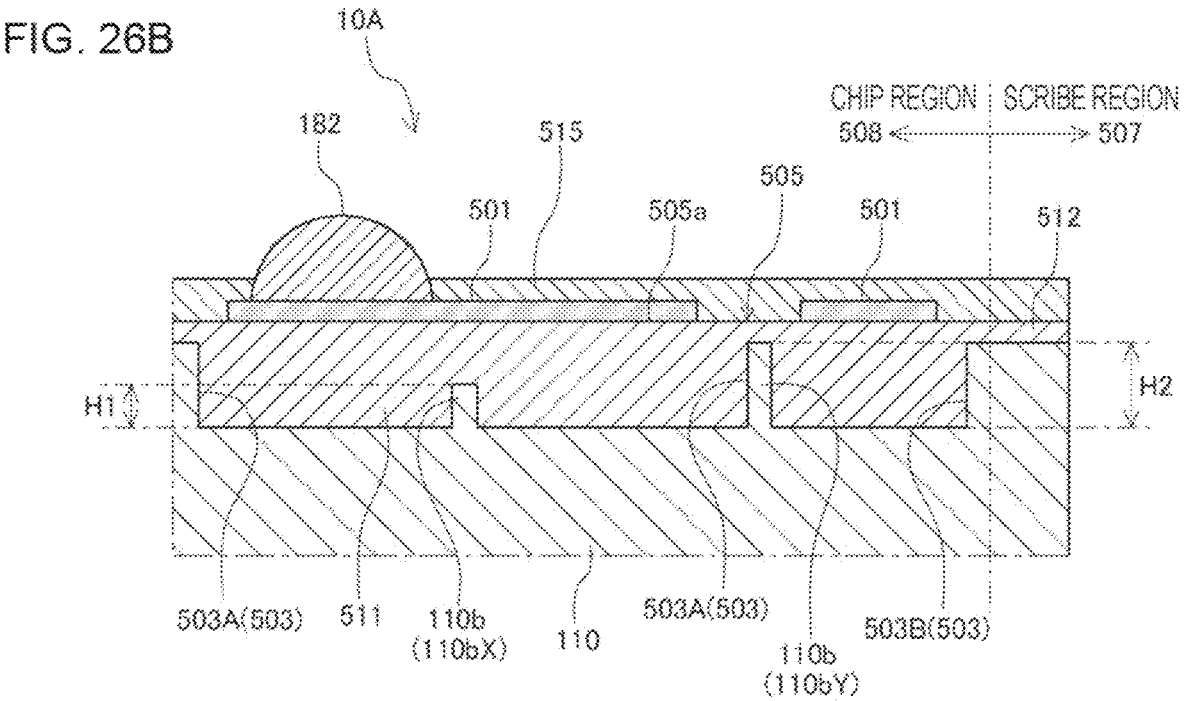

Furthermore, as illustrated in FIG. 26B, in the configuration of Modification 2, the height of the wall portion 110b of the semiconductor substrate 110 differs depending on the location. Specifically, in the semiconductor substrate 110, a height H1 of a wall portion 110bX located below the rewiring 501 is lower than a height H2 of a wall portion 110bY located in a region other than the formation region of the rewiring 501. Note that the height of the wall portion 110b is the height of the recess portion 503 with respect to the bottom surface 503b.

According to such a configuration, the distance between the rewiring 501 and the semiconductor substrate 110 can be increased, and the formation region of the separation region 505 can be widened by the decrease in the wall portion 110b. As a result, the capacitance between wiring substrates can be effectively reduced.

8. Eighth Embodiment

A semiconductor apparatus 10B of an eighth embodiment of the present disclosure is different from the semiconductor apparatus 10A of the seventh embodiment mainly in that the through via 520 is provided.

[Configuration of Semiconductor Apparatus]

Figure 27:
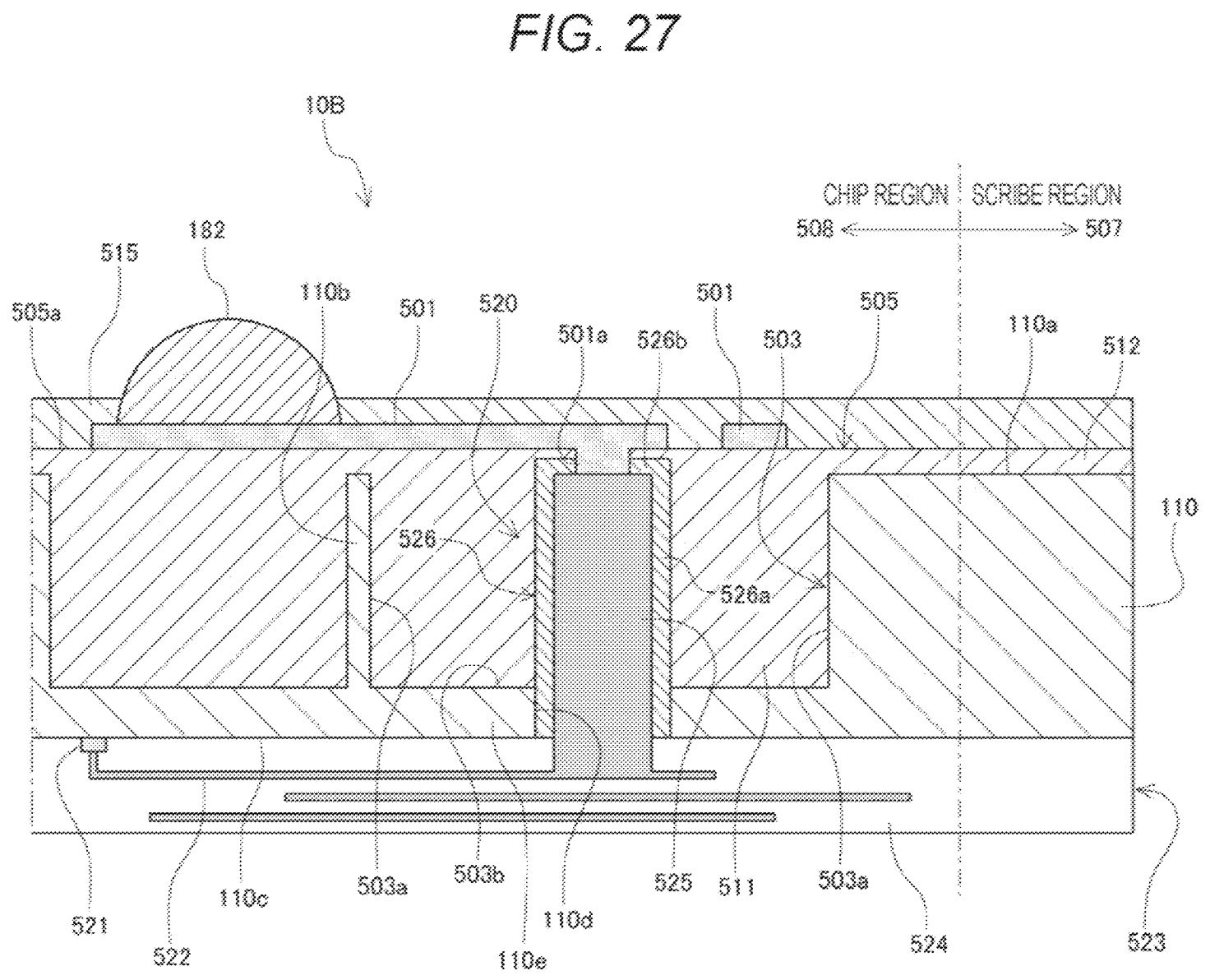

FIG. 27 is a cross-sectional view representing a configuration example of the semiconductor apparatus according to the eighth embodiment of the present disclosure. As illustrated in FIG. 27, the semiconductor apparatus 10B according to the present embodiment includes a semiconductor substrate 110 in which a semiconductor element 521 and a front surface side wiring 522 connected to the semiconductor element 521 are arranged on a front surface 110c side, a rewiring 501 arranged on a back surface 110a side of the semiconductor substrate 110, and a separation region 505 arranged between the semiconductor substrate 110 and the rewiring 501. The front surface side wiring 522 is arranged in a wiring layer 523 as a wiring region formed on the back surface 110a side of the semiconductor substrate 110.

Then, the semiconductor apparatus 10B includes: a through electrode 525 as a through wiring that is arranged in a through hole formed in the semiconductor substrate 110 and connects the front surface side wiring 522 and the rewiring 501; and a liner film 526 that includes an insulating material, covers at least a part of the through electrode 525, and is interposed between the through electrode 525 and the separation region 505. As described above, the semiconductor apparatus 10B according to the present embodiment has the wiring layer 523 formed on the front surface side of the semiconductor substrate 110, the rewiring 501 formed on the back surface side of the semiconductor substrate 110, and the through electrode 525 that connects the wiring layer 523 on the front surface side and the rewiring 501 on the back surface side.

In the present embodiment, the through electrode 525 is formed from the front surface 110c side with respect to the semiconductor substrate 110, that is, from the wiring layer 523 side. As a result, the semiconductor apparatus 10B has a so-called via middle structure with respect to the through via 520.

The type of the semiconductor element 521 provided on the front surface side of the semiconductor substrate 110 is not limited. The semiconductor element 521 is, for example, a circuit element that performs signal processing, a photoelectric conversion element such as a memory or an image sensor, or the like.

The wiring layer 523 includes an insulating film 524 and a front surface side wiring 522 that transmits a signal of an element included in the above-described processing circuit or the like. The wiring layer 523 is a layer having a stacked structure including a plurality of 522 stacked with an insulating film 524 interposed therebetween. The insulating film 524 is, for example, a $SiO_2$ film, a SiN film, a SiOC film, a SiCN film, a Low-k film, or the like. The front surface side wiring 522 includes a metal material such as Cu or Ti similarly to the rewiring 501. Note that the wiring layer 523 is not limited to a stacked wiring layer, and may be a wiring layer having a single-layer structure.

The through electrode 525 is a wiring portion formed in a columnar shape with the thickness direction of the semiconductor substrate 110 as a longitudinal direction. The through electrode 525 is provided in a state of penetrating through a through hole 110d formed in the semiconductor substrate 110. One end side of the through electrode 525, which is the front surface 110c side of the semiconductor substrate 110, protrudes from the front surface 110c and is electrically connected to the front surface side wiring 522. In the through electrode 525, the other end side which is the back surface 110a side of the semiconductor substrate 110 is located on substantially the same horizontal plane as the back surface 110a. The through electrode 525 includes a similar material to that of the front surface side wiring 522. However, the through electrode 525 may include a material different from that of the front surface side wiring 522.

In the example illustrated in FIG. 27, in the semiconductor substrate 110, a through hole 110d for arranging the through electrode 525 is formed at a formation portion of the recess portion 503. That is, the through hole 110d opens facing the front surface 110c of the semiconductor substrate 110, opens facing the bottom surface 503b of the recess portion 503, and penetrates a bottom portion 110e of the recess portion 503 forming the bottom surface 503b. Accordingly, the through electrode 525 is formed in a manner of protruding from the bottom surface 503b into the recess portion 503. Therefore, the recess portion inner region portion 511 of the separation region 505 exists in the periphery of the through electrode 525 via the liner film 526. Note that, in the semiconductor substrate 110, the through hole 110d through which the through electrode 525 passes may be formed in a portion other than the formation portion of the recess portion 503.

The liner film 526 includes, for example, an insulating film such as a $SiO_2$ film. The liner film 526 covers substantially the entire portion of the through electrode 525 other than the portion protruding from the front surface 110c of the semiconductor substrate 110. The liner film 526 has a side surface portion 526*a* covering the outer circumferential side surface of the through electrode 525 and an end surface portion 526*b* covering the end surface of the through electrode 525 on the rewiring 501 side.

Furthermore, in the semiconductor apparatus 10B of the present embodiment, as similar to the semiconductor apparatus 10A of the seventh embodiment, the separation region 505 that fills the recess portion 503 of the semiconductor substrate 110 and covers the wall portion 110*b* is formed, the rewiring 501 is formed on the separation region 505, and the connection terminal 182 and the protective film 515 are formed. In the present embodiment, in the rewiring 501 electrically connected to the through electrode 525, a wiring connection portion 501*a* that penetrates a portion of the separation region 505 on the front surface 505*a* side and the end surface portion 526*b* of the liner film 526 and is connected to the end surface portion of the through electrode 525 is formed.

Furthermore, in the present embodiment, with respect to the depth of the recess portion 503, it is preferable that the depth is set such that a thickness of at least 2 µm is secured for the bottom portion 110*e* of the semiconductor substrate 110. This is based on the viewpoint of securing the strength of the semiconductor substrate 110 and the viewpoint of avoiding the characteristic change of the semiconductor element 521 due to the influence of the stress accompanying the deformation of the semiconductor substrate 110.

[Method for Manufacturing Semiconductor Apparatus]

FIGS. 28 and 29 are diagrams illustrating an example of a method for manufacturing the semiconductor apparatus 10B according to the eighth embodiment of the present disclosure. In this example, as a process of forming the through via 520, a via middle method which is an existing technology is used.

First, as illustrated in FIG. 28A, the through electrode 525 and the wiring layer 523 are formed on a semiconductor substrate 110X to be the semiconductor substrate 110. That is, after the semiconductor element 521 is formed on the front surface 110*c* side of the semiconductor substrate 110X, the via hole 110*f* is formed on the semiconductor substrate 110X by etching or the like from the front surface 110*c* side, and the through electrode 525 is formed after the liner film 526 is formed in the via hole 110*f*. Thereafter, the wiring layer 523 is formed on the front surface 110*c* side of the semiconductor substrate 110X so that the front surface side wiring 522 is connected to the through electrode 525.

Next, as illustrated in FIG. 28B, the semiconductor substrate 110X is ground from a back surface 110*g* side so that the through electrode 525 is not exposed, and thereby, the semiconductor substrate 110X is thinned. Thereafter, the semiconductor substrate 110X is further thinned by dry etching or wet etching so as to obtain a selection ratio with respect to the liner film 526. As a result, a structure in which the end portion of the through electrode 525 covered with the liner film 526 is exposed from the back surface 110*a* of the semiconductor substrate 110 is obtained.

In this step, from the viewpoint of securing the strength of the semiconductor substrate 110, it is preferable to thin the semiconductor substrate 110X so that the thickness of the semiconductor substrate 110 is about 10 to 300 µm. Furthermore, the protrusion amount of the through electrode 525 from the back surface 110*a* of the semiconductor substrate 110 is preferably about 0.3 to 10 µm so as not to hinder the next step.

Next, as illustrated in FIG. 28C, a step of forming the recess portion 503 on the back surface 110*a* side of the semiconductor substrate 110 by photolithography and dry etching is performed. Here, by etching the semiconductor substrate 110 so as to obtain a selection ratio with the liner film 526 of the through electrode 525, the recess portion 503 can be formed in the periphery of the through electrode 525 without exposing the through electrode 525.

Next, as illustrated in FIG. 28D, a step of forming the separation region 505 is performed similarly to the case of the seventh embodiment.

Figures 29A, 29B, 29C:
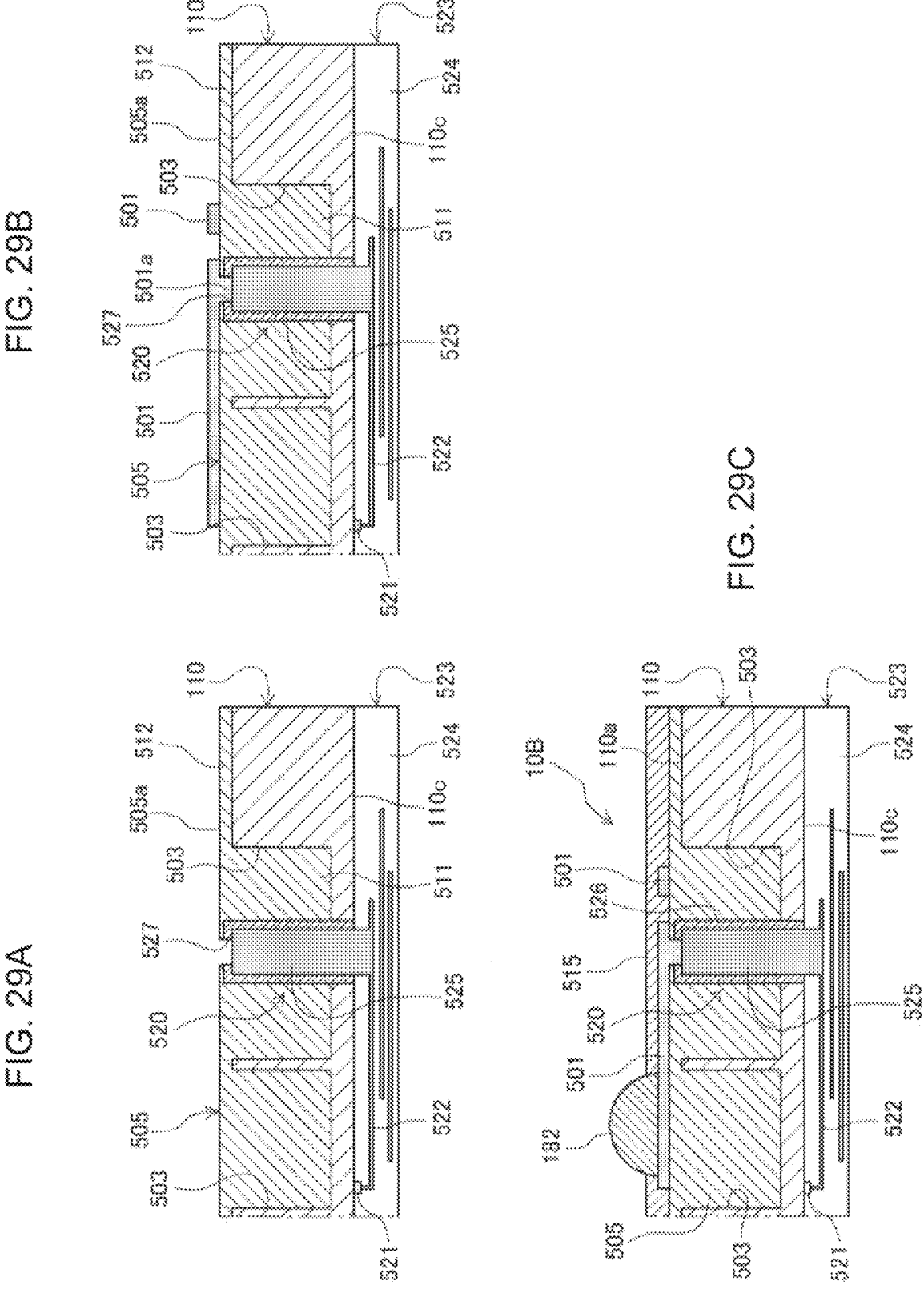
FIGS. 29A-29C are diagrams illustrating an example of the method for manufacturing a semiconductor apparatus according to the eighth embodiment of the present disclosure.

Subsequently, as illustrated in FIG. 29A, an opening 527 for connecting the rewiring 501 is formed above the through electrode 525 by photolithography and dry etching. The opening 527 is formed with respect to the separation region 505 and the liner film 526 located above the through electrode 525 from the front surface 505*a* side of the separation region 505. The opening 527 is formed within the range of the end surface of the through electrode 525 in plan view.

Next, as illustrated in FIG. 29B, a step of forming the rewiring 501 on the front surface 505*a* of the separation region 505 is performed in a similar manner to the seventh embodiment. Here, the rewiring 501 (wiring connection portion 501*a*) is also formed in the opening 527 formed on the through electrode 525, and conduction between the through electrode 525 and the rewiring 501 is achieved.

Then, as illustrated in FIG. 29C, the protective film 515 and the connection terminal 182 are formed similarly to the case of the seventh embodiment. The semiconductor apparatus 10B is manufactured by the above method.

According to the semiconductor apparatus 10B of the present embodiment as described above, in the configuration including the through electrode 525 that connects the front surface side wiring 522 on the front surface 110*c* side of the semiconductor substrate 110 and the rewiring 501 on the back surface 110*a* side, it is possible to obtain the effect of reducing the capacitance between wiring substrates by arranging the separation region 505 in the recess portion 503 and on the back surface 110*a* of the semiconductor substrate 110. Furthermore, in the configuration in which the semiconductor element 521 is formed on the front surface 110*c* side of the semiconductor substrate 110, the effect of reducing the capacitance between wiring substrates can be obtained without deteriorating the characteristics of the semiconductor element 521. Furthermore, it is not necessary to consider the density difference of the through vias 520 when the separation region 505 is formed.

Furthermore, in the semiconductor apparatus 10B of the present embodiment, the recess portion 503 of the semiconductor substrate 110 is formed in the periphery of the through electrode 525. That is, the through via 520 is formed in the recess portion 503. According to such a configuration, not only the parasitic capacitance with the rewiring 501 but also the parasitic capacitance between the through electrode 525 and the semiconductor substrate 110 can be reduced.

9. Ninth Embodiment

A semiconductor apparatus 10C of a ninth embodiment of the present disclosure is different from the semiconductor apparatus 10B of the eighth embodiment in the configuration of the through via 520.

[Configuration of Semiconductor Apparatus]

Figure 30:
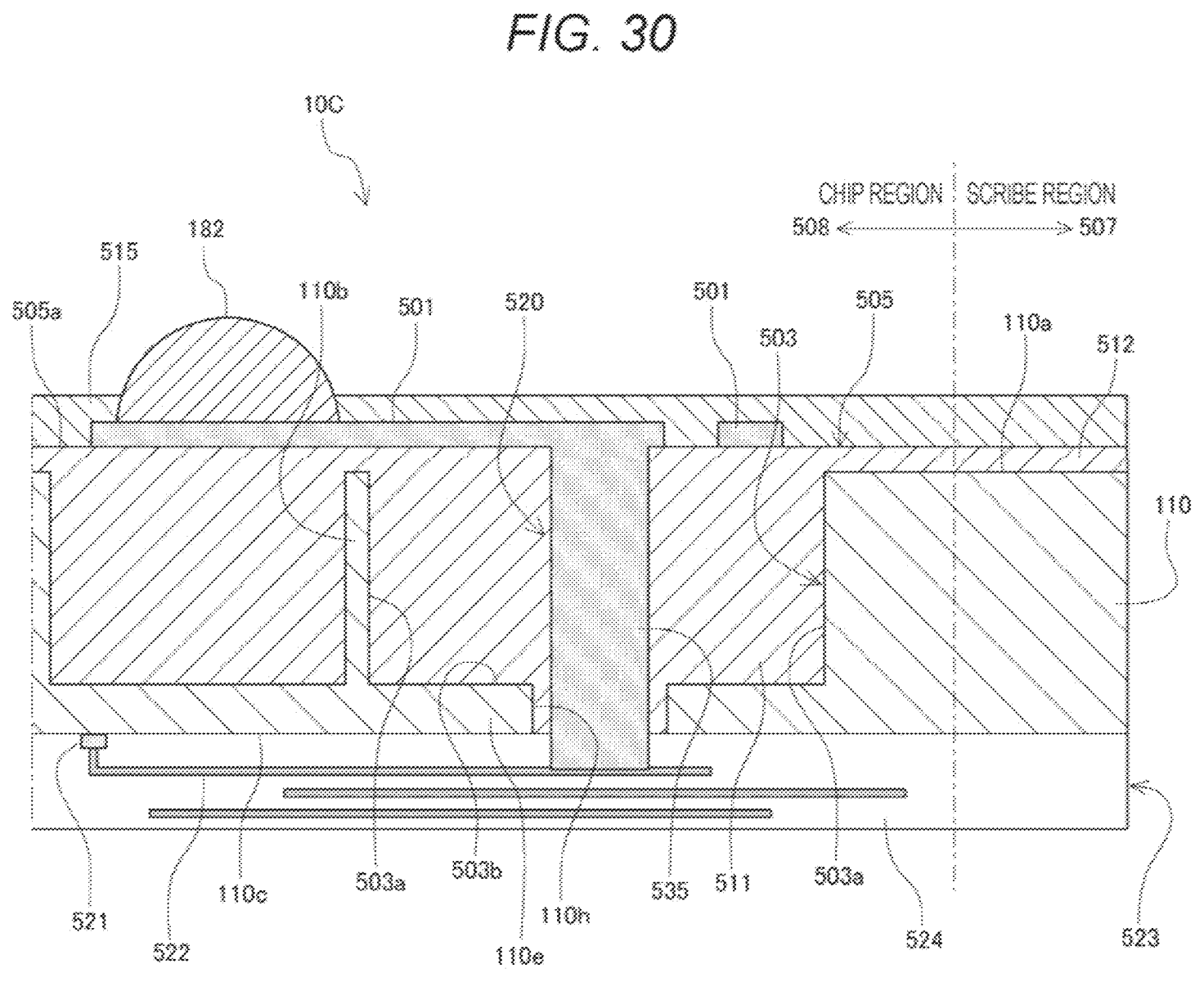

FIG. 30 is a cross-sectional view representing a configuration example of the semiconductor apparatus according to the ninth embodiment of the present disclosure. As illustrated in FIG. 27, in the semiconductor apparatus 10C according to the present embodiment, a through electrode 535 constituting the through via 520 is formed from the back surface 110*a* side of the semiconductor substrate 110. Furthermore, the through electrode 535 includes the same material as that of the rewiring 501. As described above, the semiconductor apparatus 10C has a so-called via last structure with respect to the through via 520.

Furthermore, the through via 520 according to the present embodiment does not have the liner film 526 according to the eighth embodiment, and the through electrode 535 is directly covered with the recess portion inner region portion 511 of the separation region 505 in the recess portion 503. In other words, the liner film 526 includes the same material as that of the separation region 505.

Figure 31:
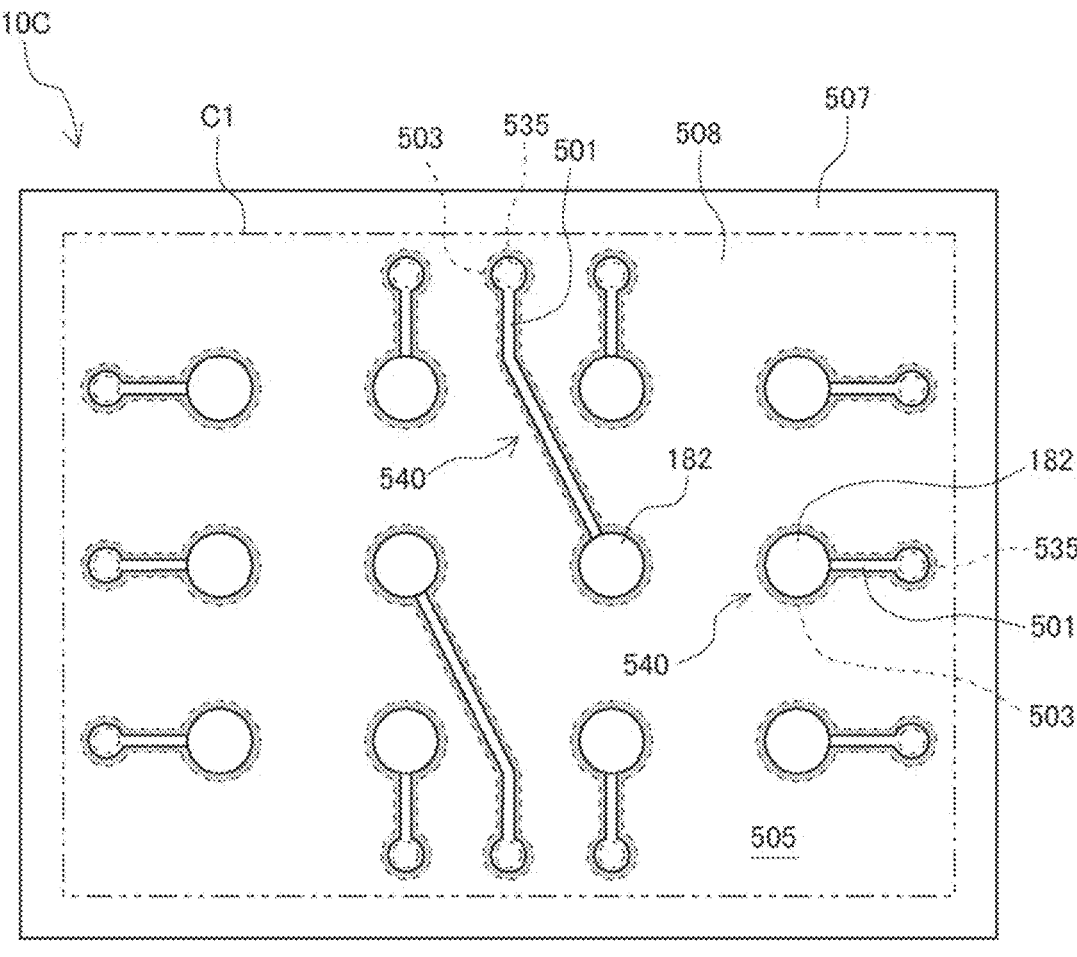
FIG. 31 is a plan view illustrating a configuration example of the semiconductor apparatus according to the ninth embodiment of the present disclosure.

FIG. 31 illustrates a layout of each component in the semiconductor apparatus 10C of the present embodiment in plan view. Note that, in FIG. 31, illustration of the protective film 515 is omitted, and a formation portion of the recess portion 503 is illustrated as a thin black portion for convenience. Furthermore, a two-dot chain line Cl indicates a boundary between the scribe region 507 and the chip region 508.

As illustrated in FIG. 31, the through electrode 535 and the connection terminal 182 are connected by the rewiring 501. Depending on the positional relationship between the through electrode 535 and the connection terminal 182, the shape of the rewiring 501 connecting them is appropriately different. Furthermore, on the lower side of the rewiring 501 and the connection terminal 182, a recess portion 503 is formed in a range larger than the width or outer diameter thereof. Furthermore, the through electrode 535 is formed in the recess portion 503, and the periphery of the through electrode 535 is surrounded by the separation region 505 (see FIG. 30).

In the example illustrated in FIG. 31, in plan view, the formation range of the recess portion 503 protrudes from the formation ranges of the connection terminal 182 and the rewiring 501 in a shape that borders the outer shapes of the connection terminal 182 and the rewiring 501. Note that, in the example illustrated in FIG. 31, regarding a wiring connection structure 540 of a combination of the connection terminal 182, the through electrode 535, and the rewiring 501 for connecting the connection terminal 182 and the through electrode 535, the recess portion 503 is formed for all the wiring connection structures 540, but the recess portion 503 may be formed for some of the wiring connection structures 540.

[Method for Manufacturing Semiconductor Apparatus]

FIGS. 32 and 33 are diagrams illustrating an example of a method for manufacturing the semiconductor apparatus 10C according to the ninth embodiment of the present disclosure.

Figure 32A:
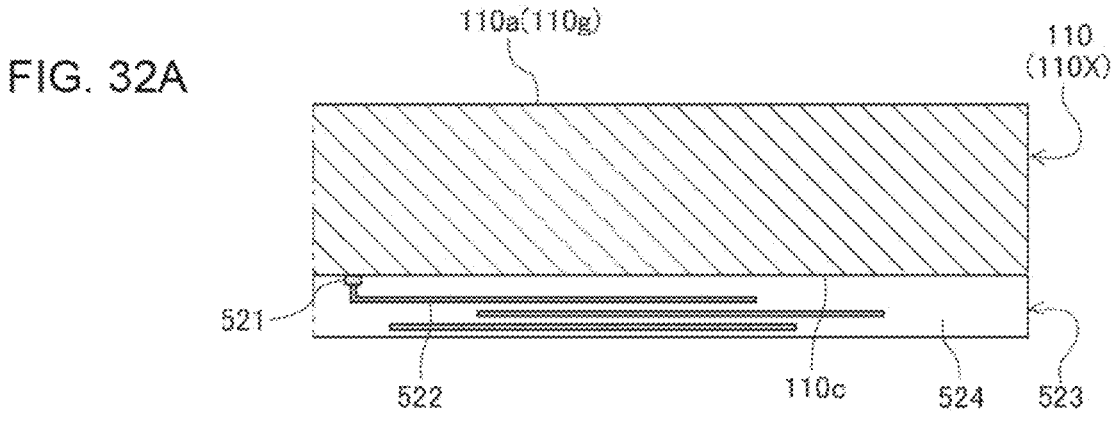
FIGS. 32A-32C are diagrams illustrating an example of the method for manufacturing a semiconductor apparatus according to the ninth embodiment of the present disclosure.

First, as illustrated in FIG. 32A, the semiconductor element 521 and the wiring layer 523 are formed on a semiconductor substrate 110X to be the semiconductor substrate 110. Thereafter, the semiconductor substrate 110X is thinned by grinding, dry etching, or wet etching from the back surface 110*g* side. Here, from the viewpoint of securing the strength of the semiconductor substrate 110, the semiconductor substrate 110 preferably has a thickness of about 10 to 300 µm.

Figure 32B:
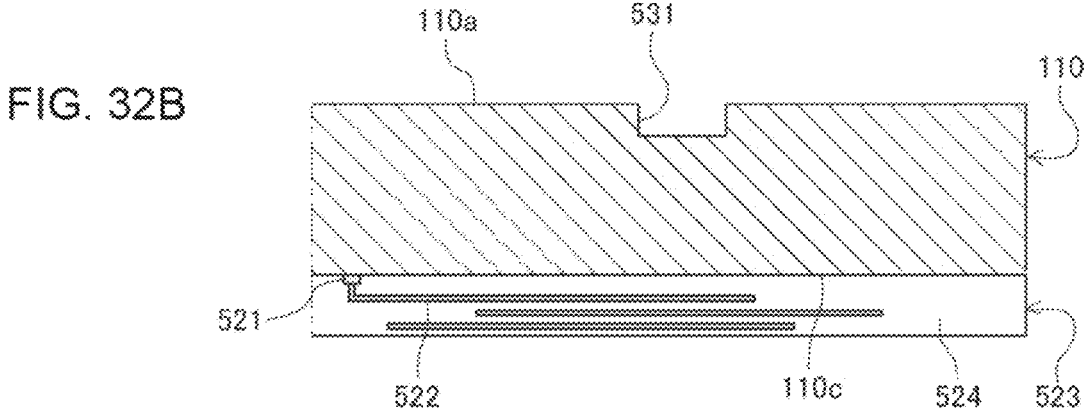

Next, as illustrated in FIG. 32B, a step of forming a first recess portion 531 on the back surface 110*a* side of the semiconductor substrate 110 by photolithography and dry etching is performed. The first recess portion 531 is formed at a predetermined depth at a formation portion of the through electrode 535 so as to partially cut off the semiconductor substrate 110 in the thickness direction. For example, the first recess portion 531 is formed with an inner diameter larger than the outer shape of the through electrode 535 so as to have a circular shape in plan view.

Figure 32C:
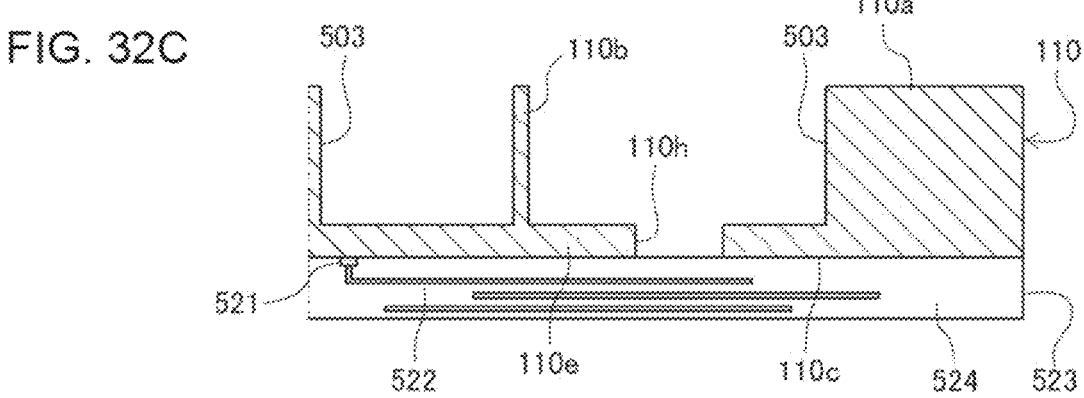

Next, as illustrated in FIG. 32C, a step of forming the recess portion 503 on the back surface 110*a* side of the semiconductor substrate 110 by photolithography and dry etching is performed. Here, the recess portion 503 is formed such that the formation portion of the first recess portion 531 is included in the formation range of the recess portion 503.

In the step of forming the recess portion 503, the processing amount of the semiconductor substrate 110, that is, the depth of the recess portion 503 is adjusted such that the formation portion of the first recess portion 531 penetrates the semiconductor substrate 110. With respect to the depth of the recess portion 503, as described above, it is preferable that the depth is set such that a thickness of at least 2 µm is secured for the bottom portion 110*e* of the semiconductor substrate 110. Through this step, a through hole 110*h* for exposing the insulating film 524 of the wiring layer 523 is formed at a position corresponding to the formation portion of the first recess portion 531 in the bottom portion 110*e* of the semiconductor substrate 110.

Figure 33A:
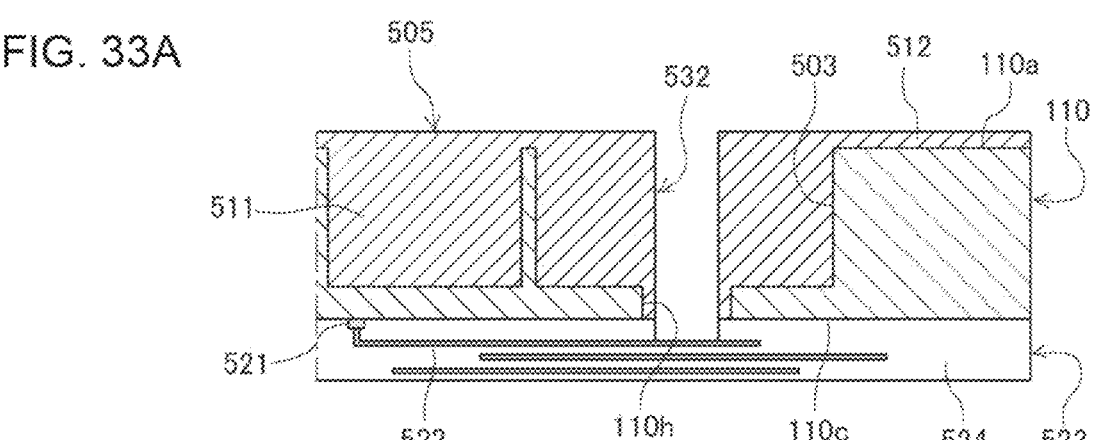
FIGS. 33A-33C are diagrams illustrating an example of the method for manufacturing a semiconductor apparatus according to the ninth embodiment of the present disclosure.

Subsequently, as illustrated in FIG. 33A, in a similar manner to that in the seventh embodiment, after the separation region 505 is formed, a hole portion 532 for forming the through electrode 535 is formed. Here, the separation region 505 is also formed in the through hole 110*h*.

The hole portion 532 is formed at a position corresponding to a formation portion of the through hole 110*h*. The hole portion 532 penetrates the separation region 505 and is formed as a portion obtained by removing a portion of the insulating film 524 on the semiconductor substrate 110 side. The hole portion 532 is formed such that the portion of the separation region 505 remains on the inner circumferential side of the through hole 110*h*. As a method of processing the hole portion 532, for example, dry etching can be adopted. Furthermore, in a case where a photosensitive material is used as the material of the separation region 505 and the material of the insulating film 524, photolithography can be selected as processing of these materials.

Figure 33B:
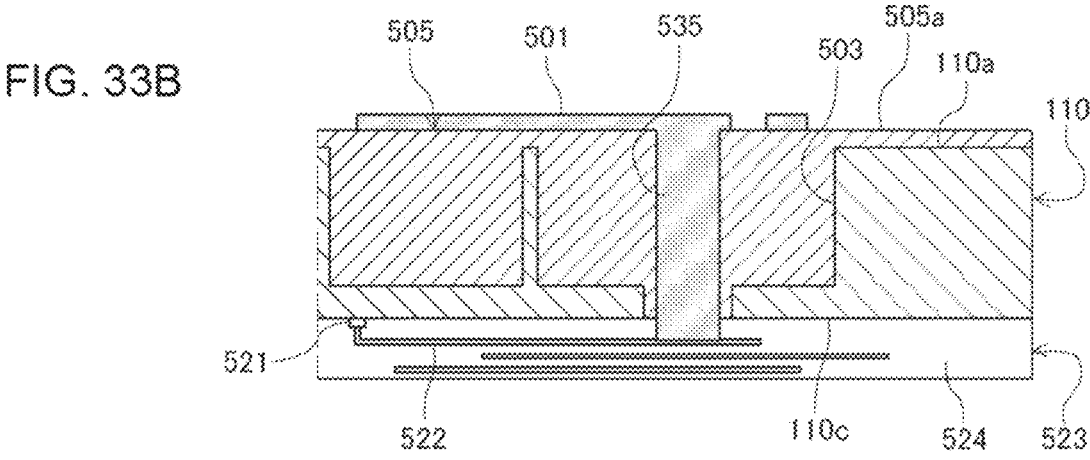

Next, as illustrated in FIG. 33B, a step of forming the rewiring 501 on the front surface 505*a* of the separation region 505 is performed in a similar manner to the seventh embodiment. Here, the through electrode 535 is formed in the hole portion 532, and conduction between the front surface side wiring 522 and the rewiring 501 is achieved.

As described above, in the present embodiment, the back surface side wiring arrangement step of arranging the rewiring 501 on the back surface 110*a* side of the semiconductor substrate 110 and the through wiring arrangement step of arranging the through electrode 535 that connect the front surface side wiring 522 and the rewiring 501 to each other are simultaneously performed (as one step).

Figure 33C:
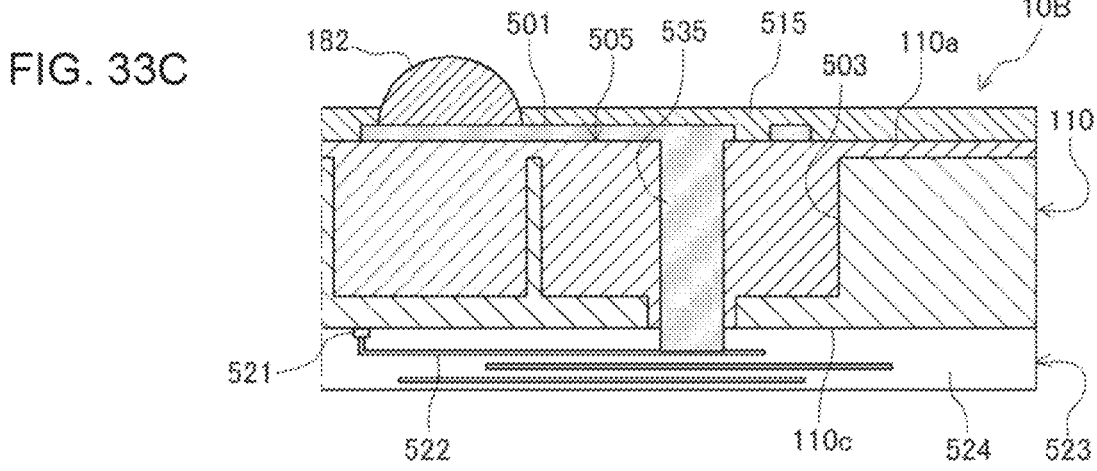

Then, as illustrated in FIG. 33C, the protective film 515 and the connection terminal 182 are formed similarly to the case of the seventh embodiment. The semiconductor apparatus 10C is manufactured by the above method.

According to the semiconductor apparatus 10C of the present embodiment as described above, effects similar to those of the semiconductor apparatus 10B according to the eighth embodiment can be obtained, and the configuration of the through via 520 can be simplified as compared with the semiconductor apparatus 10B. This makes it possible to reduce the number of steps in the manufacturing process.

10. Tenth Embodiment

A semiconductor apparatus 10D of a tenth embodiment of the present disclosure is different from the semiconductor apparatus 10C of the ninth embodiment in a formation mode of the recess portion 503 in plan view.

Figure 34:
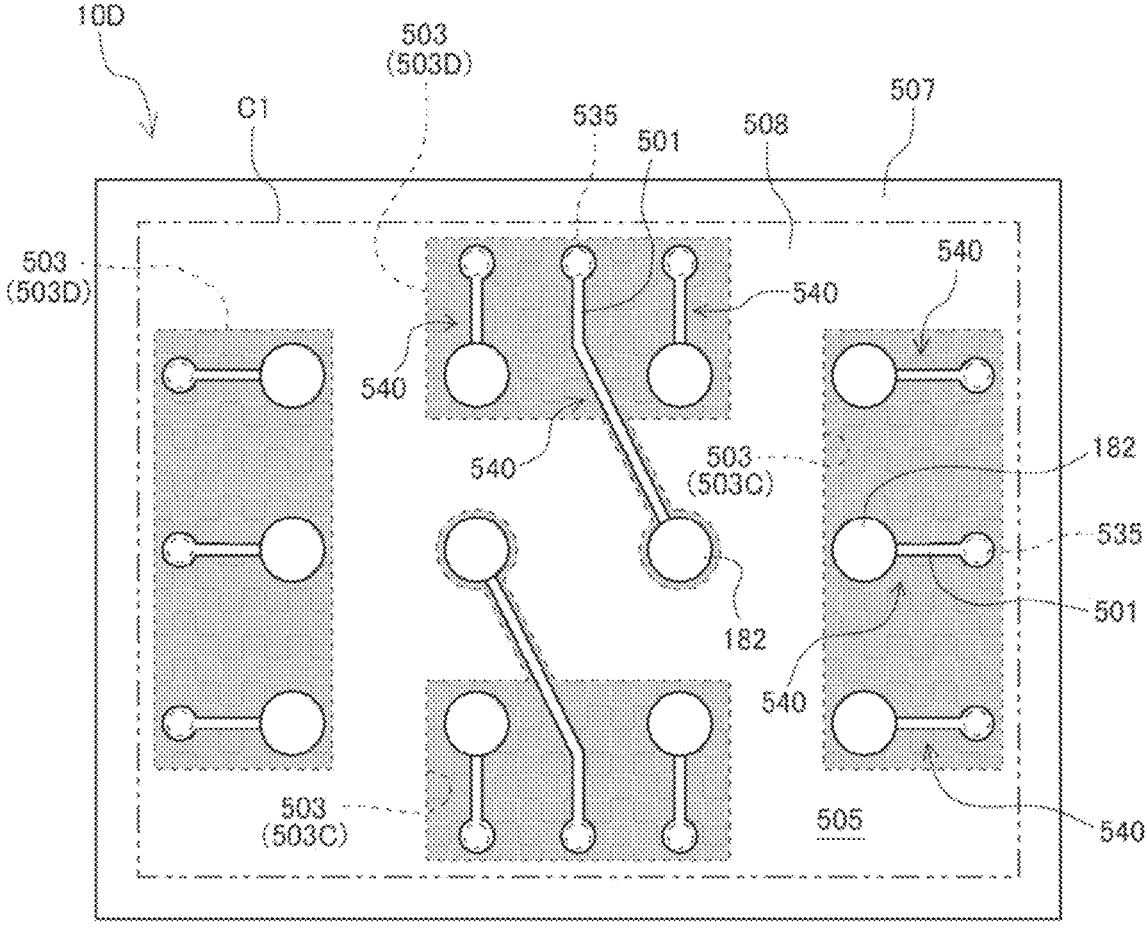
FIG. 34 is a plan view illustrating a configuration example of the semiconductor apparatus according to a tenth embodiment of the present disclosure.

FIG. 34 illustrates a layout of each component in the semiconductor apparatus 10D of the present embodiment in plan view. Note that, in FIG. 34, as similar to FIG. 31, illustration of the protective film 515 is omitted, and a formation portion of the recess portion 503 is illustrated as a thin black portion.

As illustrated in FIG. 34, in the semiconductor apparatus 10D of the present embodiment, the recess portion 503 is formed so as to overlap the plurality of rewirings 501 in plan view. In the semiconductor apparatus 10D, a plurality of wiring connection structures 540 including the rewiring 501 is arranged in one recess portion 503.

In the example illustrated in FIG. 34, as the recess portion 503, a recess portion 503C including three wiring connection structures 540 in a rectangular formation range in plan view and a recess portion 503D including two wiring connection structures 540 and a part of one wiring connection structure 540 in a rectangular formation range in plan view are formed.

According to the semiconductor apparatus 10D of the present embodiment, it is possible to obtain similar effects to those of the semiconductor apparatus 10B according to the ninth embodiment, and it is possible to alleviate the restriction on the design of the recess portion 503 when the patterns related to the wiring connection structure 540 are densely arranged. As a result, a configuration advantageous for high integration can be obtained.

11. Eleventh Embodiment

A semiconductor apparatus 10E of an eleventh embodiment of the present disclosure is different from the semiconductor apparatus 10C of the ninth embodiment in a formation mode of the recess portion 503 in plan view.

Figure 35:
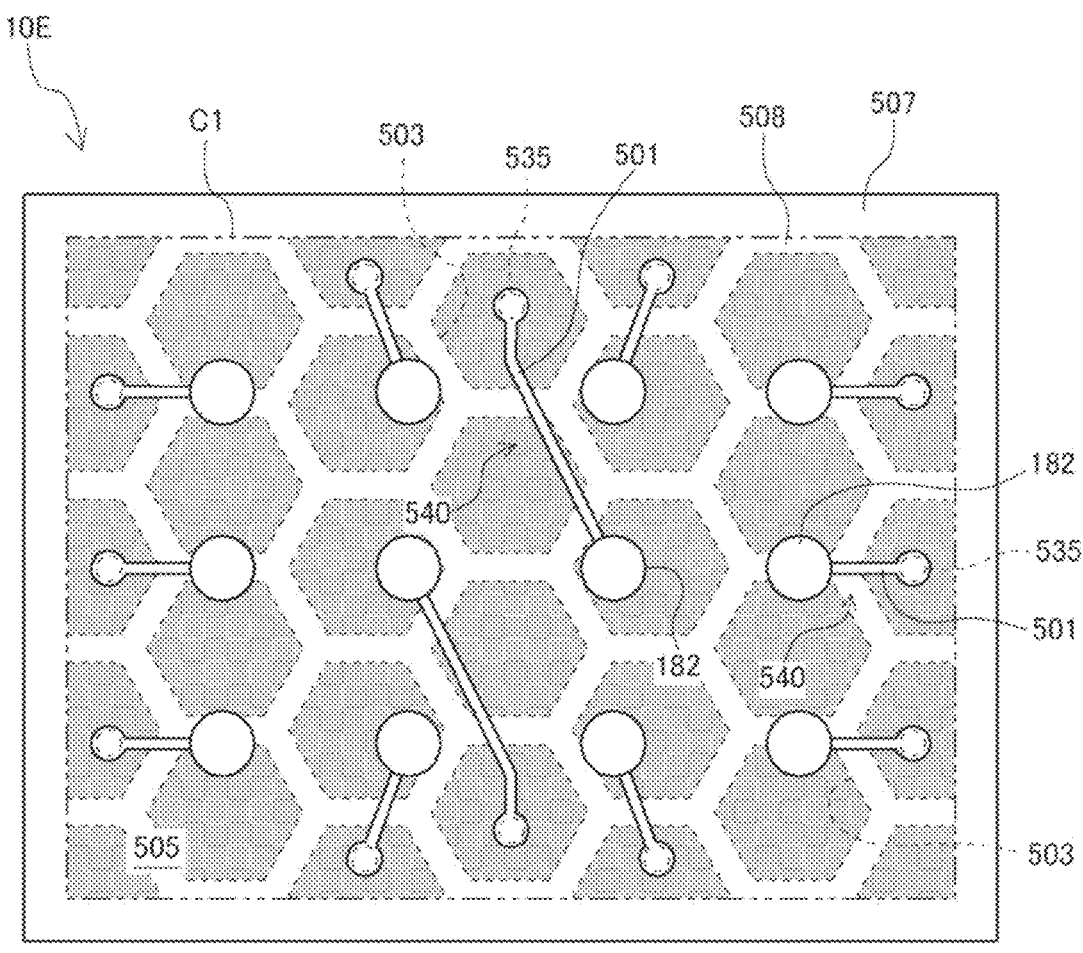
FIG. 35 is a plan view illustrating a configuration example of the semiconductor apparatus according to an eleventh embodiment of the present disclosure.

FIG. 35 illustrates a layout of each component in the semiconductor apparatus 10E of the present embodiment in plan view. Note that, in FIG. 35, as similar to FIG. 31, illustration of the protective film 515 is omitted, and a formation portion of the recess portion 503 is illustrated as a thin black portion.

As illustrated in FIG. 35, in the semiconductor apparatus 10E of the present embodiment, the recess portion 503 is formed so as to form a polygonal or circular periodic structure in plan view. That is, the semiconductor apparatus 10E includes a large number of recess portions 503 formed in a periodic arrangement.

In the example illustrated in FIG. 35, the recess portion 503 is formed by arranging a honeycomb structure which is a large number of hexagonal periodic structures as periodic arrangement. That is, in the semiconductor apparatus 10E, a large number of recess portions 503 having a hexagonal shape in plan view are periodically arranged and formed in the semiconductor substrate 110.

Note that, in the example illustrated in FIG. 35, the recess portions 503 are periodically arranged and formed over the entire chip region 508, but the recess portions 503 may be formed in a partial region of the chip region 508. Furthermore, in the example illustrated in FIG. 35, a part of the wiring connection structure 540 is formed in a region other than the formation region of the recess portion 503, but from the viewpoint of reducing the capacitance between wiring substrates, the through electrode 535 is preferably formed in the formation region of the recess portion 503 as illustrated in FIG. 35. However, the through electrode 535 may also be formed in a region other than the formation region of the recess portion 503.

According to the semiconductor apparatus 10E of the present embodiment, similar effects to those of the semiconductor apparatus 10B according to the ninth embodiment can be obtained, and the following effects can be obtained. That is, according to the formation mode of the recess portion 503 according to the present embodiment, stress can be dispersed, the strength of the semiconductor substrate 110 can be maintained and secured, and the recess portion 503 can be formed relatively deep. As a result, the capacitance between wiring substrates can be effectively reduced, and it is possible to achieve both weight reduction of the chip as the semiconductor apparatus 10E and maintenance and securing of mechanical strength.

Regarding the weight reduction of the chip, for example, since the specific gravity of the acrylic resin is about ½ with respect to the silicon semiconductor substrate 110, by removing a volume portion of about 60% of the volume of the semiconductor substrate 110 to form the recess portion 503, the weight reduction of about 30% of the semiconductor substrate 110 can be achieved. Furthermore, by adopting a periodic structure with respect to the arrangement of the recess portions 503, it is possible to make it difficult to be affected by the difference in density when the resin material is applied to form the separation region 505. This makes it possible to reduce variations in the coating film thickness of the material of the separation region 505. As a result, a uniform reduction effect of the capacitance between wiring substrates can be obtained.

[Modification]

A modification of the semiconductor apparatus 10E according to the eleventh embodiment of the present disclosure will be described. As the periodic structure of the recess portion 503, various shapes such as a polygonal shape such as a quadrangular shape and a pentagonal shape, a circular shape, and an elliptical shape can be adopted.

Figure 36:
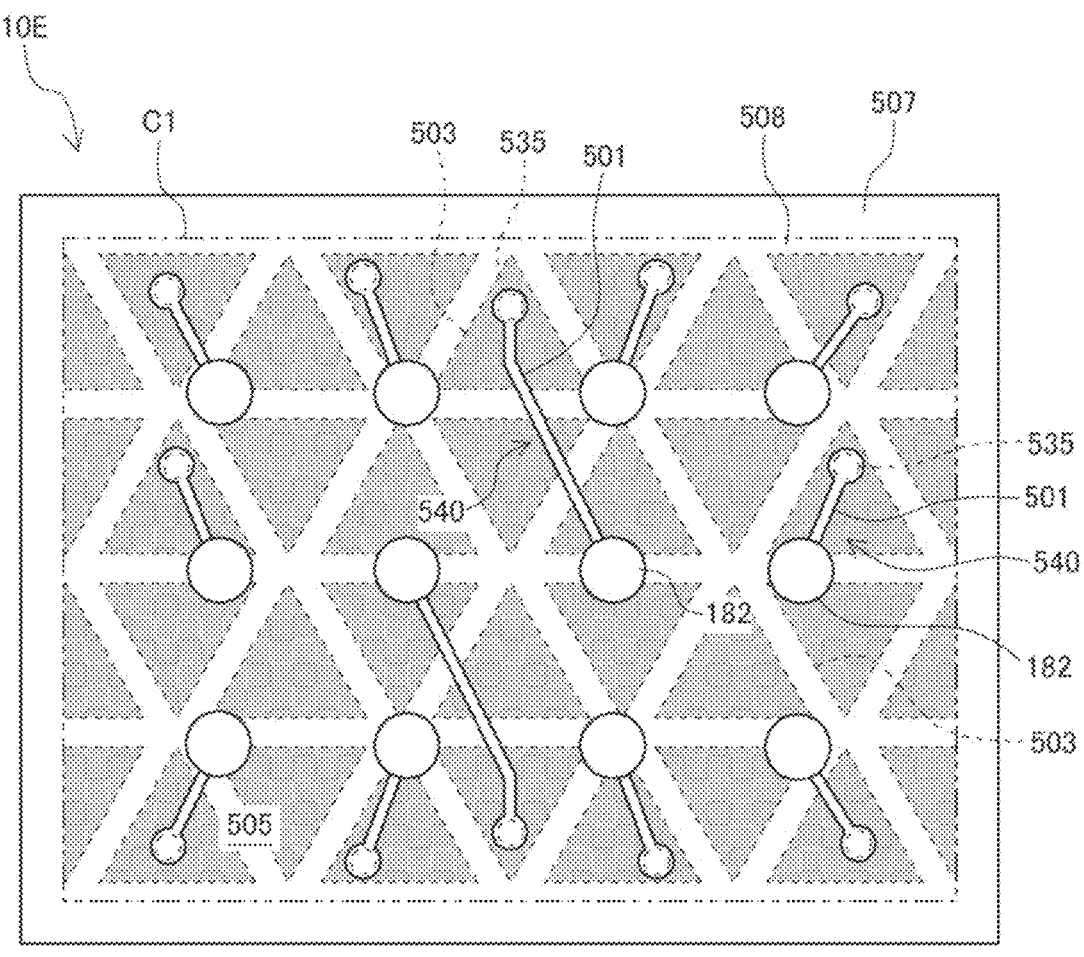
FIG. 36 is a plan view illustrating Modification 1 of a configuration of a semiconductor apparatus according to the eleventh embodiment of the present disclosure.

For example, as in the configuration of Modification 1 illustrated in FIG. 36, the recess portion 503 may be formed by arrangement of a large number of triangular periodic structures as periodic arrangement. As described above, a large number of recess portions 503 having a triangular shape in plan view may be periodically arranged and formed in the semiconductor substrate 110.

Figure 37:
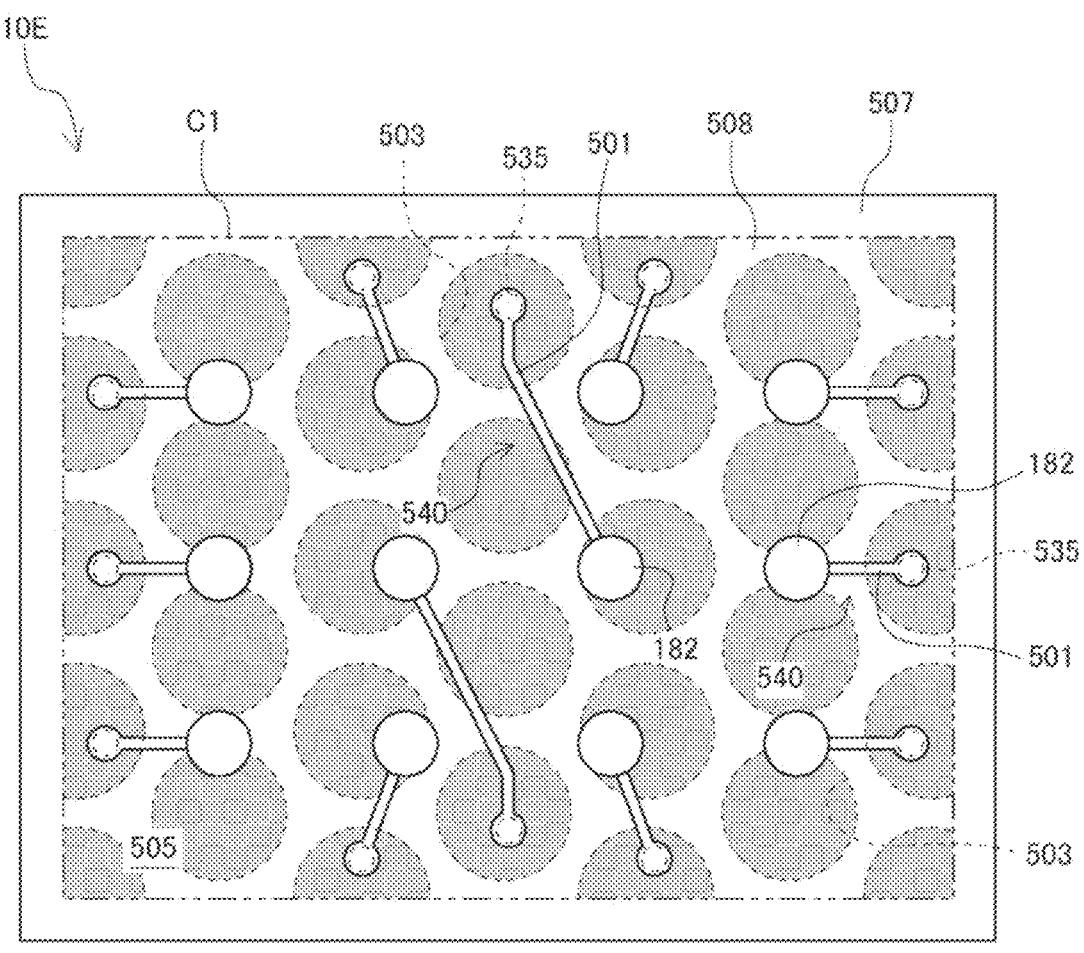
FIG. 37 is a plan view illustrating Modification 2 of a configuration of a semiconductor apparatus according to the eleventh embodiment of the present disclosure.

Furthermore, as in the configuration of Modification 2 illustrated in FIG. 37, the recess portion 503 may be formed by arrangement of a large number of circular periodic structures as periodic arrangement. As described above, a large number of recess portions 503 having a circular shape in plan view may be periodically arranged and formed in the semiconductor substrate 110.

Also with the configuration of these modifications, the capacitance between wiring substrates can be effectively reduced, and it is possible to achieve both weight reduction of the chip and maintenance and securing of mechanical strength.

12. Application Example to Camera

The technology (the present technology) according to the present disclosure can be applied to various products. For example, the present technology may be achieved as an imaging element mounted on an imaging apparatus such as a camera.

Figure 38:
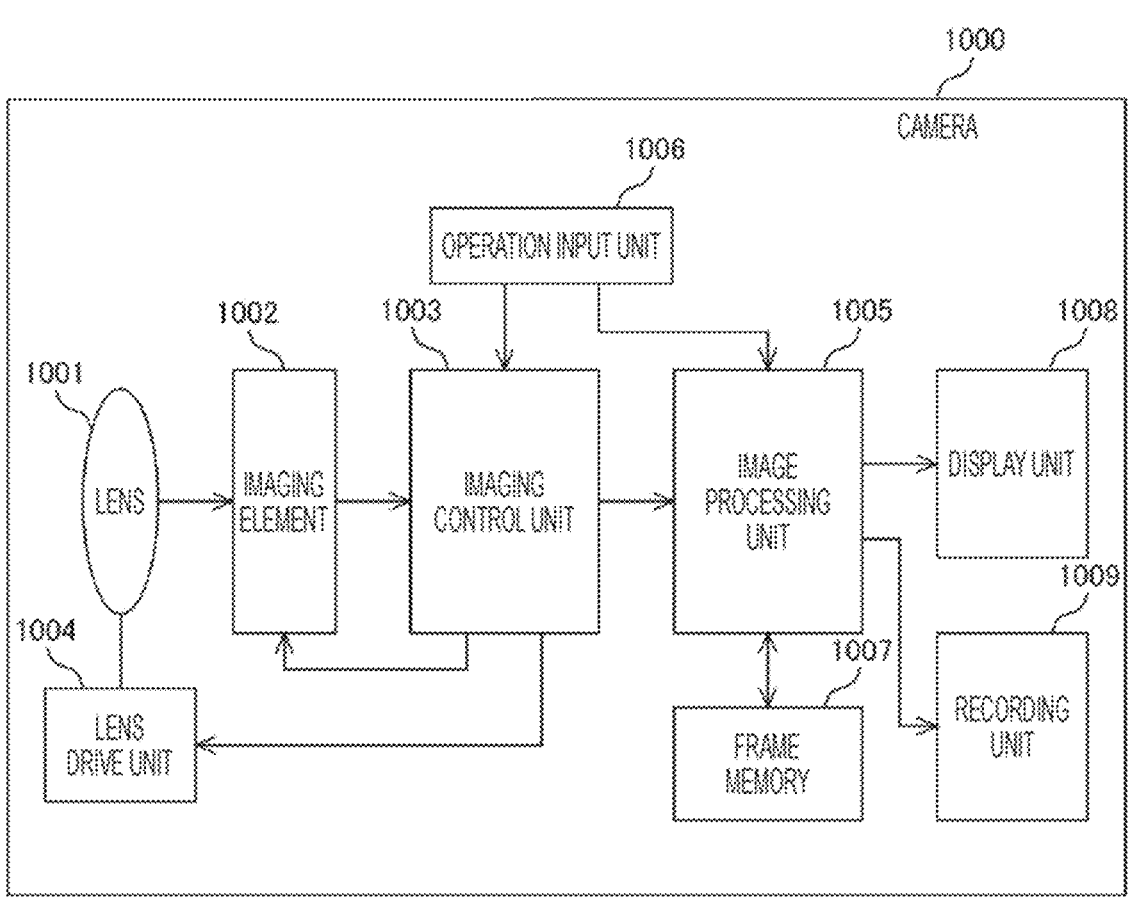
FIG. 38 is a block diagram illustrating a schematic configuration example of a camera which is an example of an imaging apparatus to which the present technology can be applied.

FIG. 38 is a block diagram illustrating a schematic configuration example of a camera which is an example of an imaging apparatus to which the present technology can be applied. A camera 1000 in the drawing includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject and causes the light to enter the imaging element 1002 as described later to form an image of a subject.

The imaging element 1002 is a semiconductor element that images light from the subject focused by the lens 1001. The imaging element 1002 generates an analog image signal corresponding to the emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. Furthermore, the imaging control unit 1003 can perform autofocus in the camera 1000 on the basis of an image signal output from the imaging element 1002. Here, autofocus is a system that detects the focal position of the lens 1001 and automatically adjusts the focal position. As the autofocus, a method (image plane phase difference autofocus) of detecting the focal position by detecting the image plane phase difference using the phase difference pixel arranged in the imaging element 1002 can be used. Furthermore, a method (contrast autofocus) of detecting a position where the contrast of the image is the highest as a focal position can also be applied. The imaging control unit 1003 adjusts the position of the lens 1001 via the lens drive unit 1004 on the basis of the detected focal position, and performs autofocus. Note that the imaging control unit 1003 can include, for example, a digital signal processor (DSP) equipped with firmware.

The lens drive unit 1004 drives the lens 1001 under the control of the imaging control unit 1003. The lens drive unit 1004 can drive the lens 1001 by changing the position of the lens 1001 using a built-in motor.

The image processing unit 1005 processes an image signal generated by the imaging element 1002. This processing corresponds to, for example, demosaic for generating an image signal of an insufficient color among image signals corresponding to red, green, and blue for each pixel, noise reduction for removing noise of the image signal, encoding of the image signal, and the like. The image processing unit 1005 can be configured by, for example, a microcomputer equipped with firmware.

The operation input unit 1006 receives an operation input from a user of the camera 1000. For example, a push button or a touch panel can be used as the operation input unit 1006. The operation input received by the operation input unit 1006 is transmitted to the imaging control unit 1003 and the image processing unit 1005. Thereafter, processing according to the operation input, for example, processing such as imaging of the subject is started.

The frame memory 1007 is a memory that stores a frame that is an image signal for one screen. The frame memory 1007 is controlled by the image processing unit 1005 and holds frames in the process of image processing.

The display unit 1008 displays the image processed by the image processing unit 1005. For example, a liquid crystal panel can be used as the display unit 1008.

The recording unit 1009 records the image processed by the image processing unit 1005. For example, a memory card or a hard disk can be used as the recording unit 1009.

The camera to which the present disclosure can be applied has been described above. The present technology can be applied to the imaging element 1002 among the configurations described above. Specifically, the imaging apparatus 10 described in FIG. 1 can be applied to the imaging element 1002. By applying the imaging apparatus 10 to the imaging element 1002, a signal delay time can be shortened, and high-speed imaging can be performed.

Note that the configuration of the imaging apparatus 10 of the fourth embodiment can be combined with other embodiments. Specifically, the separation region 153 in FIG. 11 can be applied to the semiconductor substrate 110 in FIG. 8.

Furthermore, the configuration of the imaging apparatus 10 of the fifth embodiment can be combined with other embodiments. Specifically, the separation region 154 in FIG. 15 can be applied to the semiconductor substrate 110 in FIG. 6.

Lastly, the description of each of the above-described embodiments is an example of the present disclosure, and the present disclosure is not limited to the above-described embodiments. For this reason, it is of course that various modifications can be made according to the design and the like, other than the above-described embodiments, as long as the modifications do not depart from the technical idea according to the present disclosure. The technology according to the present disclosure can also be applied to, for example, an interposer used as a relay component in a package structure of an IC component.

Furthermore, the effects described in the present specification are merely examples and are not intended to be limiting. Furthermore, other effects may be provided. Furthermore, the configurations of the above-described embodiments and the configurations of the modifications can be appropriately combined.

Furthermore, the drawings in the above-described embodiments are schematic, and the dimensional ratios and the like of the respective parts do not necessarily match actual ones. Furthermore, it is of course that dimensional relationships and ratios are different between drawings.

Note that, the present technology can also adopt the following configuration.

(1) A semiconductor apparatus including:

a semiconductor substrate in which a semiconductor element and a front surface side wiring connected to the semiconductor element are arranged on a front surface side;

a back surface side wiring arranged on a back surface side of the semiconductor substrate; and a separation region arranged between the semiconductor substrate and the back surface side wiring.

(2) The semiconductor apparatus according to (1), further including a through wiring arranged in a through hole formed in the semiconductor substrate and connecting the front surface side wiring and the back surface side wiring.

(3) The semiconductor apparatus according to (1), in which the separation region includes a resin.

(4) The semiconductor apparatus according to (3), in which the separation region includes a photosensitive resin.

(5) The semiconductor apparatus according to (1), in which the separation region includes an inorganic material.

(6) The semiconductor apparatus according to any one of (1) to (5), in which the separation region is formed to have a thickness of equal to or greater than 5 μm.

(7) The semiconductor apparatus according to any one of (1) to (5), in which the separation region is arranged in a recess portion formed on a back surface side of the semiconductor substrate.

(8) The semiconductor apparatus according to (7), in which the separation region includes a gap.

(9) The semiconductor apparatus according to (7) or (8), in which the back surface side wiring is provided so as to at least partially overlap the recess portion in plan view.

(10) The semiconductor apparatus according to any one of (7) to (9), in which a plurality of types of recess portions having different depths is formed as the recess portion.

(11) The semiconductor apparatus according to any one of (7) to (10), in which the recess portion is formed so as to overlap a plurality of the back surface side wiring in plan view.

(12) The semiconductor apparatus according to any one of (7) to (11), in which the recess portion is formed so as to form a polygonal or circular periodic structure in plan view.

(13) The semiconductor apparatus according to any one of (7) to (12), further including: a through wiring arranged in a through hole formed in the semiconductor substrate and connecting the front surface side wiring and the back surface side wiring; and a liner film including an insulating material, covering at least a part of the through wiring, and interposed between the through wiring and the separation region.

(14) The semiconductor apparatus according to (1), in which the separation region includes a gap.

(15) The semiconductor apparatus according to (14), further including a through wiring arranged in a through hole formed in the semiconductor substrate and connecting the front surface side wiring and the back surface side wiring, in which the separation region includes an in-hole separation region portion covering an inner circumferential surface of the through hole and a back surface side separation region portion formed on a back surface side of the semiconductor substrate, and the gap is formed in the back surface side separation region portion.

(16) The semiconductor apparatus according to (2), in which the separation region is further arranged between the semiconductor substrate and the through wiring.

(17) The semiconductor apparatus according to (2) or (16), in which the separation region is used as a mask in etching for forming the through hole in the semiconductor substrate.

(18) The semiconductor apparatus according to any one of (1) to (8), (16), and (17), further including an insulating film that insulates the back surface side wiring.

(19) The semiconductor apparatus according to any one of (1) to (18), in which the semiconductor element is a photoelectric conversion element that performs photoelectric conversion of incident light.

(20) A method for manufacturing a semiconductor apparatus, the method including:

a separation region arrangement step of arranging a separation region on a back surface side of a semiconductor substrate on which a semiconductor element and a front surface side wiring connected to the semiconductor element are arranged on a front surface side;

a through hole forming step of forming a through hole in the semiconductor substrate;

a back surface side wiring arrangement step of arranging a back surface side wiring on the back surface side of the semiconductor substrate; and a through wiring arrangement step of arranging a through wiring connecting the front surface side wiring and the back surface side wiring in the through hole that has been formed.

REFERENCE SIGNS LIST

10 Imaging apparatus
100 Pixel
110, 130 Semiconductor substrate
120, 140 Wiring region
121, 141 Insulating layer
122, 142 Wiring layer
150 to 154, 156 Separation region
155 Gap
156a In-hole separation region portion
156b back surface side separation region portion
160 Through via
161, 168 Through hole
162 Insulating film
163 Barrier layer
164 Seed layer
165 Back surface side wiring
166 Recess portion
169 Through wiring
180 Protective film
182 Connection terminal
501 Rewiring (back surface side wiring)
503 Recess portion
505 Separation region
520 Through via
521 Semiconductor element
522 Front surface side wiring
523 Wiring layer
525, 535 Through electrode
526 Liner film
1002 Imaging element

What is claimed is:

1. A semiconductor apparatus, comprising:

a semiconductor substrate in which a semiconductor element and a front surface side wiring connected to the semiconductor element are arranged on a front surface side;

a back surface side wiring arranged on a back surface side of the semiconductor substrate;

a separation region arranged between the semiconductor substrate and the back surface side wiring, wherein the separation region is a layer of material disposed on the back surface side of the semiconductor substrate; and an insulating film between the separation region and the back surface side wiring.

2. The semiconductor apparatus according to claim 1, further comprising a through wiring arranged in a through hole formed in the semiconductor substrate and connecting the front surface side wiring and the back surface side wiring.

3. The semiconductor apparatus according to claim 2, wherein the separation region is further arranged between the semiconductor substrate and the through wiring.

4. The semiconductor apparatus according to claim 2, wherein the separation region is used as a mask in etching for forming the through hole in the semiconductor substrate.

5. The semiconductor apparatus according to claim 1, wherein the separation region includes a resin.

6. The semiconductor apparatus according to claim 5, wherein the separation region includes a photosensitive resin.

7. The semiconductor apparatus according to claim 1, wherein the separation region includes an inorganic material.

8. The semiconductor apparatus according to claim 1, wherein the separation region is formed to have a thickness of equal to or greater than 5 μm.

9. The semiconductor apparatus according to claim 1, wherein the separation region is arranged in a recess portion formed on the back surface side of the semiconductor substrate.

10. The semiconductor apparatus according to claim 9, wherein the separation region includes a gap.

11. The semiconductor apparatus according to claim 9, wherein the back surface side wiring is provided so as to at least partially overlap the recess portion in plan view.

12. The semiconductor apparatus according to claim 9, wherein a plurality of types of recess portions having different depths is formed as the recess portion.

13. The semiconductor apparatus according to claim 9, wherein the recess portion is formed so as to overlap a portion of the back surface side wiring in plan view.

14. The semiconductor apparatus according to claim 9, wherein the recess portion is formed so as to form a polygonal or circular periodic structure in plan view.

15. The semiconductor apparatus according to claim 1, wherein the separation region includes a gap.

16. The semiconductor apparatus according to claim 1, further comprising an insulating film that insulates the back surface side wiring.

17. The semiconductor apparatus according to claim 1, wherein the semiconductor element is a photoelectric conversion element that performs photoelectric conversion of incident light.

18. The semiconductor apparatus according to claim 1, wherein the separation region includes at least one of a resin, an acrylic resin, a photosensitive resin, or an inorganic material.

19. A semiconductor apparatus, comprising:
a semiconductor substrate in which a semiconductor element and a front surface side wiring connected to the semiconductor element are arranged on a front surface side;
a back surface side wiring arranged on a back surface side of the semiconductor substrate;
a separation region arranged between the semiconductor substrate and the back surface side wiring, wherein the separation region is arranged in a recess portion formed on a back surface side of the semiconductor substrate;
a through wiring arranged in a through hole formed in the semiconductor substrate and connecting the front surface side wiring and the back surface side wiring; and
a liner film including an insulating material, covering at least a part of the through wiring, and interposed between the through wiring and the separation region.

20. A semiconductor apparatus, comprising:
a semiconductor substrate in which a semiconductor element and a front surface side wiring connected to the semiconductor element are arranged on a front surface side;
a back surface side wiring arranged on a back surface side of the semiconductor substrate;
a separation region arranged between the semiconductor substrate and the back surface side wiring, wherein the separation region includes a gap;
a through wiring arranged in a through hole formed in the semiconductor substrate and connecting the front surface side wiring and the back surface side wiring,
wherein the separation region includes an in-hole separation region portion covering an inner circumferential surface of the through hole and a back surface side separation region portion formed on a back surface side of the semiconductor substrate, and
the gap is formed in the back surface side separation region portion.

* * * * *